(12) United States Patent
Valentine et al.

(10) Patent No.: US 9,411,592 B2
(45) Date of Patent: Aug. 9, 2016

(54) VECTOR ADDRESS CONFLICT RESOLUTION WITH VECTOR POPULATION COUNT FUNCTIONALITY

(71) Applicant: INTEL CORPORATION, Santa Clara, CA (US)

(72) Inventors: Robert Valentine, Qiryat Tivon (IL); Mark J. Charney, Lexington, MA (US); Jesus Corbal, Barcelona (ES); Milind B. Girkar, Sunnyvale, CA (US); Christopher J. Hughes, Santa Clara, CA (US); Elmoustapha Ould-Ahmed-Vall, Chandler, AZ (US); Brett L. Toll, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 677 days.

(21) Appl. No.: 13/731,005

(22) Filed: Dec. 29, 2012

(65) Prior Publication Data
US 2014/0189307 A1    Jul. 3, 2014

(51) Int. Cl.
*G06F 9/30* (2006.01)
*G06F 9/38* (2006.01)
(Continued)

(52) U.S. Cl.
CPC ........ *G06F 9/30145* (2013.01); *G06F 9/30014* (2013.01); *G06F 9/30018* (2013.01); *G06F 9/30032* (2013.01); *G06F 9/30036* (2013.01); *G06F 9/3836* (2013.01); *G06F 9/3887* (2013.01); *G06F 7/607* (2013.01); *H03M 7/20* (2013.01)

(58) Field of Classification Search
None
See application file for complete search history.

(56) References Cited

U.S. PATENT DOCUMENTS

| 4,918,600 A | * | 4/1990 | Harper, III | .......... G06F 12/0607 711/157 |
| 4,953,101 A | | 8/1990 | Kelleher et al. | |
| 5,241,633 A | | 8/1993 | Nishi | |

(Continued)

FOREIGN PATENT DOCUMENTS

| CN | 101061460 A | 10/2007 |
| CN | 101978350 A | 2/2011 |

(Continued)

OTHER PUBLICATIONS

'Population Count in Arrays' by Y. Edel and A. Klein, Mar. 16, 2009.*

(Continued)

*Primary Examiner* — Steven Snyder
(74) *Attorney, Agent, or Firm* — Lowenstein Sandler LLP

(57) ABSTRACT

Instructions and logic provide SIMD address conflict resolution with vector population count functionality. Some embodiments include processors with a register with a variable plurality of data fields, each of the data fields to store a variable second plurality of bits. A destination register has corresponding data fields, each of these data fields to store a count of the number of bits set to one for corresponding data fields. Responsive to decoding a vector population count instruction, execution units count the number of bits set to one for each of data fields in the register, and store the counts in corresponding data fields of the first destination register. Vector population count instructions can be used with variable sized elements and conflict masks to generate iteration counts and completion masks to be used each iteration to resolve dependencies in gather-modify-scatter SIMD operations.

31 Claims, 32 Drawing Sheets

(51) Int. Cl.
*G06F 7/60* (2006.01)
*H03M 7/20* (2006.01)

(56) References Cited

U.S. PATENT DOCUMENTS

| | | | | |
|---|---|---|---|---|
| 5,541,865 | A * | 7/1996 | Ashkenazi | 708/210 |
| 5,872,987 | A | 2/1999 | Wade et al. | |
| 6,591,345 | B1 | 7/2003 | Seznec | |
| 7,366,873 | B1 * | 4/2008 | Kohn | 712/4 |
| 7,395,419 | B1 | 7/2008 | Gonion | |
| 7,421,564 | B1 | 9/2008 | Rahim et al. | |
| 7,421,565 | B1 * | 9/2008 | Kohn | 712/4 |
| 7,549,081 | B2 | 6/2009 | Robbins et al. | |
| 7,617,496 | B2 | 11/2009 | Gonion | |
| 7,620,797 | B2 | 11/2009 | Gonion et al. | |
| 7,624,251 | B2 | 11/2009 | Gonion et al. | |
| 7,627,723 | B1 * | 12/2009 | Buck et al. | 711/155 |
| 7,728,742 | B2 | 6/2010 | Gonion | |
| 7,739,442 | B2 | 6/2010 | Gonion | |
| 7,800,519 | B2 | 9/2010 | Gonion | |
| 8,219,783 | B2 | 7/2012 | Hara | |
| 8,443,170 | B2 * | 5/2013 | Wilder et al. | 712/22 |
| 8,549,256 | B2 * | 10/2013 | Narad | 712/3 |
| 8,688,957 | B2 | 4/2014 | Smelyanskiy et al. | |
| 8,972,698 | B2 | 3/2015 | Hughes et al. | |
| 2002/0174318 | A1 | 11/2002 | Stuttard et al. | |
| 2003/0120880 | A1 | 6/2003 | Banno | |
| 2004/0073773 | A1 * | 4/2004 | Demjanenko | 712/7 |
| 2004/0181652 | A1 | 9/2004 | Ahmed et al. | |
| 2004/0199729 | A1 | 10/2004 | Ross | |
| 2005/0240729 | A1 | 10/2005 | Van Berkel et al. | |
| 2007/0283127 | A1 | 12/2007 | Kohn | |
| 2008/0071851 | A1 | 3/2008 | Zohar et al. | |
| 2008/0288744 | A1 | 11/2008 | Gonion et al. | |
| 2008/0288745 | A1 | 11/2008 | Gonion et al. | |
| 2008/0288754 | A1 | 11/2008 | Gonion et al. | |
| 2009/0172365 | A1 * | 7/2009 | Orenstien et al. | 712/225 |
| 2009/0175509 | A1 | 7/2009 | Gonion et al. | |
| 2009/0249026 | A1 * | 10/2009 | Smelyanskiy et al. | 712/4 |
| 2009/0267959 | A1 | 10/2009 | Gonion et al. | |
| 2010/0042779 | A1 | 2/2010 | Espasa et al. | |
| 2010/0042789 | A1 | 2/2010 | Gonion et al. | |
| 2010/0042807 | A1 | 2/2010 | Gonion et al. | |
| 2010/0042815 | A1 | 2/2010 | Gonion et al. | |
| 2010/0042816 | A1 | 2/2010 | Gonion et al. | |
| 2010/0042817 | A1 | 2/2010 | Gonion et al. | |
| 2010/0042818 | A1 | 2/2010 | Gonion et al. | |
| 2010/0049950 | A1 | 2/2010 | Gonion et al. | |
| 2010/0049951 | A1 | 2/2010 | Gonion et al. | |
| 2010/0058037 | A1 | 3/2010 | Gonion et al. | |
| 2010/0077180 | A1 | 3/2010 | Gonion et al. | |
| 2010/0077182 | A1 | 3/2010 | Gonion et al. | |
| 2010/0077183 | A1 | 3/2010 | Gonion et al. | |
| 2010/0079313 | A1 | 4/2010 | Gonion | |
| 2010/0079314 | A1 | 4/2010 | Gonion | |
| 2010/0079445 | A1 | 4/2010 | Hendry et al. | |
| 2010/0235586 | A1 | 9/2010 | Gonion | |
| 2010/0325398 | A1 | 12/2010 | Gonion et al. | |
| 2010/0325399 | A1 * | 12/2010 | Gonion et al. | 712/222 |
| 2010/0325483 | A1 | 12/2010 | Gonion et al. | |
| 2011/0035567 | A1 | 2/2011 | Gonion et al. | |
| 2011/0035568 | A1 | 2/2011 | Gonion et al. | |
| 2012/0159130 | A1 * | 6/2012 | Smelyanskiy et al. | 712/216 |
| 2012/0260061 | A1 * | 10/2012 | Reid | 712/3 |
| 2013/0024654 | A1 * | 1/2013 | Gove | 712/7 |
| 2013/0246737 | A1 * | 9/2013 | Eichenberger et al. | 712/201 |
| 2014/0068226 | A1 | 3/2014 | Smelyanskiy et al. | |
| 2014/0089634 | A1 * | 3/2014 | Lee et al. | 712/5 |
| 2014/0223139 | A1 * | 8/2014 | Lee et al. | 712/5 |
| 2015/0046671 | A1 | 2/2015 | Ould-Ahmed-Vall et al. | |
| 2015/0046672 | A1 | 2/2015 | Sych et al. | |
| 2015/0154024 | A1 * | 6/2015 | Anderson | G06F 9/30036 712/208 |

FOREIGN PATENT DOCUMENTS

| | | |
|---|---|---|
| DE | 11 2009 000 741 T5 | 1/2012 |
| EP | 1873627 A1 | 1/2008 |
| JP | 2000-057111 A | 2/2000 |
| JP | 2007-334563 A | 12/2007 |
| JP | 2014-099194 A | 5/2014 |
| WO | 2006/033056 A2 | 3/2006 |

OTHER PUBLICATIONS

'Brain Derived Vision Algorithm on High Performance Architectures' by Jayram Moorkanikara Nageswaran et al., Jan. 22, 2009.*

'Broadword Implementation of Rank/Select Queries' by Sebastiano Vigna, 2008.*

A. Shahbahrami, et al, "SIMD Vectorization of Histogram Functions," Computer Engineering Laboratory, Delft University of Technology, Delft, The Netherlands, 2007, IEEE No. 1-4244-1027-4/07, 6 pages.

T. Scheuermann, et al., "Efficient Histogram Generation Using Scattering on GPUs," Graphics Product Group, Advanced Micro Devices, Inc., Presentation Pre-print for ACM I3D 2007 Conference Proceedings, 2007, 5 pages.

B. He, et al, Efficient Gather and Scatter Operations on Graphics Processors, Hong Kong University of Science and Technology, SC07 Nov. 10-16, 2007, Reno, Nevada, 2007ACM No. 978-1-59593-764-3/07/0011, 12 pages.

Ahn, Jung Ho, Mattan Erez, and William J. Dally. "Scatter-add in data parallel architectures." In High-Performance computer Architecture, 2005. HPCA-11. 11th International Symposium on, pp. 132-142. IEEE, 2005.

John L. Hennessy & David A. Patterson"Computer Architecture: A Quantitative Approach" Morgan Kaufmann Publishers, Inc. Second Edition, 1996, pp. 634-639.

International preliminary report on patentability and Written Opinion received for PCT Patent Application No. PCT/US2011/063836, mailed on Jul. 4, 2013, 6 pages.

International Search Report and Written Opinion received for PCT Patent Application No. PCT/US2011/063836, mailer on Jul. 18, 2012, 9 pages.

Non-Final office action mailed on May 23, 2014, on U.S. Appl. No. 12/976,616.

Kumar, Sanjeev, "Atomic Vector Operation on Chip Multiprocessor" 35th Annual International Symposium on computer Architecture, 2008, pp. 441-452.

Notice of Allowance mailed on Nov. 3, 2014, on U.S. Appl. No. 12/976,616.

Non-Final Office action mailed on Jul. 30, 2010, on U.S. Appl. No. 12/079,774.

Final Office action mailed on Dec. 28, 2010, on U.S. Appl. No. 12/079,774.

Non-Final Office action mailed on Feb. 16, 2012, on U.S. Appl. No. 12/079,774.

Final Office action mailed on Jul. 10, 2012, on U.S. Appl. No. 12/079,774.

Non-Final office action mailed on Aug. 6, 2013, on U.S. Appl. No. 12/974,157.

Notice of Allowance mailed on Nov. 21, 2013, on U.S. Appl. No. 12/974,157.

* cited by examiner

310 — PACKED BYTE

320 — PACKED WORD

330 — PACKED DOUBLEWORD

| 127 112 | 111 96 | 95 80 | 79 64 | 63 48 | 47 32 | 31 16 | 15 0 |
|---|---|---|---|---|---|---|---|
| HALF 7 | HALF 6 | HALF 5 | HALF 4 | HALF 3 | HALF 2 | HALF 1 | HALF 0 |

341 — PACKED HALF

| 127 96 | 95 64 | 63 32 | 31 0 |
|---|---|---|---|
| SINGLE 3 | SINGLE 2 | SINGLE 1 | SINGLE 0 |

342 — PACKED SINGLE

| 127 64 | 63 0 |
|---|---|
| DOUBLEWORD 3 | DOUBLEWORD 0 |

343 — PACKED DOUBLE

| 127 120 | 119 112 | 111 104 | 103 ... 24 | 23 16 | 15 8 | 7 0 |
|---|---|---|---|---|---|---|
| bbbb bbbb | bbbb bbbb | bbbb bbbb | ... | bbbb bbbb | bbbb bbbb | bbbb bbbb |

344 — UNSIGNED PACKED BYTE REPRESENTATION

| 127 120 | 119 112 | 111 104 | 103 ... 24 | 23 16 | 15 8 | 7 0 |
|---|---|---|---|---|---|---|
| sbbb bbbb | sbbb bbbb | sbbb bbbb | ... | sbbb bbbb | sbbb bbbb | sbbb bbbb |

345 — SIGNED PACKED BYTE REPRESENTATION

| 127 112 | 111 ... 16 | 15 0 |
|---|---|---|
| wwww wwww wwww wwww | ... | wwww wwww wwww wwww |

346 — UNSIGNED PACKED WORD REPRESENTATION

| 127 112 | 111 ... 16 | 15 0 |
|---|---|---|
| swww wwww wwww wwww | ... | swww wwww wwww wwww |

347 — SIGNED PACKED WORD REPRESENTATION

| 127 92 91 | 32 31 | 0 |
|---|---|---|
| dddd dddd dddd dddd dddd dddd dddd dddd | ... | dddd dddd dddd dddd dddd dddd dddd dddd |

348 — UNSIGNED PACKED DOUBLEWORD REPRESENTATION

| 127 92 91 | 32 31 | 0 |
|---|---|---|
| sddd dddd dddd dddd dddd dddd dddd dddd | ... | sddd dddd dddd dddd dddd dddd dddd dddd |

349 — SIGNED PACKED DOUBLEWORD REPRESENTATION

FIG. 3C

VECTOR ADDRESS CONFLICT RESOLUTION WITH VECTOR POPULATION COUNT FUNCTIONALITY

CROSS-REFERENCE TO RELATED APPLICATION

This Application is related to: application Ser. No. 12/079,774, titled "Vector Instructions to Enable Efficient Synchronization and Parallel Reduction Operations," filed Oct. 1, 2009; application Ser. No. 12/974,157, titled "Mechanism for Conflict Detection Using SIMD," filed Dec. 21, 2010; and application Ser. No. 12/976,616, titled "Vector Conflict Instructions," filed Dec. 22, 2010.

FIELD OF THE DISCLOSURE

The present disclosure pertains to the field of processing logic, microprocessors, and associated instruction set architecture that, when executed by the processor or other processing logic, perform logical, mathematical, or other functional operations. In particular, the disclosure relates to instructions and logic to provide SIMD vector address conflict resolution with vector population count functionality.

BACKGROUND OF THE DISCLOSURE

Modern processors often include instructions to provide operations that are computationally intensive, but offer a high level of data parallelism that can be exploited through an efficient implementation using various data storage devices, such as for example, single-instruction multiple-data (SIMD) vector registers. In SIMD execution, a single instruction operates on multiple data elements concurrently or simultaneously. This is typically implemented by extending the width of various resources such as registers and arithmetic logic units (ALUs), allowing them to hold or operate on multiple data elements, respectively.

The central processing unit (CPU) may provide such parallel hardware to support the SIMD processing of vectors. A vector is a data structure that holds a number of consecutive data elements. A vector register of size L may contain N vector elements of size M, where N=L/M. For instance, a 64-byte vector register may be partitioned into (a) 64 vector elements, with each element holding a data item that occupies 1 byte, (b) 32 vector elements to hold data items that occupy 2 bytes (or one "word") each, (c) 16 vector elements to hold data items that occupy 4 bytes (or one "doubleword") each, or (d) 8 vector elements to hold data items that occupy 8 bytes (or one "quadword") each.

A number of applications have large amounts of data-level parallelism and may be able to benefit from SIMD support. However, some applications spend a significant amount of time in operations on a set of sparse locations. Moreover, sometimes sequential operations are performed on the same sparse locations and so these applications may see only limited benefit from SIMD, operations. To maintain SIMD efficiency, some architectures allow not only SIMD arithmetic operations but also SIMD memory reads and writes (through gather and scatter operations). Scatter reductions are common operations in many applications. For example, a scatter-add operation can be used to enable multiple values of a first array to be reduced into (i.e., added to) selected elements of a second array according to a distribution of indices, which can often be random. But because of this, it may be difficult to efficiently process multiple elements concurrently (i.e., in SIMD mode). One concern is to ensure that scalar program order is preserved when necessary. Another concern is to ensure that when data is scattered into memory, the resulting vector of memory addresses includes only unique addresses (i.e., there are no duplicate addresses).

For example, histogram calculations are common operations in many image processing applications. A histogram may be used to track the distribution of color values of pixels in an image. However, updates to the histogram array may be random, depending on input data to an array. In particular, indices of neighboring elements may point to the same histogram bin. Accordingly, conflict detection and resolution is required to detect multiple dependent updates to the same locations and to ensure that scalar program order is preserved. This is precisely the kind of condition that can make it very difficult to process multiple data concurrently or simultaneously (i.e., using SIMD operations).

To date, potential solutions to such conflict concerns and related processing difficulties have not been adequately explored.

BRIEF DESCRIPTION OF THE DRAWINGS

The present invention is illustrated by way of example and not limitation in the figures of the accompanying drawings.

FIG. 3C illustrates packed data types according to one embodiment.

DETAILED DESCRIPTION

Figure 1A:
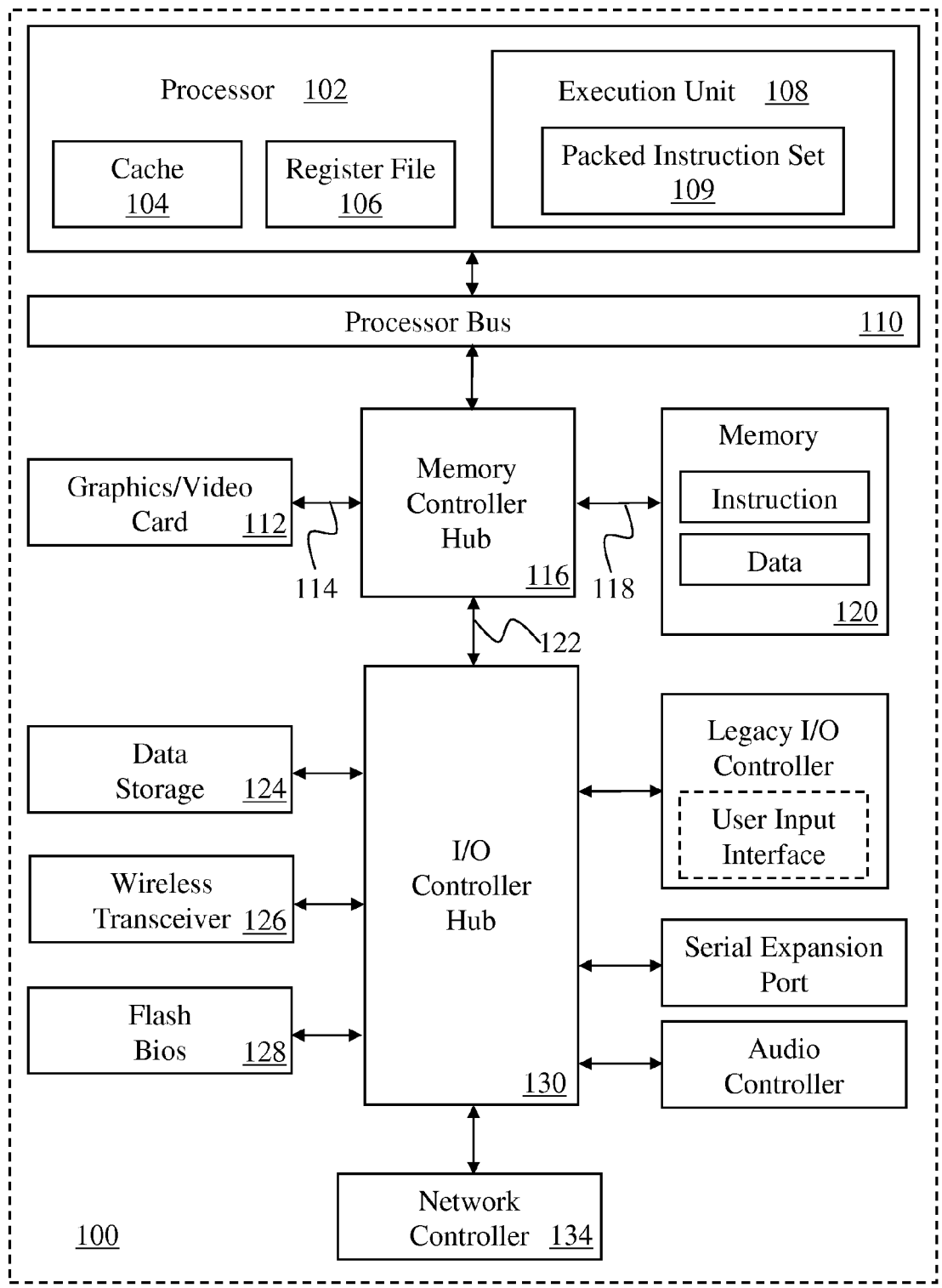
FIG. 1A is a block diagram of one embodiment of a system that executes instructions to provide SIMD address conflict resolution with vector population count functionality.

The following description discloses instructions and processing logic to provide SIMD address conflict resolution with vector population count functionality within or in association with a processor, computer system, or other processing apparatus. Instructions and logic are disclosed herein to provide SIMD address conflict resolution with vector population count functionality. Some embodiments include processors with a register with a variable plurality of data fields, each of the data fields to store a second variable plurality of bits. A destination register has corresponding data fields, each of these data fields to store a count of the number of bits set to one for corresponding data fields. Responsive to decoding a vector population count instruction, execution units count the number of bits set to one for each of data fields in the register, and store the counts in corresponding data fields of the first destination register. Vector population count instructions can be used with variable sized elements and conflict masks to generate iteration counts and completion masks to be used each iteration to resolve dependencies in gather-modify-scatter SIMD operations.

The following description discloses a number of instructions, methods and processing logic to resolve dependencies in gather-modify-scatter SIMD operations. It will be appreciated that SIMD vector conflict instructions, as in the embodiments described herein, may be used for variable sized elements and memory offsets to provide SIMD vector address conflict detection functionality and to generate conflict masks for efficient SIMD address conflict resolution. It will also be appreciated that SIMD vector leading zero count instructions, as in the embodiments described herein, may be used with variable sized elements and conflict masks to provide SIMD permute controls, which will be described in greater detail below, thereby permitting more efficient SIMD address conflict resolution in registers without performing dependent computations through memory. It will further be appreciated that SIMD vector population count instructions, as in the embodiments described herein, may be used with variable sized elements and conflict masks to efficiently compute iteration counts and to provide SIMD completion masks for each iteration of a SIMD address conflict resolution, which will be described in greater detail below. Thus the instructions and logic disclosed herein provide for more efficient SIMD address conflict resolution especially in gather-modify-scatter applications.

In the following description, numerous specific details such as processing logic, processor types, micro-architectural conditions, events, enablement mechanisms, and the like are set forth in order to provide a more thorough understanding of embodiments of the present invention. It will be appreciated, however, by one skilled in the art that the invention may be practiced without such specific details. Additionally, some well known structures, circuits, and the like have not been shown in detail to avoid unnecessarily obscuring embodiments of the present invention.

Although the following embodiments are described with reference to a processor, other embodiments are applicable to other types of integrated circuits and logic devices. Similar techniques and teachings of embodiments of the present invention can be applied to other types of circuits or semiconductor devices that can benefit from higher pipeline throughput and improved performance. The teachings of embodiments of the present invention are applicable to any processor or machine that performs data manipulations. However, the present invention is not limited to processors or machines that perform 512 bit, 256 bit, 128 bit, 64 bit, 32 bit, or 16 bit data operations and can be applied to any processor and machine in which manipulation or management of data is performed. In addition, the following description provides examples, and the accompanying drawings show various examples for the purposes of illustration. However, these examples should not be construed in a limiting sense as they are merely intended to provide examples of embodiments of the present invention rather than to provide an exhaustive list of all possible implementations of embodiments of the present invention.

Although the below examples describe instruction handling and distribution in the context of execution units and logic circuits, other embodiments of the present invention can be accomplished by way of data and/or instructions stored on a machine-readable, tangible medium, which when performed by a machine cause the machine to perform functions consistent with at least one embodiment of the invention. In one embodiment, functions associated with embodiments of the present invention are embodied in machine-executable instructions. The instructions can be used to cause a general-purpose or special-purpose processor that is programmed with the instructions to perform the steps of the present invention. Embodiments of the present invention may be provided as a computer program product or software which may include a machine or computer-readable medium having stored thereon instructions which may be used to program a computer (or other electronic devices) to perform one or more operations according to embodiments of the present invention. Alternatively, steps of embodiments of the present invention might be performed by specific hardware components that contain fixed-function logic for performing the steps, or by any combination of programmed computer components and fixed-function hardware components.

Instructions used to program logic to perform embodiments of the invention can be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present invention.

In modern processors, a number of different execution units are used to process and execute a variety of code and instructions. Not all instructions are created equal as some are quicker to complete while others can take a number of clock cycles to complete. The faster the throughput of instructions, the better the overall performance of the processor. Thus it would be advantageous to have as many instructions execute as fast as possible. However, there are certain instructions that have greater complexity and require more in terms of execution time and processor resources. For example, there are floating point instructions, load/store operations, data moves, etc.

As more computer systems are used in internet, text, and multimedia applications, additional processor support has been introduced over time. In one embodiment, an instruction set may be associated with one or more computer architectures, including data types, instructions, register architecture, addressing modes, memory architecture, interrupt and exception handling, and external input and output (I/O).

In one embodiment, the instruction set architecture (ISA) may be implemented by one or more micro-architectures, which includes processor logic and circuits used to implement one or more instruction sets. Accordingly, processors with different micro-architectures can share at least a portion of a common instruction set. For example, Intel® Pentium 4 processors, Intel® Core™ processors, and processors from Advanced Micro Devices, Inc. of Sunnyvale Calif. implement nearly identical versions of the x86 instruction set (with some extensions that have been added with newer versions), but have different internal designs. Similarly, processors designed by other processor development companies, such as ARM Holdings, Ltd., MIPS, or their licensees or adopters, may share at least a portion a common instruction set, but may include different processor designs. For example, the same register architecture of the ISA may be implemented in different ways in different micro-architectures using new or well-known techniques, including dedicated physical registers, one or more dynamically allocated physical registers using a register renaming mechanism (e.g., the use of a Register Alias Table (RAT), a Reorder Buffer (ROB) and a retirement register file. In one embodiment, registers may include one or more registers, register architectures, register files, or other register sets that may or may not be addressable by a software programmer.

In one embodiment, an instruction may include one or more instruction formats. In one embodiment, an instruction format may indicate various fields (number of bits, location of bits, etc.) to specify, among other things, the operation to be performed and the operand(s) on which that operation is to be performed. Some instruction formats may be further broken defined by instruction templates (or sub formats). For example, the instruction templates of a given instruction format may be defined to have different subsets of the instruction format's fields and/or defined to have a given field interpreted differently. In one embodiment, an instruction is expressed using an instruction format (and, if defined, in a given one of the instruction templates of that instruction format) and specifies or indicates the operation and the operands upon which the operation will operate.

Scientific, financial, auto-vectorized general purpose, RMS (recognition, mining, and synthesis), and visual and multimedia applications (e.g., 2D/3D graphics, image processing, video compression/decompression, voice recognition algorithms and audio manipulation) may require the same operation to be performed on a large number of data items. In one embodiment, Single Instruction Multiple Data (SIMD) refers to a type of instruction that causes a processor to perform an operation on multiple data elements. SIMD technology may be used in processors that can logically divide the bits in a register into a number of fixed-sized or variable-sized data elements, each of which represents a separate value. For example, in one embodiment, the bits in a 64-bit register may be organized as a source operand containing four separate 16-bit data elements, each of which represents a separate 16-bit value. This type of data may be referred to as 'packed' data type or 'vector' data type, and operands of this data type are referred to as packed data operands or vector operands. In one embodiment, a packed data item or vector may be a sequence of packed data elements stored within a single register, and a packed data operand or a vector operand may a source or destination operand of a SIMD instruction (or 'packed data instruction' or a 'vector instruction'). In one embodiment, a SIMD instruction specifies a single vector operation to be performed on two source vector operands to generate a destination vector operand (also referred to as a result vector operand) of the same or different size, with the same or different number of data elements, and in the same or different data element order.

SIMD technology, such as that employed by the Intel® Core™ processors having an instruction set including x86, MMX™, Streaming SIMD Extensions (SSE), SSE2, SSE3, SSE4.1, and SSE4.2 instructions, ARM processors, such as the ARM Cortex® family of processors having an instruction set including the Vector Floating Point (VFP) and/or NEON instructions, and MIPS processors, such as the Loongson family of processors developed by the Institute of Computing Technology (ICT) of the Chinese Academy of Sciences, has enabled a significant improvement in application performance (Core™ and MMX™ are registered trademarks or trademarks of Intel Corporation of Santa Clara, Calif.).

In one embodiment, destination and source registers/data are generic terms to represent the source and destination of the corresponding data or operation. In some embodiments, they may be implemented by registers, memory, or other storage areas having other names or functions than those depicted. For example, in one embodiment, "DEST1" may be a temporary storage register or other storage area, whereas "SRC1" and "SRC2" may be a first and second source storage register or other storage area, and so forth. In other embodiments, two or more of the SRC and DEST storage areas may correspond to different data storage elements within the same storage area (e.g., a SIMD register). In one embodiment, one of the source registers may also act as a destination register by, for example, writing back the result of an operation performed on the first and second source data to one of the two source registers serving as a destination registers.

FIG. 1A is a block diagram of an exemplary computer system formed with a processor that includes execution units to execute an instruction in accordance with one embodiment of the present invention. System 100 includes a component, such as a processor 102 to employ execution units including logic to perform algorithms for process data, in accordance with the present invention, such as in the embodiment described herein. System 100 is representative of processing systems based on the PENTIUM® III, PENTIUM® 4, Xeon™, Itanium®, XScale™ and/or StrongARM™ microprocessors available from Intel Corporation of Santa Clara, Calif., although other systems (including PCs having other microprocessors, engineering workstations, set-top boxes and the like) may also be used. In one embodiment, sample system 100 may execute a version of the WINDOWS™ operating system available from Microsoft Corporation of Redmond, Wash., although other operating systems (UNIX and Linux for example), embedded software, and/or graphical user interfaces, may also be used. Thus, embodiments of the present invention are not limited to any specific combination of hardware circuitry and software.

Embodiments are not limited to computer systems. Alternative embodiments of the present invention can be used in other devices such as handheld devices and embedded applications. Some examples of handheld devices include cellular phones, Internet Protocol devices, digital cameras, personal digital assistants (PDAs), and handheld PCs. Embedded applications can include a micro controller, a digital signal processor (DSP), system on a chip, network computers (NetPC), set-top boxes, network hubs, wide area network (WAN) switches, or any other system that can perform one or more instructions in accordance with at least one embodiment.

FIG. 1A is a block diagram of a computer system 100 formed with a processor 102 that includes one or more execution units 108 to perform an algorithm to perform at least one instruction in accordance with one embodiment of the present invention. One embodiment may be described in the context of a single processor desktop or server system, but alternative embodiments can be included in a multiprocessor system. System 100 is an example of a 'hub' system architecture. The computer system 100 includes a processor 102 to process data signals. The processor 102 can be a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 102 is coupled to a processor bus 110 that can transmit data signals between the processor 102 and other components in the system 100. The elements of system 100 perform their conventional functions that are well known to those familiar with the art.

In one embodiment, the processor 102 includes a Level 1 (L1) internal cache memory 104. Depending on the architecture, the processor 102 can have a single internal cache or multiple levels of internal cache. Alternatively, in another embodiment, the cache memory can reside external to the processor 102. Other embodiments can also include a combination of both internal and external caches depending on the particular implementation and needs. Register file 106 can store different types of data in various registers including integer registers, floating point registers, status registers, and instruction pointer register.

Execution unit 108, including logic to perform integer and floating point operations, also resides in the processor 102. The processor 102 also includes a microcode (ucode) ROM that stores microcode for certain macroinstructions. For one embodiment, execution unit 108 includes logic to handle a packed instruction set 109. By including the packed instruction set 109 in the instruction set of a general-purpose processor 102, along with associated circuitry to execute the instructions, the operations used by many multimedia applications may be performed using packed data in a general-purpose processor 102. Thus, many multimedia applications can be accelerated and executed more efficiently by using the full width of a processor's data bus for performing operations on packed data. This can eliminate the need to transfer smaller units of data across the processor's data bus to perform one or more operations one data element at a time.

Alternate embodiments of an execution unit 108 can also be used in micro controllers, embedded processors, graphics devices, DSPs, and other types of logic circuits. System 100 includes a memory 120. Memory 120 can be a dynamic random access memory (DRAM) device, a static random access memory (SRAM) device, flash memory device, or other memory device. Memory 120 can store instructions and/or data represented by data signals that can be executed by the processor 102.

A system logic chip 116 is coupled to the processor bus 110 and memory 120. The system logic chip 116 in the illustrated embodiment is a memory controller hub (MCH). The processor 102 can communicate to the MCH 116 via a processor bus 110. The MCH 116 provides a high bandwidth memory path 118 to memory 120 for instruction and data storage and for storage of graphics commands, data and textures. The MCH 116 is to direct data signals between the processor 102, memory 120, and other components in the system 100 and to bridge the data signals between processor bus 110, memory 120, and system I/O 122. In some embodiments, the system logic chip 116 can provide a graphics port for coupling to a graphics controller 112. The MCH 116 is coupled to memory 120 through a memory interface 118. The graphics card 112 is coupled to the MCH 116 through an Accelerated Graphics Port (AGP) interconnect 114.

System 100 uses a proprietary hub interface bus 122 to couple the MCH 116 to the I/O controller hub (ICH) 130. The ICH 130 provides direct connections to some I/O devices via a local I/O bus. The local I/O bus is a high-speed I/O bus for connecting peripherals to the memory 120, chipset, and processor 102. Some examples are the audio controller, firmware hub (flash BIOS) 128, wireless transceiver 126, data storage 124, legacy I/O controller containing user input and keyboard interfaces, a serial expansion port such as Universal Serial Bus (USB), and a network controller 134. The data storage device 124 can comprise a hard disk drive, a floppy disk drive, a CD-ROM device, a flash memory device, or other mass storage device.

For another embodiment of a system, an instruction in accordance with one embodiment can be used with a system on a chip. One embodiment of a system on a chip comprises of a processor and a memory. The memory for one such system is a flash memory. The flash memory can be located on the same die as the processor and other system components. Additionally, other logic blocks such as a memory controller or graphics controller can also be located on a system on a chip.

Figure 1B:
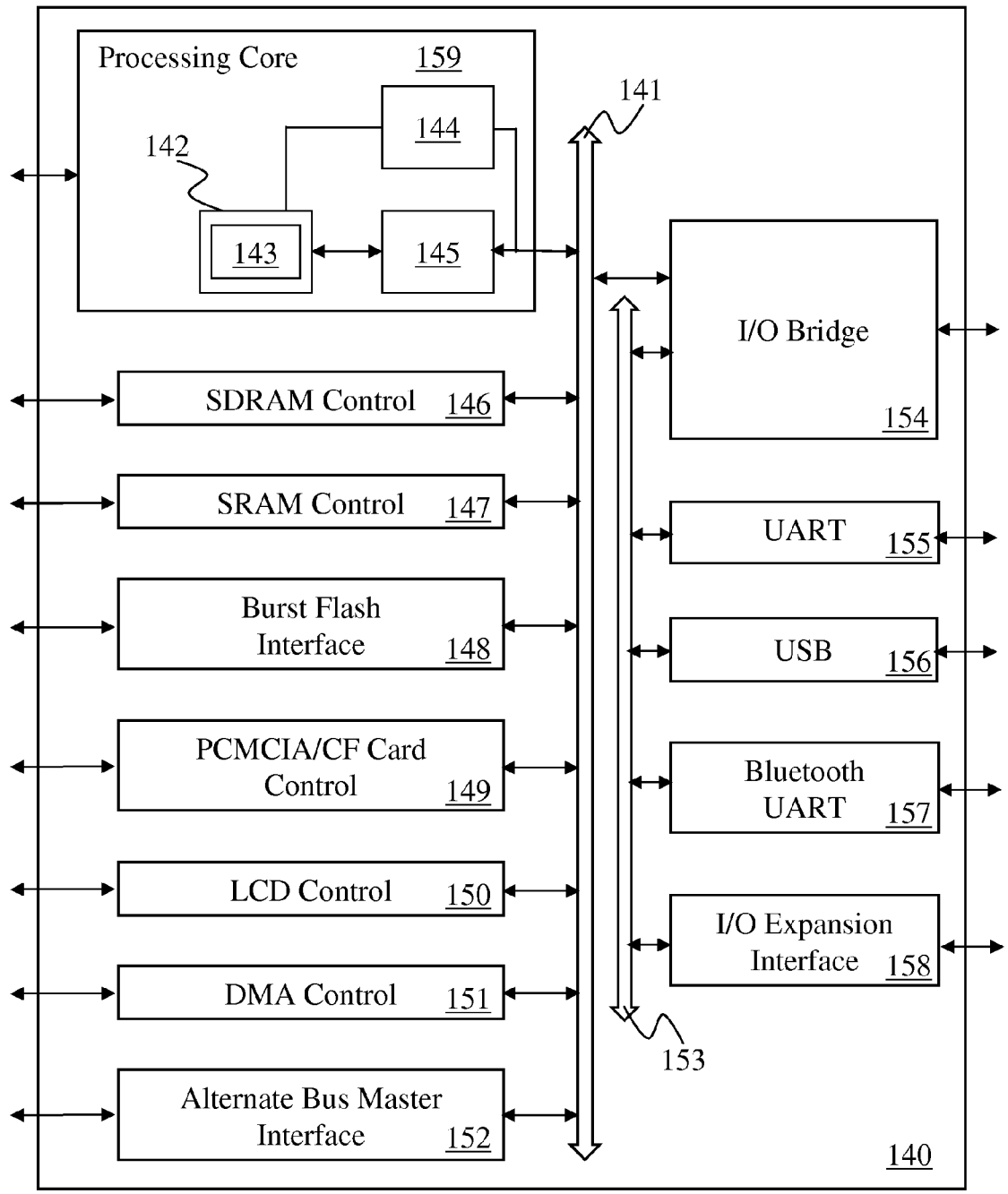
FIG. 1B is a block diagram of another embodiment of a system that executes instructions to provide SIMD address conflict resolution with vector population count functionality.

FIG. 1B illustrates a data processing system 140 which implements the principles of one embodiment of the present invention. It will be readily appreciated by one of skill in the art that the embodiments described herein can be used with alternative processing systems without departure from the scope of embodiments of the invention.

Computer system 140 comprises a processing core 159 capable of performing at least one instruction in accordance with one embodiment. For one embodiment, processing core 159 represents a processing unit of any type of architecture, including but not limited to a CISC, a RISC or a VLIW type architecture. Processing core 159 may also be suitable for manufacture in one or more process technologies and by being represented on a machine readable media in sufficient detail, may be suitable to facilitate said manufacture.

Processing core 159 comprises an execution unit 142, a set of register file(s) 145, and a decoder 144. Processing core 159 also includes additional circuitry (not shown) which is not necessary to the understanding of embodiments of the present invention. Execution unit 142 is used for executing instructions received by processing core 159. In addition to performing typical processor instructions, execution unit 142 can perform instructions in packed instruction set 143 for performing operations on packed data formats. Packed instruction set 143 includes instructions for performing embodiments of the invention and other packed instructions. Execution unit 142 is coupled to register file 145 by an internal bus. Register file 145 represents a storage area on processing core 159 for storing information, including data. As previously mentioned, it is understood that the storage area used for storing the packed data is not critical. Execution unit 142 is coupled to decoder 144. Decoder 144 is used for decoding instructions received by processing core 159 into control signals and/or microcode entry points. In response to these control signals and/or microcode entry points, execution unit 142 performs the appropriate operations. In one embodiment, the decoder is used to interpret the opcode of the instruction, which will indicate what operation should be performed on the corresponding data indicated within the instruction.

Processing core 159 is coupled with bus 141 for communicating with various other system devices, which may include but are not limited to, for example, synchronous dynamic random access memory (SDRAM) control 146, static random access memory (SRAM) control 147, burst flash memory interface 148, personal computer memory card international association (PCMCIA)/compact flash (CF) card control 149, liquid crystal display (LCD) control 150, direct memory access (DMA) controller 151, and alternative bus master interface 152. In one embodiment, data processing system 140 may also comprise an I/O bridge 154 for communicating with various I/O devices via an I/O bus 153. Such I/O devices may include but are not limited to, for example, universal asynchronous receiver/transmitter (UART) 155, universal serial bus (USB) 156, Bluetooth wireless UART 157 and I/O expansion interface 158.

One embodiment of data processing system 140 provides for mobile, network and/or wireless communications and a processing core 159 capable of performing SIMD operations including a text string comparison operation. Processing core 159 may be programmed with various audio, video, imaging and communications algorithms including discrete transformations such as a Walsh-Hadamard transform, a fast Fourier transform (FFT), a discrete cosine transform (DCT), and their respective inverse transforms; compression/decompression techniques such as color space transformation, video encode motion estimation or video decode motion compensation; and modulation/demodulation (MODEM) functions such as pulse coded modulation (PCM).

Figure 1C:
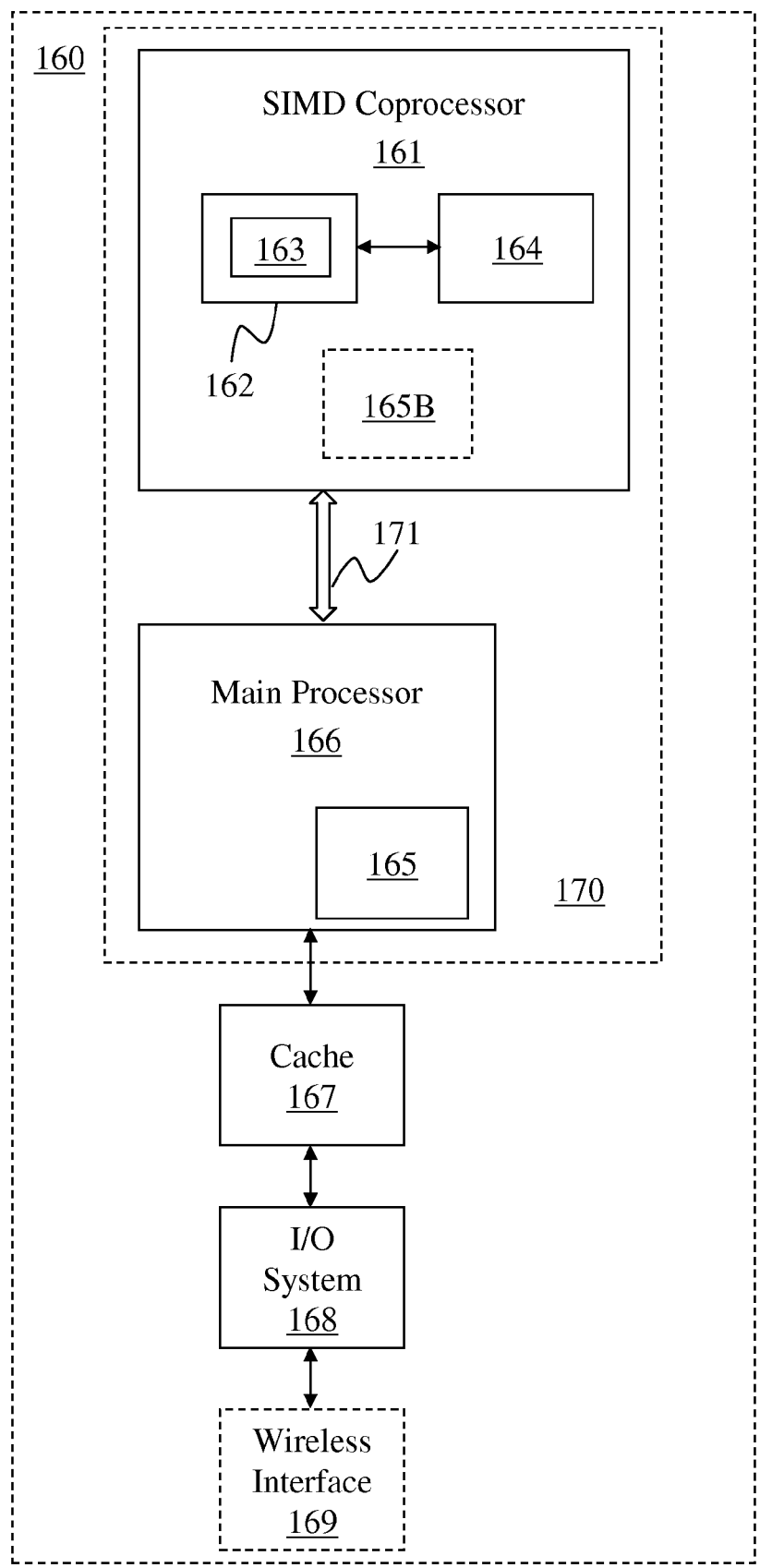
FIG. 1C is a block diagram of another embodiment of a system that executes instructions to provide SIMD address conflict resolution with vector population count functionality.

FIG. 1C illustrates another alternative embodiments of a data processing system capable of executing instructions to provide SIMD address conflict resolution with vector population count functionality. In accordance with one alternative embodiment, data processing system 160 may include a main processor 166, a SIMD coprocessor 161, a cache memory 167, and an input/output system 168. The input/output system 168 may optionally be coupled to a wireless interface 169. SIMD coprocessor 161 is capable of performing operations including instructions in accordance with one embodiment. Processing core 170 may be suitable for manufacture in one or more process technologies and by being represented on a machine readable media in sufficient detail, may be suitable to facilitate the manufacture of all or part of data processing system 160 including processing core 170.

For one embodiment, SIMD coprocessor 161 comprises an execution unit 162 and a set of register file(s) 164. One embodiment of main processor 166 comprises a decoder 165 to recognize instructions of instruction set 163 including instructions in accordance with one embodiment for execution by execution unit 162. For alternative embodiments, SIMD coprocessor 161 also comprises at least part of decoder 165B to decode instructions of instruction set 163. Processing core 170 also includes additional circuitry (not shown) which is not necessary to the understanding of embodiments of the present invention.

In operation, the main processor 166 executes a stream of data processing instructions that control data processing operations of a general type including interactions with the cache memory 167, and the input/output system 168. Embedded within the stream of data processing instructions are SIMD coprocessor instructions. The decoder 165 of main processor 166 recognizes these SIMD coprocessor instructions as being of a type that should be executed by an attached SIMD coprocessor 161. Accordingly, the main processor 166 issues these SIMD coprocessor instructions (or control signals representing SIMD coprocessor instructions) on the coprocessor bus 171 where from they are received by any attached SIMD coprocessors. In this case, the SIMD coprocessor 161 will accept and execute any received SIMD coprocessor instructions intended for it.

Data may be received via wireless interface 169 for processing by the SIMD coprocessor instructions. For one example, voice communication may be received in the form of a digital signal, which may be processed by the SIMD coprocessor instructions to regenerate digital audio samples representative of the voice communications. For another example, compressed audio and/or video may be received in the form of a digital bit stream, which may be processed by the SIMD coprocessor instructions to regenerate digital audio samples and/or motion video frames. For one embodiment of processing core 170, main processor 166, and a SIMD coprocessor 161 are integrated into a single processing core 170 comprising an execution unit 162, a set of register file(s) 164, and a decoder 165 to recognize instructions of instruction set 163 including instructions in accordance with one embodiment.

Figure 2:
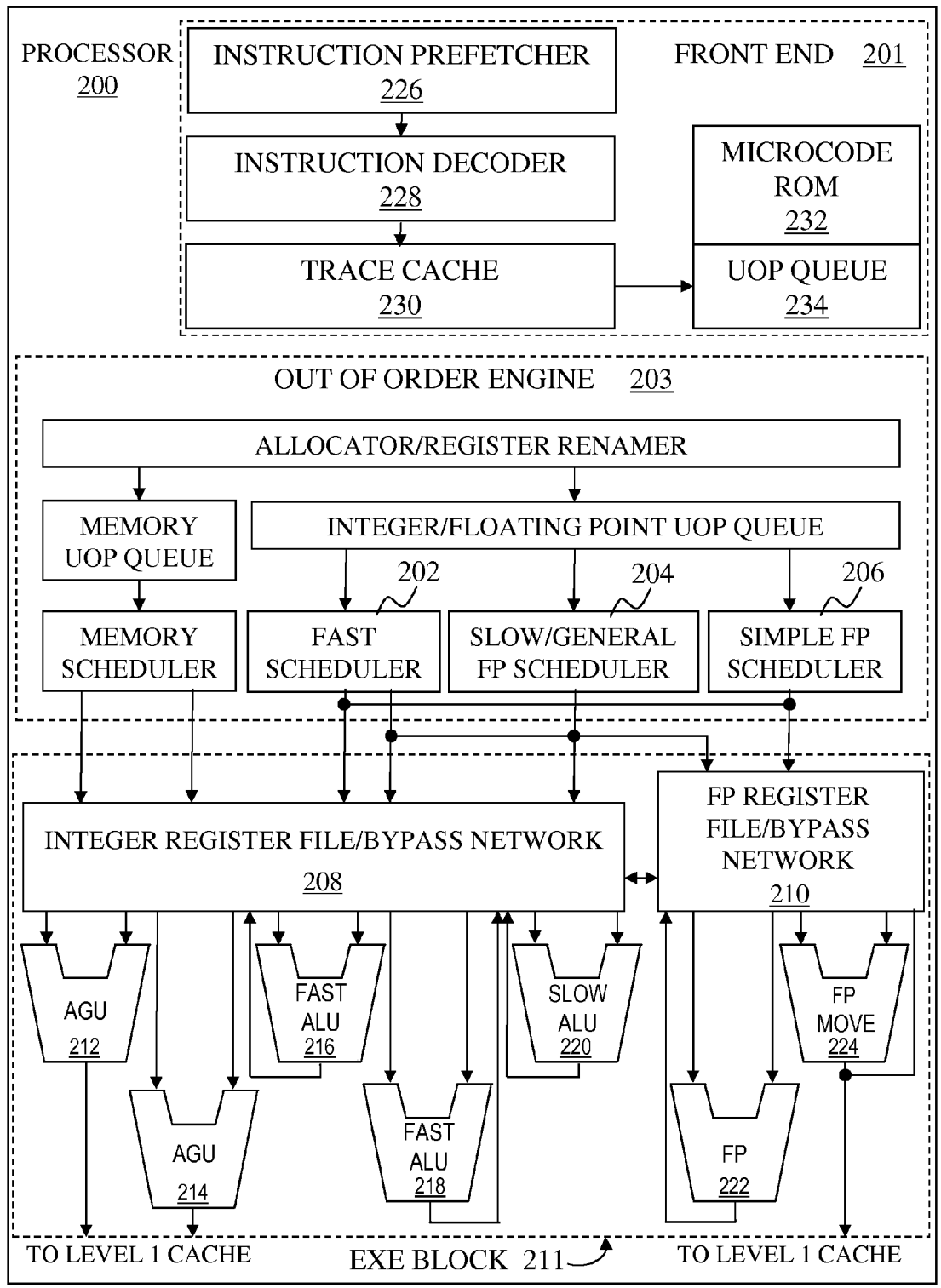
FIG. 2 is a block diagram of one embodiment of a processor that executes instructions to provide SIMD address conflict resolution with vector population count functionality.

FIG. 2 is a block diagram of the micro-architecture for a processor 200 that includes logic circuits to perform instructions in accordance with one embodiment of the present invention. In some embodiments, an instruction in accordance with one embodiment can be implemented to operate on data elements having sizes of byte, word, doubleword, quadword, etc., as well as datatypes, such as single and double precision integer and floating point datatypes. In one embodiment the in-order front end 201 is the part of the processor 200 that fetches instructions to be executed and prepares them to be used later in the processor pipeline. The front end 201 may include several units. In one embodiment, the instruction prefetcher 226 fetches instructions from memory and feeds them to an instruction decoder 228 which in turn decodes or interprets them. For example, in one embodiment, the decoder decodes a received instruction into one or more operations called "microinstructions" or "micro-operations" (also called micro op or uops) that the machine can execute. In other embodiments, the decoder parses the instruction into an opcode and corresponding data and control fields that are used by the micro-architecture to perform operations in accordance with one embodiment. In one embodiment, the trace cache 230 takes decoded uops and assembles them into program ordered sequences or traces in the uop queue 234 for execution. When the trace cache 230 encounters a complex instruction, the microcode ROM 232 provides the uops needed to complete the operation.

Some instructions are converted into a single micro-op, whereas others need several micro-ops to complete the full operation. In one embodiment, if more than four micro-ops are needed to complete a instruction, the decoder 228 accesses the microcode ROM 232 to do the instruction. For one embodiment, an instruction can be decoded into a small number of micro ops for processing at the instruction decoder 228. In another embodiment, an instruction can be stored within the microcode ROM 232 should a number of micro-ops be needed to accomplish the operation. The trace cache 230 refers to a entry point programmable logic array (PLA) to determine a correct micro-instruction pointer for reading the micro-code sequences to complete one or more instructions in accordance with one embodiment from the micro-code ROM 232. After the microcode ROM 232 finishes sequencing micro-ops for an instruction, the front end 201 of the machine resumes fetching micro-ops from the trace cache 230.

The out-of-order execution engine 203 is where the instructions are prepared for execution. The out-of-order execution logic has a number of buffers to smooth out and reorder the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: memory scheduler, fast scheduler 202, slow/general floating point scheduler 204, and simple floating point scheduler 206. The uop schedulers 202, 204, 206, determine when a uop is ready to execute based on the readiness of their dependent input register operand sources and the availability of the execution resources the uops need to complete their operation. The fast scheduler 202 of one embodiment can schedule on each half of the main clock cycle while the other schedulers can only schedule once per main processor clock cycle. The schedulers arbitrate for the dispatch ports to schedule uops for execution.

Register files 208, 210, sit between the schedulers 202, 204, 206, and the execution units 212, 214, 216, 218, 220, 222, 224 in the execution block 211. There is a separate register file 208, 210, for integer and floating point operations, respectively. Each register file 208, 210, of one embodiment also includes a bypass network that can bypass or forward just completed results that have not yet been written into the register file to new dependent uops. The integer register file 208 and the floating point register file 210 are also capable of communicating data with the other. For one embodiment, the integer register file 208 is split into two separate register files, one register file for the low order 32 bits of data and a second register file for the high order 32 bits of data. The floating point register file 210 of one embodiment has 128 bit wide entries because floating point instructions typically have operands from 64 to 128 bits in width.

The execution block 211 contains the execution units 212, 214, 216, 218, 220, 222, 224, where the instructions are actually executed. This section includes the register files 208, 210, that store the integer and floating point data operand values that the microinstructions need to execute. The processor 200 of one embodiment is comprised of a number of execution units: address generation unit (AGU) 212, AGU 214, fast ALU 216, fast ALU 218, slow ALU 220, floating point ALU 222, floating point move unit 224. For one embodiment, the floating point execution blocks 222, 224, execute floating point, MMX, SIMD, and SSE, or other operations. The floating point ALU 222 of one embodiment includes a 64 bit by 64 bit floating point divider to execute divide, square root, and remainder micro-ops. For embodiments of the present invention, instructions involving a floating point value may be handled with the floating point hardware. In one embodiment, the ALU operations go to the high-speed ALU execution units 216, 218. The fast ALUs 216, 218, of one embodiment can execute fast operations with an effective latency of half a clock cycle. For one embodiment, most complex integer operations go to the slow ALU 220 as the slow ALU 220 includes integer execution hardware for long latency type of operations, such as a multiplier, shifts, flag logic, and branch processing. Memory load/store operations are executed by the AGUs 212, 214. For one embodiment, the integer ALUs 216, 218, 220, are described in the context of performing integer operations on 64 bit data operands. In alternative embodiments, the ALUs 216, 218, 220, can be implemented to support a variety of data bits including 16, 32, 128, 256, etc. Similarly, the floating point units 222, 224, can be implemented to support a range of operands having bits of various widths. For one embodiment, the floating point units 222, 224, can operate on 128 bits wide packed data operands in conjunction with SIMD and multimedia instructions.

In one embodiment, the uops schedulers 202, 204, 206, dispatch dependent operations before the parent load has finished executing. As uops are speculatively scheduled and executed in processor 200, the processor 200 also includes logic to handle memory misses. If a data load misses in the data cache, there can be dependent operations in flight in the pipeline that have left the scheduler with temporarily incorrect data. A replay mechanism tracks and re-executes instructions that use incorrect data. Only the dependent operations need to be replayed and the independent ones are allowed to complete. The schedulers and replay mechanism of one embodiment of a processor are also designed to catch instructions that provide SIMD address conflict resolution with vector population count functionality.

The term "registers" may refer to the on-board processor storage locations that are used as part of instructions to identify operands. In other words, registers may be those that are usable from the outside of the processor (from a programmer's perspective). However, the registers of an embodiment should not be limited in meaning to a particular type of circuit. Rather, a register of an embodiment is capable of storing and providing data, and performing the functions described herein. The registers described herein can be implemented by circuitry within a processor using any number of different techniques, such as dedicated physical registers, dynamically allocated physical registers using register renaming, combinations of dedicated and dynamically allocated physical registers, etc. In one embodiment, integer registers store thirty-two bit integer data. A register file of one embodiment also contains eight multimedia SIMD registers for packed data. For the discussions below, the registers are understood to be data registers designed to hold packed data, such as 64 bits wide MMX™ registers (also referred to as 'mm' registers in some instances) in microprocessors enabled with MMX technology from Intel Corporation of Santa Clara, Calif. These MMX registers, available in both integer and floating point forms, can operate with packed data elements that accompany SIMD and SSE instructions. Similarly, 128 bits wide XMM registers relating to SSE2, SSE3, SSE4, or beyond (referred to generically as "SSEx") technology can also be used to hold such packed data operands. In one embodiment, in storing packed data and integer data, the registers do not need to differentiate between the two data types. In one embodiment, integer and floating point are either contained in the same register file or different register files. Furthermore, in one embodiment, floating point and integer data may be stored in different registers or the same registers.

Figure 3A:
FIG. 3A illustrates packed data types according to one embodiment.
Figure 3A:
Figure 3A:

In the examples of the following figures, a number of data operands are described. FIG. 3A illustrates various packed data type representations in multimedia registers according to one embodiment of the present invention. FIG. 3A illustrates data types for a packed byte 310, a packed word 320, and a packed doubleword (dword) 330 for 128 bits wide operands. The packed byte format 310 of this example is 128 bits long and contains sixteen packed byte data elements. A byte is defined here as 8 bits of data. Information for each byte data element is stored in bit 7 through bit 0 for byte 0, bit 15 through bit 8 for byte 1, bit 23 through bit 16 for byte 2, and finally bit 120 through bit 127 for byte 15. Thus, all available bits are used in the register. This storage arrangement increases the storage efficiency of the processor. As well, with sixteen data elements accessed, one operation can now be performed on sixteen data elements in parallel.

Generally, a data element is an individual piece of data that is stored in a single register or memory location with other data elements of the same length. In packed data sequences relating to SSEx technology, the number of data elements stored in a XMM register is 128 bits divided by the length in bits of an individual data element. Similarly, in packed data sequences relating to MMX and SSE technology, the number of data elements stored in an MMX register is 64 bits divided by the length in bits of an individual data element. Although the data types illustrated in FIG. 3A are 128 bit long, embodiments of the present invention can also operate with 64 bit wide, 256 bit wide, 512 bit wide, or other sized operands. The packed word format 320 of this example is 128 bits long and contains eight packed word data elements. Each packed word contains sixteen bits of information. The packed doubleword format 330 of FIG. 3A is 128 bits long and contains four packed doubleword data elements. Each packed doubleword data element contains thirty two bits of information. A packed quadword is 128 bits long and contains two packed quadword data elements.

Figure 3B:
FIG. 3B illustrates packed data types according to one embodiment.
Figure 3B:
Figure 3B:

FIG. 3B illustrates alternative in-register data storage formats. Each packed data can include more than one independent data element. Three packed data formats are illustrated; packed half 341, packed single 342, and packed double 343. One embodiment of packed half 341, packed single 342, and packed double 343 contain fixed-point data elements. For an alternative embodiment one or more of packed half 341, packed single 342, and packed double 343 may contain floating-point data elements. One alternative embodiment of packed half 341 is one hundred twenty-eight bits long containing eight 16-bit data elements. One embodiment of packed single 342 is one hundred twenty-eight bits long and contains four 32-bit data elements. One embodiment of packed double 343 is one hundred twenty-eight bits long and contains two 64-bit data elements. It will be appreciated that such packed data formats may be further extended to other register lengths, for example, to 96-bits, 160-bits, 192-bits, 224-bits, 256-bits, 512-bits or more.

FIG. 3C illustrates various signed and unsigned packed data type representations in multimedia registers according to one embodiment of the present invention. Unsigned packed byte representation 344 illustrates the storage of an unsigned packed byte in a SIMD register. Information for each byte data element is stored in bit seven through bit zero for byte zero, bit fifteen through bit eight for byte one, bit twenty-three through bit sixteen for byte two, etc., and finally bit one hundred twenty through bit one hundred twenty-seven for byte fifteen. Thus, all available bits are used in the register. This storage arrangement can increase the storage efficiency of the processor. As well, with sixteen data elements accessed, one operation can now be performed on sixteen data elements in a parallel fashion. Signed packed byte representation 345 illustrates the storage of a signed packed byte. Note that the eighth bit of every byte data element is the sign indicator. Unsigned packed word representation 346 illustrates how word seven through word zero are stored in a SIMD register. Signed packed word representation 347 is similar to the unsigned packed word in-register representation 346. Note that the sixteenth bit of each word data element is the sign indicator. Unsigned packed doubleword representation 348 shows how doubleword data elements are stored. Signed packed doubleword representation 349 is similar to unsigned packed doubleword in-register representation 348. Note that the necessary sign bit is the thirty-second bit of each doubleword data element.

Figure 3D:
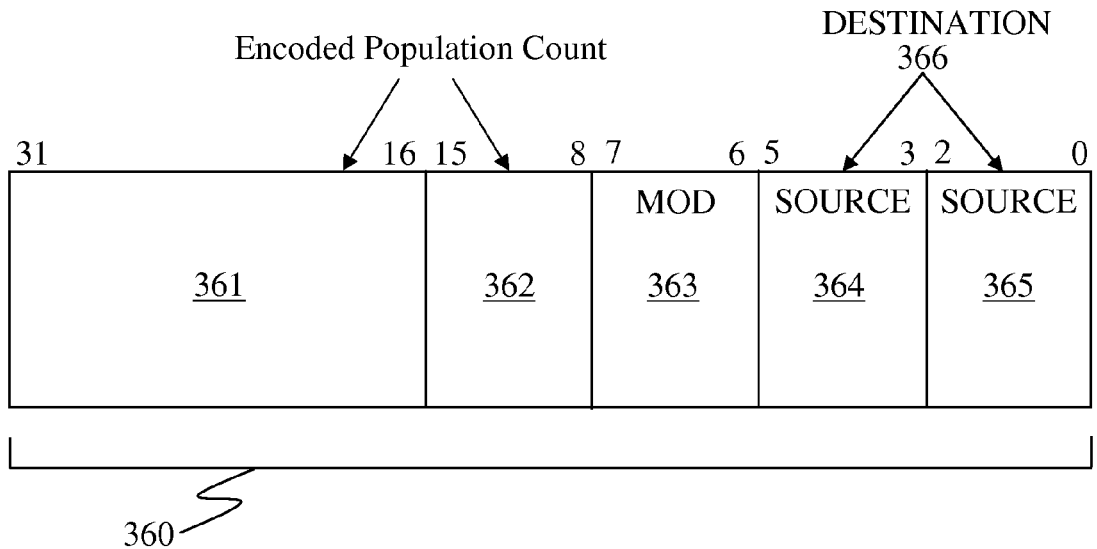
FIG. 3D illustrates an instruction encoding to provide SIMD address conflict resolution with vector population count functionality according to one embodiment.

FIG. 3D is a depiction of one embodiment of an operation encoding (opcode) format 360, having thirty-two or more bits, and register/memory operand addressing modes corresponding with a type of opcode format described in the "Intel® 64 and IA-32 Intel Architecture Software Developer's Manual Combined Volumes 2A and 2B: Instruction Set Reference A-Z," which is which is available from Intel Corporation, Santa Clara, Calif. on the world-wide-web (www) at intel.com/products/processor/manuals/. In one embodiment, and instruction may be encoded by one or more of fields 361 and 362. Up to two operand locations per instruction may be identified, including up to two source operand identifiers 364 and 365. For one embodiment, destination operand identifier 366 is the same as source operand identifier 364, whereas in other embodiments they are different. For an alternative embodiment, destination operand identifier 366 is the same as source operand identifier 365, whereas in other embodiments they are different. In one embodiment, one of the source operands identified by source operand identifiers 364 and 365 is overwritten by the results of the instruction, whereas in other embodiments identifier 364 corresponds to a source register element and identifier 365 corresponds to a destination register element. For one embodiment, operand identifiers 364 and 365 may be used to identify 32-bit or 64-bit source and destination operands.

Figure 3E:
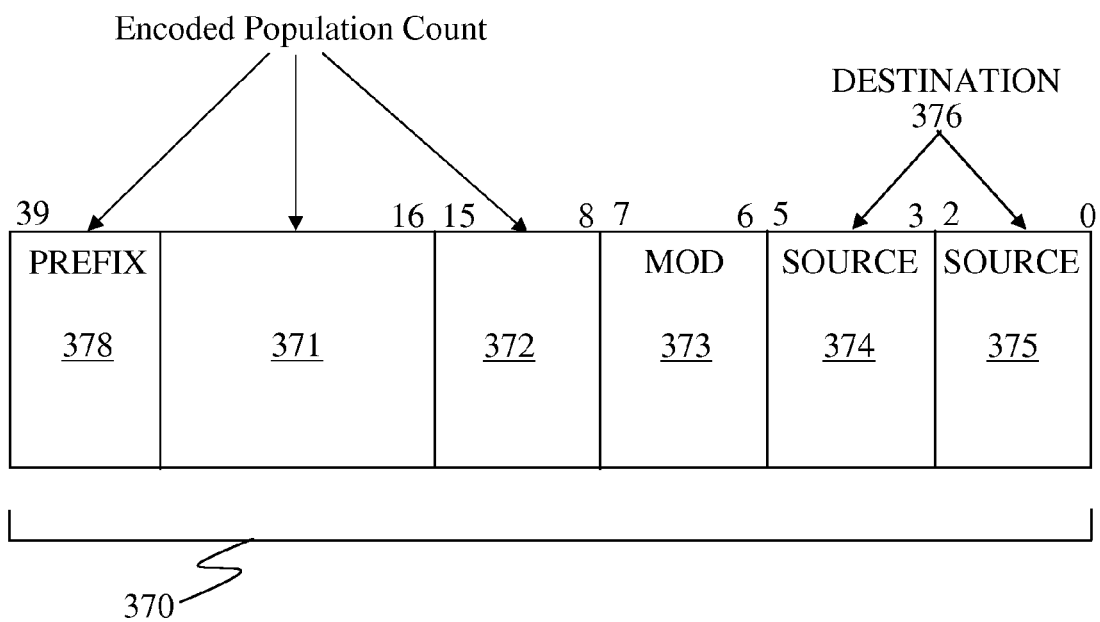
FIG. 3E illustrates an instruction encoding to provide SIMD address conflict resolution with vector population count functionality according to another embodiment.

FIG. 3E is a depiction of another alternative operation encoding (opcode) format 370, having forty or more bits. Opcode format 370 corresponds with opcode format 360 and comprises an optional prefix byte 378. An instruction according to one embodiment may be encoded by one or more of fields 378, 371, and 372. Up to two operand locations per instruction may be identified by source operand identifiers 374 and 375 and by prefix byte 378. For one embodiment, prefix byte 378 may be used to identify 32-bit or 64-bit source and destination operands. For one embodiment, destination operand identifier 376 is the same as source operand identifier 374, whereas in other embodiments they are different. For an alternative embodiment, destination operand identifier 376 is the same as source operand identifier 375, whereas in other embodiments they are different. In one embodiment, an instruction operates on one or more of the operands identified by operand identifiers 374 and 375 and one or more operands identified by the operand identifiers 374 and 375 is overwritten by the results of the instruction, whereas in other embodiments, operands identified by identifiers 374 and 375 are written to another data element in another register. Opcode formats 360 and 370 allow register to register, memory to register, register by memory, register by register, register by immediate, register to memory addressing specified in part by MOD fields 363 and 373 and by optional scale-index-base and displacement bytes.

Figure 3F:
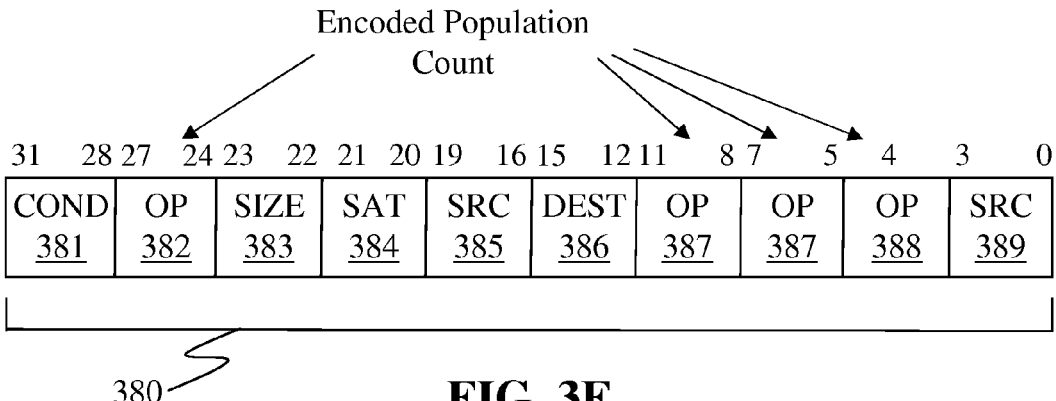
FIG. 3F illustrates an instruction encoding to provide SIMD address conflict resolution with vector population count functionality according to another embodiment.

Turning next to FIG. 3F, in some alternative embodiments, 64-bit (or 128-bit, or 256-bit, or 512-bit or more) single instruction multiple data (SIMD) arithmetic operations may be performed through a coprocessor data processing (CDP) instruction. Operation encoding (opcode) format 380 depicts one such CDP instruction having CDP opcode fields 382 and 389. The type of CDP instruction, for alternative embodiments, operations may be encoded by one or more of fields 383, 384, 387, and 388. Up to three operand locations per instruction may be identified, including up to two source operand identifiers 385 and 390 and one destination operand identifier 386. One embodiment of the coprocessor can operate on 8, 16, 32, and 64 bit values. For one embodiment, an instruction is performed on integer data elements. In some embodiments, an instruction may be executed conditionally, using condition field 381. For some embodiments, source data sizes may be encoded by field 383. In some embodiments, Zero (Z), negative (N), carry (C), and overflow (V) detection can be done on SIMD fields. For some instructions, the type of saturation may be encoded by field 384.

Figure 3G:
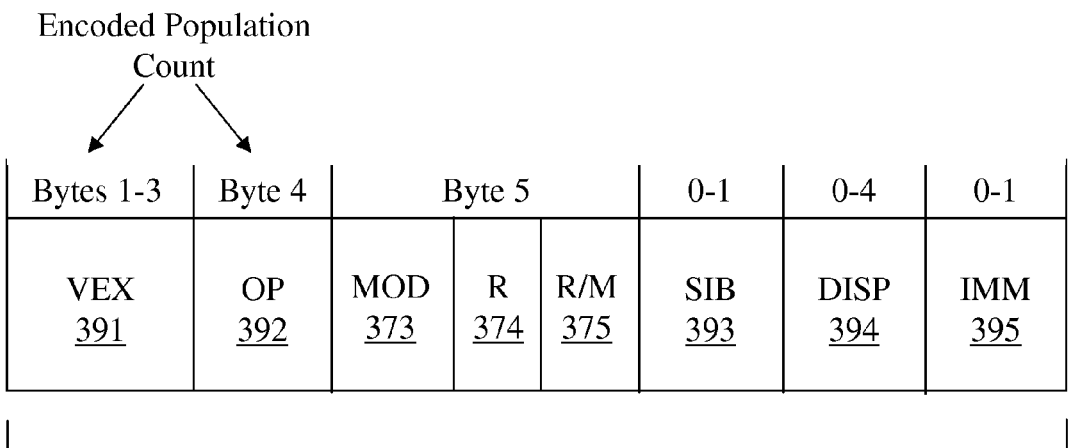
FIG. 3G illustrates an instruction encoding to provide SIMD address conflict resolution with vector population count functionality according to another embodiment.

Turning next to FIG. 3G is a depiction of another alternative operation encoding (opcode) format 397, to provide SIMD address conflict resolution with vector population count functionality according to another embodiment, corresponding with a type of opcode format described in the "Intel® Advanced Vector Extensions Programming Reference," which is available from Intel Corp., Santa Clara, Calif. on the world-wide-web (www) at intel.com/products/processor/manuals/.

The original x86 instruction set provided for a 1-byte opcode with various formats of address syllable and immediate operand contained in additional bytes whose presence was known from the first "opcode" byte. Additionally, there were certain byte values that were reserved as modifiers to the opcode (called prefixes, as they had to be placed before the instruction). When the original palette of 256 opcode bytes (including these special prefix values) was exhausted, a single byte was dedicated as an escape to a new set of 256 opcodes. As vector instructions (e.g., SIMD) were added, a need for more opcodes was generated, and the "two byte" opcode map also was insufficient, even when expanded through the use of prefixes. To this end, new instructions were added in additional maps which use 2 bytes plus an optional prefix as an identifier.

Additionally, in order to facilitate additional registers in 64-bit mode, an additional prefix may be used (called "REX") in between the prefixes and the opcode (and any escape bytes necessary to determine the opcode). In one embodiment, the REX may have 4 "payload" bits to indicate use of additional registers in 64-bit mode. In other embodiments it may have fewer or more than 4 bits. The general format of at least one instruction set (which corresponds generally with format 360 and/or format 370) is illustrated generically by the following:

[prefixes] [rex] escape [escape2] opcode modrm (etc.)

Opcode format 397 corresponds with opcode format 370 and comprises optional VEX prefix bytes 391 (beginning with C4 hex in one embodiment) to replace most other commonly used legacy instruction prefix bytes and escape codes. For example, the following illustrates an embodiment using two fields to encode an instruction, which may be used when a second escape code is present in the original instruction, or when extra bits (e.g., the XB and W fields) in the REX field need to be used. In the embodiment illustrated below, legacy escape is represented by a new escape value, legacy prefixes are fully compressed as part of the "payload" bytes, legacy prefixes are reclaimed and available for future expansion, the second escape code is compressed in a "map" field, with future map or feature space available, and new features are added (e.g., increased vector length and an additional source register specifier).

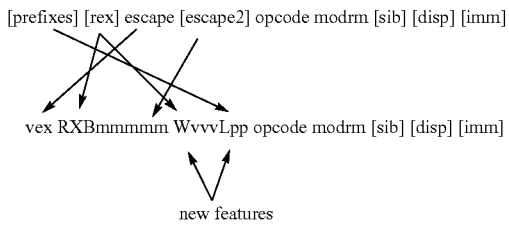

An instruction according to one embodiment may be encoded by one or more of fields 391 and 392. Up to four operand locations per instruction may be identified by field 391 in combination with source operand identifiers 374 and 375 and in combination with an optional scale-index-base (SIB) identifier 393, an optional displacement identifier 394, and an optional immediate byte 395. For one embodiment, VEX prefix bytes 391 may be used to identify 32-bit or 64-bit source and destination operands and/or 128-bit or 256-bit SIMD register or memory operands. For one embodiment, the functionality provided by opcode format 397 may be redundant with opcode format 370, whereas in other embodiments they are different. Opcode formats 370 and 397 allow register to register, memory to register, register by memory, register by register, register by immediate, register to memory addressing specified in part by MOD field 373 and by optional (SIB) identifier 393, an optional displacement identifier 394, and an optional immediate byte 395.

Figure 3H:
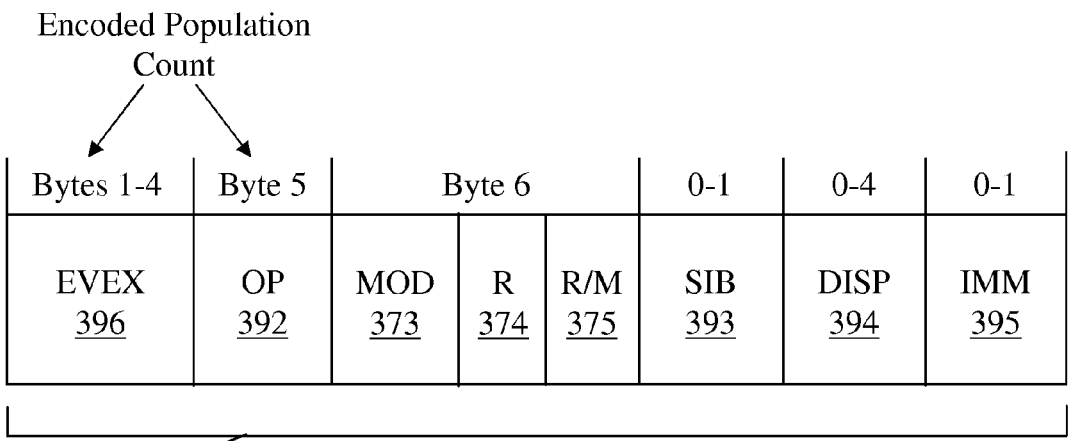
FIG. 3H illustrates an instruction encoding to provide SIMD address conflict resolution with vector population count functionality according to another embodiment.

Turning next to FIG. 3H is a depiction of another alternative operation encoding (opcode) format 398, to provide SIMD address conflict resolution with vector population count functionality according to another embodiment. Opcode format 398 corresponds with opcode formats 370 and 397 and comprises optional EVEX prefix bytes 396 (beginning with 62 hex in one embodiment) to replace most other commonly used legacy instruction prefix bytes and escape codes and provide additional functionality. An instruction according to one embodiment may be encoded by one or more of fields 396 and 392. Up to four operand locations per instruction and a mask may be identified by field 396 in combination with source operand identifiers 374 and 375 and in combination with an optional scale-index-base (SIB) identifier 393, an optional displacement identifier 394, and an optional immediate byte 395. For one embodiment, EVEX prefix bytes 396 may be used to identify 32-bit or 64-bit source and destination operands and/or 128-bit, 256-bit or 512-bit SIMD register or memory operands. For one embodiment, the functionality provided by opcode format 398 may be redundant with opcode formats 370 or 397, whereas in other embodiments they are different. Opcode format 398 allows register to register, memory to register, register by memory, register by register, register by immediate, register to memory addressing, with masks, specified in part by MOD field 373 and by optional (SIB) identifier 393, an optional displacement identifier 394, and an optional immediate byte 395. The general format of at least one instruction set (which corresponds generally with format 360 and/or format 370) is illustrated generically by the following:

evex1 RXBmmmmm WvvvLpp evex4 opcode modrm [sib] [disp] [imm]

For one embodiment an instruction encoded according to the EVEX format 398 may have additional "payload" bits that may be used to provide SIMD vector population count functionality with additional new features such as, for example, a user configurable mask register, or an additional operand, or selections from among 128-bit, 256-bit or 512-bit vector registers, or more registers from which to select, etc.

For example, where VEX format 397 may be used to provide SIMD vector population count functionality without a mask, the EVEX format 398 may be used to provide SIMD vector population count functionality with an explicit user configurable mask. Additionally, where VEX format 397 may be used to provide SIMD vector population count functionality on 128-bit or 256-bit vector registers, EVEX format 398 may be used to provide SIMD vector population count functionality on 128-bit, 256-bit, 512-bit or larger (or smaller) vector registers.

Example instructions to provide SIMD vector leading zero count functionality, SIMD vector address conflict detection functionality, and SIMD vector population count functionality for efficient vector address conflict resolution are illustrated by the following examples:

| Instruction | destination | source1 | source2 | description |
|---|---|---|---|---|
| VPLZCNTD | Vmm1 | Vmm2/ Mem1 | Mask1 | For each 32-bit element in the register Vmm2 or in a vector at memory location, Mem1, count the number of most significant contiguous bits set to zero and store the counts as corresponding elements in the register Vmm1. |
| VPLZCNTQ | Vmm1 | Vmm2/ Mem1 | Mask1 | For each 64-bit element in the register Vmm2 or in a vector at memory location, Mem1, count the number of most significant contiguous bits set to zero and store the counts as corresponding elements in the register Vmm1. |
| VPCONFLICTD | Vmm1 | Vmm2/ Mem1 | Mask1 | For each 32-bit element in the register Vmm2 or in a vector at memory location, Mem1, compare it with every less significant element to determine if they hold matching offsets, and in a |

| Instruction | destination | source1 | source2 | description |
| --- | --- | --- | --- | --- |
| | | | | corresponding element in the destination register, Vmm1, set any mask bits corresponding to a less significant data field holding a matching offset to one. Set all other bits in Vmm1 to zero. |
| VPCONFLICTQ | Vmm1 | Vmm2/ Mem1 | Mask1 | For each 64-bit element in the register Vmm2 or in a vector at memory location, Mem1, compare it with every less significant element to determine if they hold matching offsets, and in a corresponding element in the destination register, Vmm1, set any mask bits corresponding to a less significant data field holding a matching offset to one. Set all other bits in Vmm1 to zero. |
| VPOPCNTD | Vmm1 | Vmm2/ Mem1 | Maskl | For each 32-bit element in the register Vmm2 or in a vector at memory location, Mem1, count the number of bits set to one and store the counts as corresponding elements in the register Vmm1. |
| VPOPCNTQ | Vmm1 | Vmm2/ Mem1 | Mask1 | For each 64-bit element in the register Vmm2 or in a vector at memory location, Mem1, count the number of bits set to one and store the counts as corresponding elements in the register Vmm1. |

It will be appreciated that SIMD vector conflict instructions, as in the examples above, may be used for variable sized elements and memory offsets to provide SIMD vector address conflict detection functionality and to generate conflict masks for efficient SIMD address conflict resolution. It will also be appreciated that SIMD vector leading zero count instructions, as in the examples above, may be used with variable sized elements and conflict masks to provide SIMD permute controls, which will be described in greater detail below, thereby permitting more efficient SIMD address conflict resolution in registers without performing dependent computations through memory. It will further be appreciated that SIMD vector population count instructions, as in the examples above, may be used with variable sized elements and conflict masks to efficiently compute iteration counts and to provide SIMD completion masks for each iteration of a SIMD address conflict resolution, which will be described in greater detail below. Thus the instructions disclosed herein provide for more efficient SIMD address conflict resolution especially in gather-modify-scatter applications.

Figure 4A:
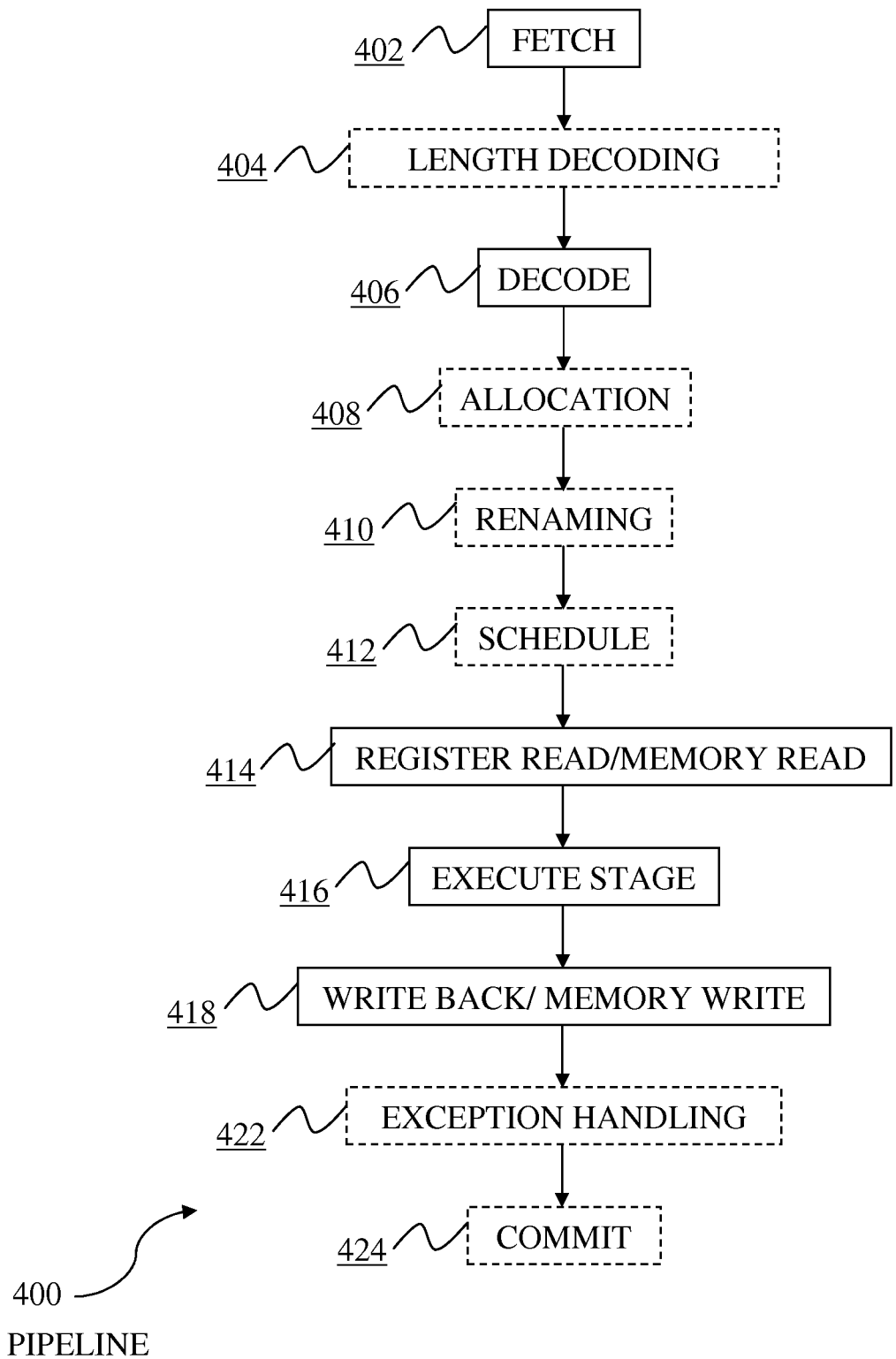
FIG. 4A illustrates elements of one embodiment of a processor micro-architecture to execute instructions that provide SIMD address conflict resolution with vector population count functionality.
Figure 4B:
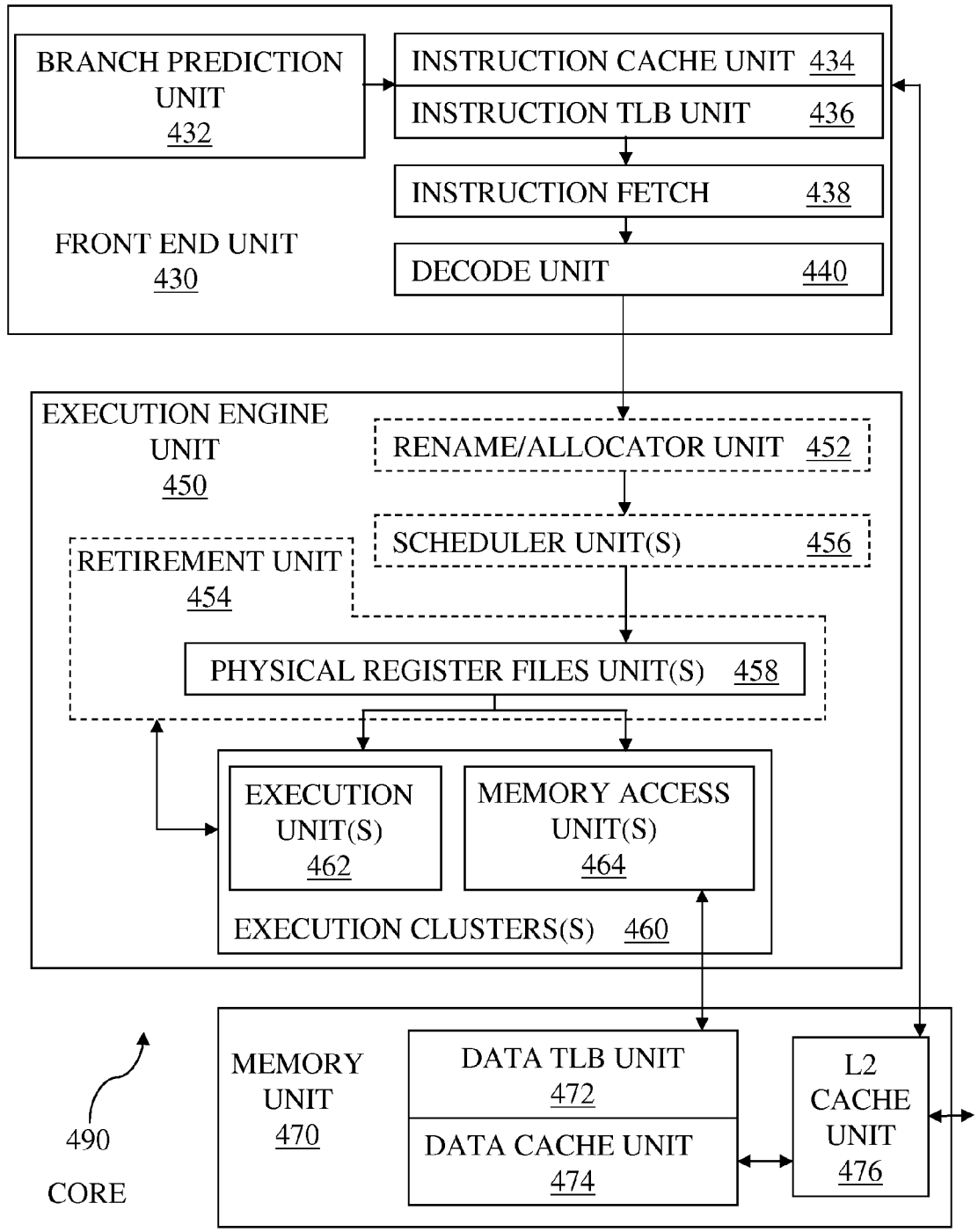
FIG. 4B illustrates elements of another embodiment of a processor micro-architecture to execute instructions that provide SIMD address conflict resolution with vector population count functionality.

FIG. 4A is a block diagram illustrating an in-order pipeline and a register renaming stage, out-of-order issue/execution pipeline according to at least one embodiment of the invention. FIG. 4B is a block diagram illustrating an in-order architecture core and a register renaming logic, out-of-order issue/execution logic to be included in a processor according to at least one embodiment of the invention. The solid lined boxes in FIG. 4A illustrate the in-order pipeline, while the dashed lined boxes illustrates the register renaming, out-of-order issue/execution pipeline. Similarly, the solid lined boxes in FIG. 4B illustrate the in-order architecture logic, while the dashed lined boxes illustrates the register renaming logic and out-of-order issue/execution logic.

In FIG. 4A, a processor pipeline 400 includes a fetch stage 402, a length decode stage 404, a decode stage 406, an allocation stage 408, a renaming stage 410, a scheduling (also known as a dispatch or issue) stage 412, a register read/memory read stage 414, an execute stage 416, a write back/memory write stage 418, an exception handling stage 422, and a commit stage 424.

In FIG. 4B, arrows denote a coupling between two or more units and the direction of the arrow indicates a direction of data flow between those units. FIG. 4B shows processor core 490 including a front end unit 430 coupled to an execution engine unit 450, and both are coupled to a memory unit 470.

The core 490 may be a reduced instruction set computing (RISC) core, a complex instruction set computing (CISC) core, a very long instruction word (VLIW) core, or a hybrid or alternative core type. As yet another option, the core 490 may be a special-purpose core, such as, for example, a network or communication core, compression engine, graphics core, or the like.

The front end unit 430 includes a branch prediction unit 432 coupled to an instruction cache unit 434, which is coupled to an instruction translation lookaside buffer (TLB) 436, which is coupled to an instruction fetch unit 438, which is coupled to a decode unit 440. The decode unit or decoder may decode instructions, and generate as an output one or more micro-operations, micro-code entry points, microinstructions, other instructions, or other control signals, which are decoded from, or which otherwise reflect, or are derived from, the original instructions. The decoder may be implemented using various different mechanisms. Examples of suitable mechanisms include, but are not limited to, look-up tables, hardware implementations, programmable logic arrays (PLAs), microcode read only memories (ROMs), etc. The instruction cache unit 434 is further coupled to a level 2 (L2) cache unit 476 in the memory unit 470. The decode unit 440 is coupled to a rename/allocator unit 452 in the execution engine unit 450.

The execution engine unit 450 includes the rename/allocator unit 452 coupled to a retirement unit 454 and a set of one or more scheduler unit(s) 456. The scheduler unit(s) 456 represents any number of different schedulers, including reservations stations, central instruction window, etc. The scheduler unit(s) 456 is coupled to the physical register file(s) unit(s) 458. Each of the physical register file(s) units 458 represents one or more physical register files, different ones of which store one or more different data types, such as scalar integer, scalar floating point, packed integer, packed floating point, vector integer, vector floating point, etc., status (e.g., an instruction pointer that is the address of the next instruction to be executed), etc. The physical register file(s) unit(s) 458 is overlapped by the retirement unit 454 to illustrate various ways in which register renaming and out-of-order execution may be implemented (e.g., using a reorder buffer(s) and a retirement register file(s), using a future file(s), a history buffer(s), and a retirement register file(s); using a register maps and a pool of registers; etc.). Generally, the architectural registers are visible from the outside of the processor or from a programmer's perspective. The registers are not limited to any known particular type of circuit. Various different types of registers are suitable as long as they are capable of storing and providing data as described herein. Examples of suitable registers include, but are not limited to, dedicated physical registers, dynamically allocated physical registers using register renaming, combinations of dedicated and dynamically allocated physical registers, etc. The retirement unit 454 and the physical register file(s) unit(s) 458 are coupled to the execution cluster(s) 460. The execution cluster(s) 460 includes a set of one or more execution units 462 and a set of one or more memory access units 464. The execution units 462 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 456, physical register file(s) unit(s) 458, and execution cluster(s) 460 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster, and in the case of a separate memory access pipeline, certain embodiments are implemented in which only the execution cluster of this pipeline has the memory access unit(s) 464). It should also be understood that where separate pipelines are used, one or more of these pipelines may be out-of-order issue/execution and the rest in-order.

The set of memory access units 464 is coupled to the memory unit 470, which includes a data TLB unit 472 coupled to a data cache unit 474 coupled to a level 2 (L2) cache unit 476. In one exemplary embodiment, the memory access units 464 may include a load unit, a store address unit, and a store data unit, each of which is coupled to the data TLB unit 472 in the memory unit 470. The L2 cache unit 476 is coupled to one or more other levels of cache and eventually to a main memory.

By way of example, the exemplary register renaming, out-of-order issue/execution core architecture may implement the pipeline 400 as follows: 1) the instruction fetch 438 performs the fetch and length decoding stages 402 and 404; 2) the decode unit 440 performs the decode stage 406; 3) the rename/allocator unit 452 performs the allocation stage 408 and renaming stage 410; 4) the scheduler unit(s) 456 performs the schedule stage 412; 5) the physical register file(s) unit(s) 458 and the memory unit 470 perform the register read/memory read stage 414; the execution cluster 460 perform the execute stage 416; 6) the memory unit 470 and the physical register file(s) unit(s) 458 perform the write back/memory write stage 418; 7) various units may be involved in the exception handling stage 422; and 8) the retirement unit 454 and the physical register file(s) unit(s) 458 perform the commit stage 424.

The core 490 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.).

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes a separate instruction and data cache units 434/474 and a shared L2 cache unit 476, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 5:
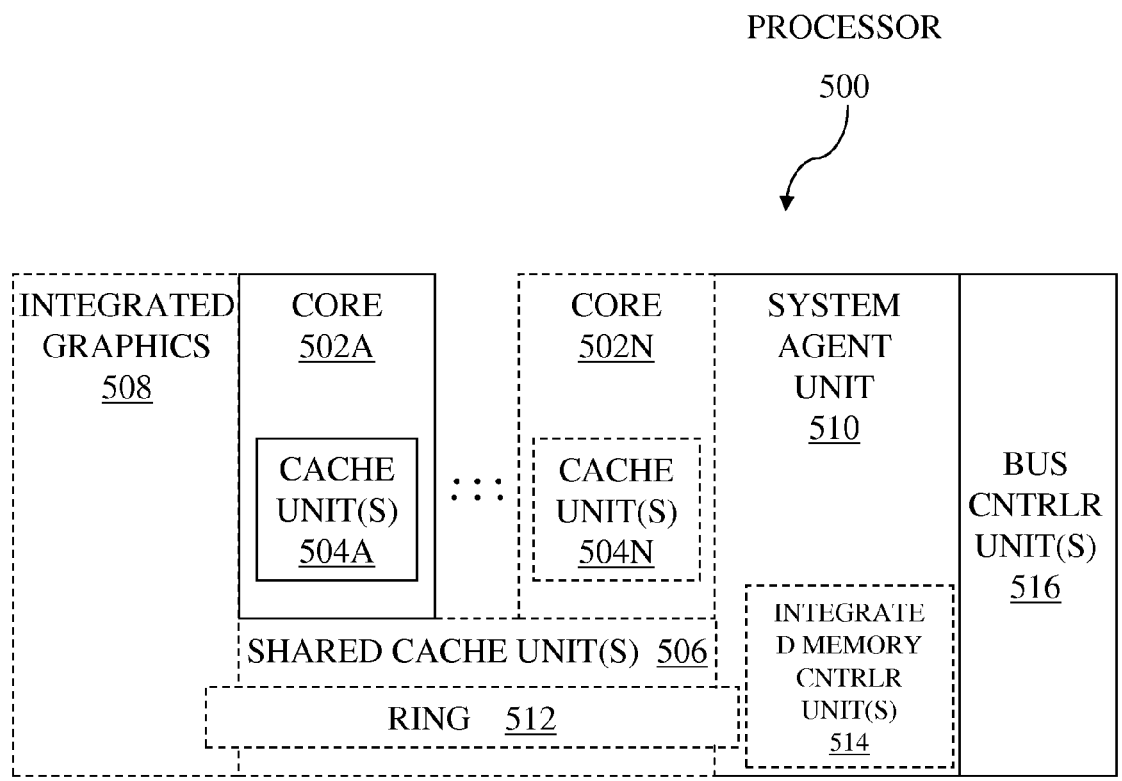
FIG. 5 is a block diagram of one embodiment of a processor to execute instructions that provide SIMD address conflict resolution with vector population count functionality.

FIG. 5 is a block diagram of a single core processor and a multicore processor 500 with integrated memory controller and graphics according to embodiments of the invention. The solid lined boxes in FIG. 5 illustrate a processor 500 with a single core 502A, a system agent 510, a set of one or more bus controller units 516, while the optional addition of the dashed lined boxes illustrates an alternative processor 500 with multiple cores 502A-N, a set of one or more integrated memory controller unit(s) 514 in the system agent unit 510, and an integrated graphics logic 508.

The memory hierarchy includes one or more levels of cache within the cores, a set or one or more shared cache units 506, and external memory (not shown) coupled to the set of integrated memory controller units 514. The set of shared cache units 506 may include one or more mid-level caches, such as level 2 (L2), level 3 (L3), level 4 (L4), or other levels of cache, a last level cache (LLC), and/or combinations thereof. While in one embodiment a ring based interconnect unit 512 interconnects the integrated graphics logic 508, the set of shared cache units 506, and the system agent unit 510, alternative embodiments may use any number of well-known techniques for interconnecting such units.

In some embodiments, one or more of the cores 502A-N are capable of multithreading. The system agent 510 includes those components coordinating and operating cores 502A-N. The system agent unit 510 may include for example a power control unit (PCU) and a display unit. The PCU may be or include logic and components needed for regulating the power state of the cores 502A-N and the integrated graphics logic 508. The display unit is for driving one or more externally connected displays.

The cores 502A-N may be homogenous or heterogeneous in terms of architecture and/or instruction set. For example, some of the cores 502A-N may be in order while others are out-of-order. As another example, two or more of the cores 502A-N may be capable of execution the same instruction set, while others may be capable of executing only a subset of that instruction set or a different instruction set.

The processor may be a general-purpose processor, such as a Core™ i3, i5, i7, 2 Duo and Quad, Xeon™, Itanium™, XScale™ or StrongARM™ processor, which are available from Intel Corporation, of Santa Clara, Calif. Alternatively, the processor may be from another company, such as ARM Holdings, Ltd, MIPS, etc. The processor may be a special-purpose processor, such as, for example, a network or communication processor, compression engine, graphics processor, co-processor, embedded processor, or the like. The processor may be implemented on one or more chips. The processor 500 may be a part of and/or may be implemented on one or more substrates using any of a number of process technologies, such as, for example, BiCMOS, CMOS, or NMOS.

Figure 6:
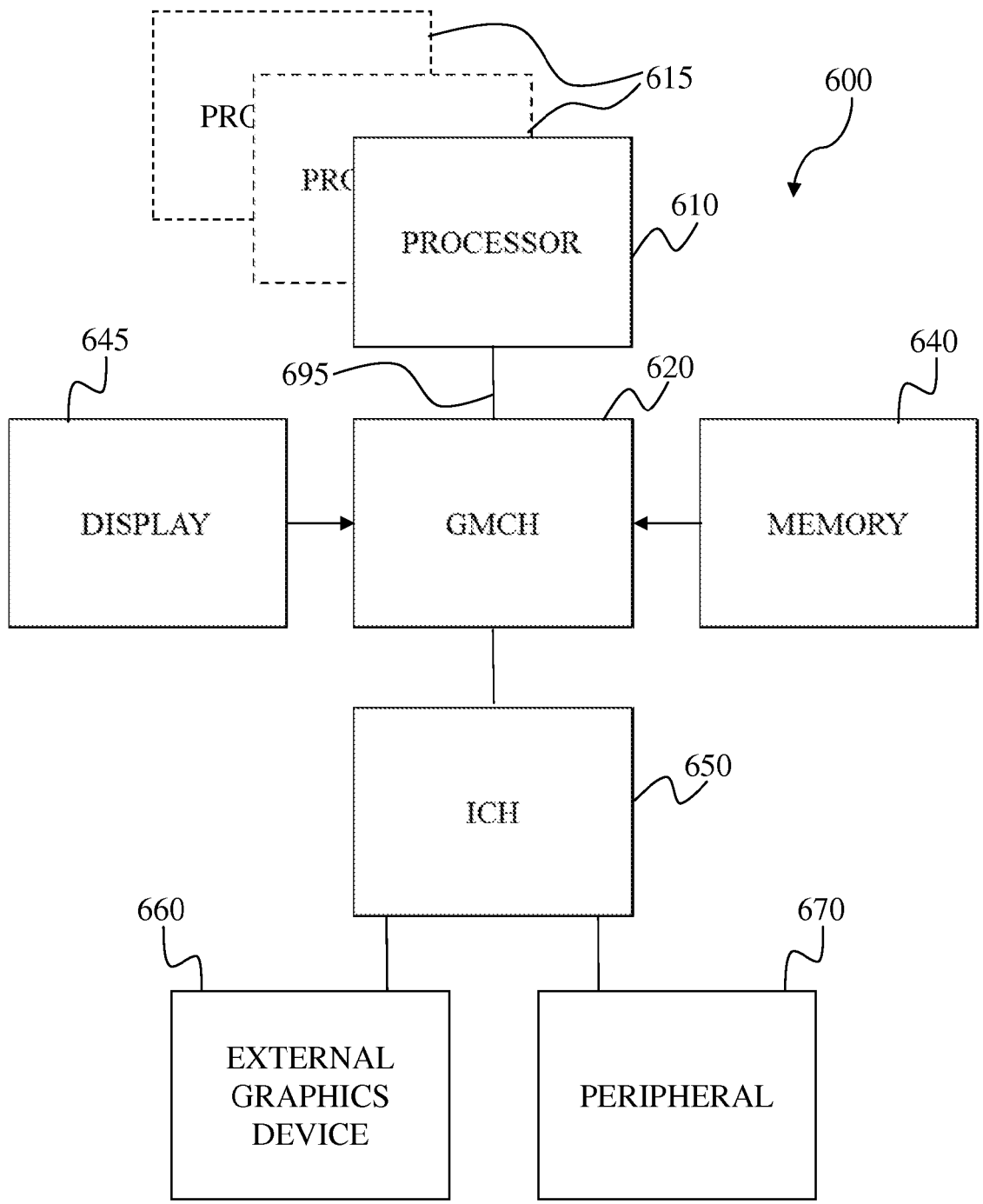
FIG. 6 is a block diagram of one embodiment of a computer system to execute instructions that provide SIMD address conflict resolution with vector population count functionality.
Figure 7:
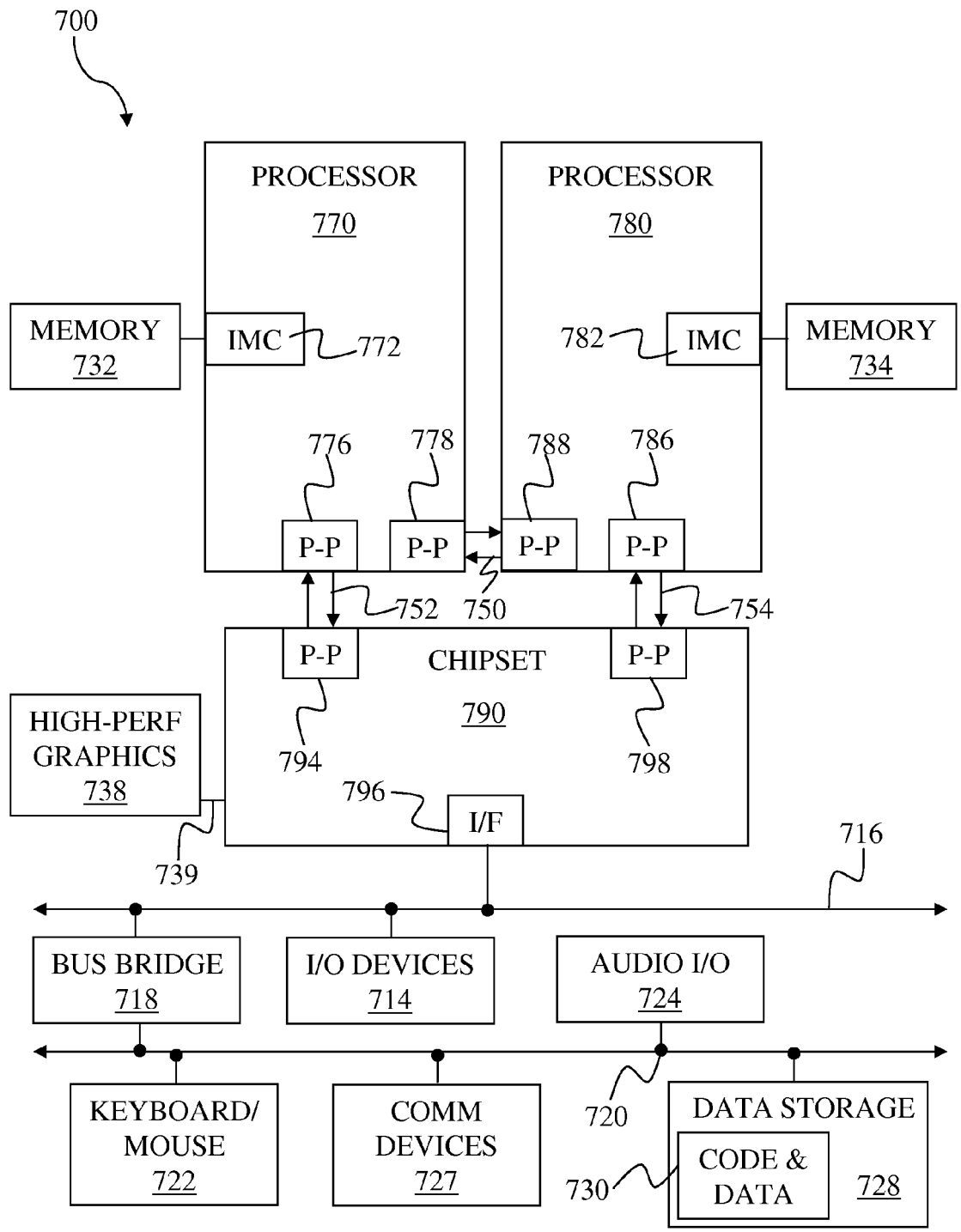
FIG. 7 is a block diagram of another embodiment of a computer system to execute instructions that provide SIMD address conflict resolution with vector population count functionality.
Figure 8:
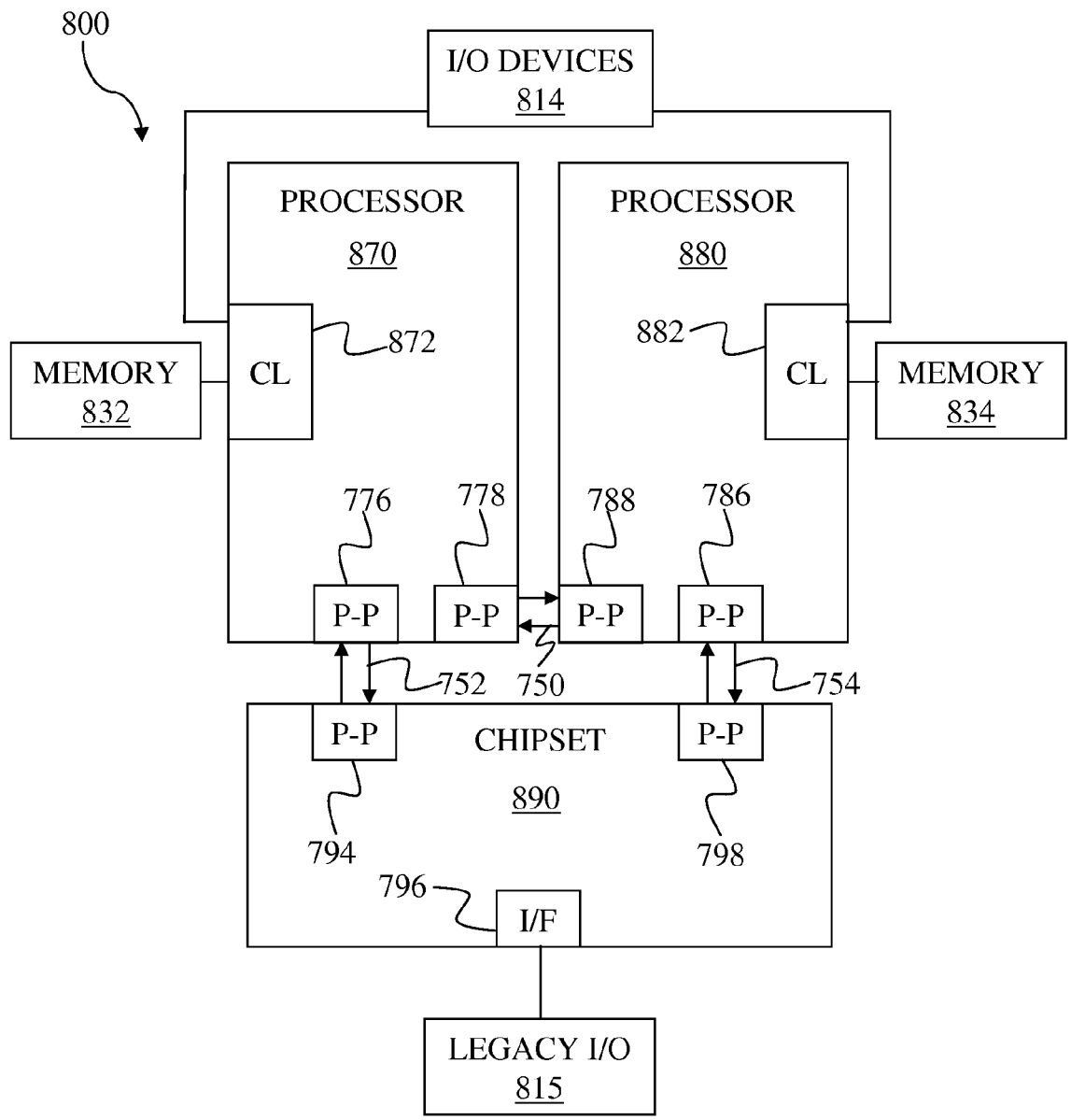
FIG. 8 is a block diagram of another embodiment of a computer system to execute instructions that provide SIMD address conflict resolution with vector population count functionality.
Figure 9:
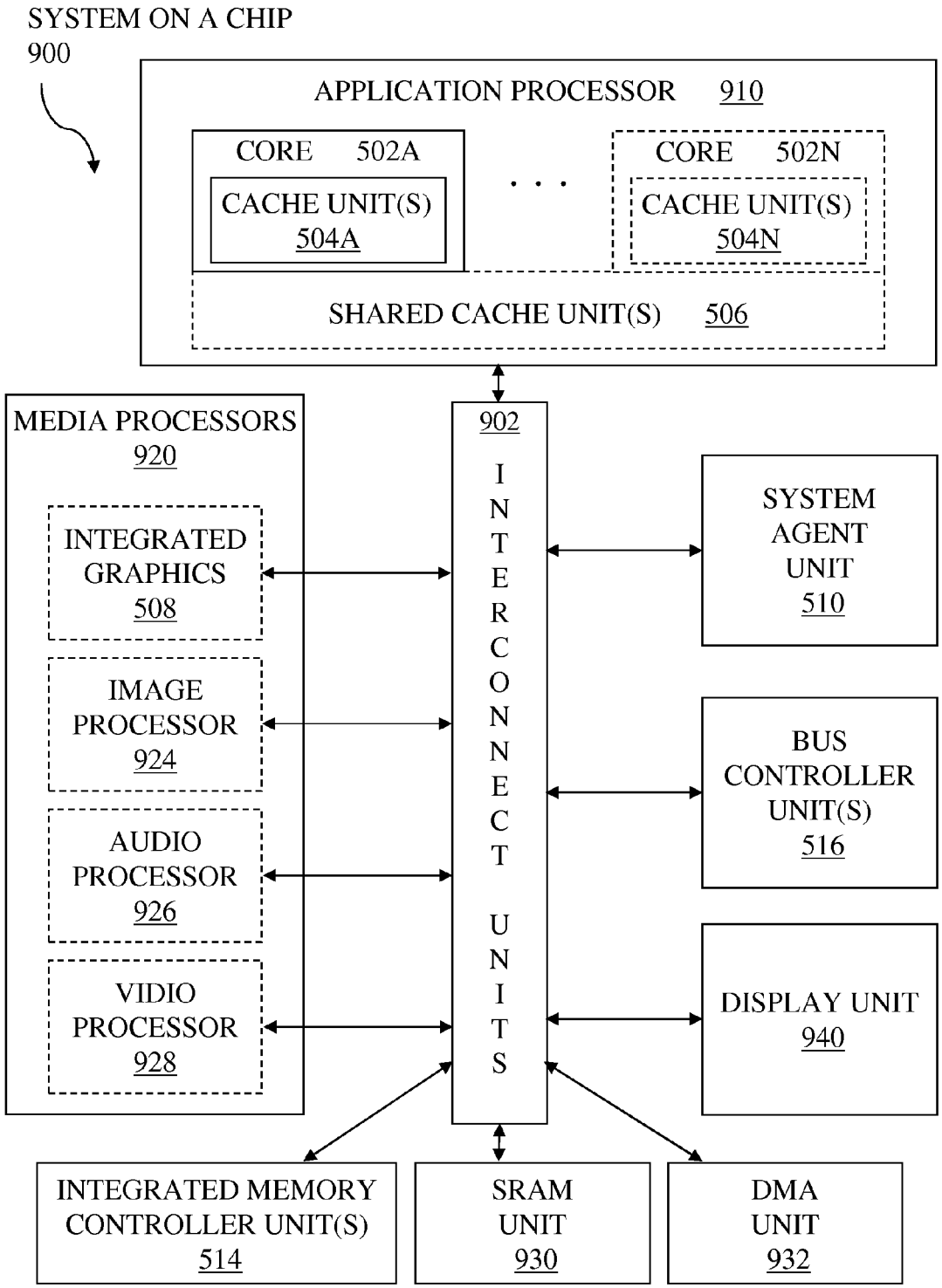
FIG. 9 is a block diagram of one embodiment of a system-on-a-chip to execute instructions that provide SIMD address conflict resolution with vector population count functionality.

FIGS. 6-8 are exemplary systems suitable for including the processor 500, while FIG. 9 is an exemplary system on a chip (SoC) that may include one or more of the cores 502. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Referring now to FIG. 6, shown is a block diagram of a system 600 in accordance with one embodiment of the present invention. The system 600 may include one or more processors 610, 615, which are coupled to graphics memory controller hub (GMCH) 620. The optional nature of additional processors 615 is denoted in FIG. 6 with broken lines.

Each processor 610,615 may be some version of the processor 500. However, it should be noted that it is unlikely that integrated graphics logic and integrated memory control units would exist in the processors 610,615. FIG. 6 illustrates that the GMCH 620 may be coupled to a memory 640 that may be, for example, a dynamic random access memory (DRAM). The DRAM may, for at least one embodiment, be associated with a non-volatile cache.

The GMCH 620 may be a chipset, or a portion of a chipset. The GMCH 620 may communicate with the processor(s) 610, 615 and control interaction between the processor(s) 610, 615 and memory 640. The GMCH 620 may also act as an accelerated bus interface between the processor(s) 610, 615 and other elements of the system 600. For at least one embodiment, the GMCH 620 communicates with the processor(s) 610, 615 via a multi-drop bus, such as a frontside bus (FSB) 695.

Furthermore, GMCH 620 is coupled to a display 645 (such as a flat panel display). GMCH 620 may include an integrated graphics accelerator. GMCH 620 is further coupled to an input/output (I/O) controller hub (ICH) 650, which may be used to couple various peripheral devices to system 600. Shown for example in the embodiment of FIG. 6 is an external graphics device 660, which may be a discrete graphics device coupled to ICH 650, along with another peripheral device 670.

Alternatively, additional or different processors may also be present in the system 600. For example, additional processor(s) 615 may include additional processors(s) that are the same as processor 610, additional processor(s) that are heterogeneous or asymmetric to processor 610, accelerators (such as, e.g., graphics accelerators or digital signal processing (DSP) units), field programmable gate arrays, or any other processor. There can be a variety of differences between the physical resources 610, 615 in terms of a spectrum of metrics of merit including architectural, micro-architectural, thermal, power consumption characteristics, and the like. These differences may effectively manifest themselves as asymmetry and heterogeneity amongst the processors 610, 615. For at least one embodiment, the various processors 610, 615 may reside in the same die package.

Referring now to FIG. 7, shown is a block diagram of a second system 700 in accordance with an embodiment of the present invention. As shown in FIG. 7, multiprocessor system 700 is a point-to-point interconnect system, and includes a first processor 770 and a second processor 780 coupled via a point-to-point interconnect 750. Each of processors 770 and 780 may be some version of the processor 500 as one or more of the processors 610,615.

While shown with only two processors 770, 780, it is to be understood that the scope of the present invention is not so limited. In other embodiments, one or more additional processors may be present in a given processor.

Processors 770 and 780 are shown including integrated memory controller units 772 and 782, respectively. Processor 770 also includes as part of its bus controller units point-to-point (P-P) interfaces 776 and 778; similarly, second processor 780 includes P-P interfaces 786 and 788. Processors 770, 780 may exchange information via a point-to-point (P-P) interface 750 using P-P interface circuits 778, 788. As shown in FIG. 7, IMCs 772 and 782 couple the processors to respective memories, namely a memory 732 and a memory 734, which may be portions of main memory locally attached to the respective processors.

Processors 770, 780 may each exchange information with a chipset 790 via individual P-P interfaces 752, 754 using point to point interface circuits 776, 794, 786, 798. Chipset 790 may also exchange information with a high-performance graphics circuit 738 via a high-performance graphics interface 739.

A shared cache (not shown) may be included in either processor or outside of both processors, yet connected with the processors via P-P interconnect, such that either or both processors' local cache information may be stored in the shared cache if a processor is placed into a low power mode.

Chipset 790 may be coupled to a first bus 716 via an interface 796. In one embodiment, first bus 716 may be a Peripheral Component Interconnect (PCI) bus, or a bus such as a PCI Express bus or another third generation I/O interconnect bus, although the scope of the present invention is not so limited.

As shown in FIG. 7, various I/O devices 714 may be coupled to first bus 716, along with a bus bridge 718 which couples first bus 716 to a second bus 720. In one embodiment, second bus 720 may be a low pin count (LPC) bus. Various devices may be coupled to second bus 720 including, for example, a keyboard and/or mouse 722, communication devices 727 and a storage unit 728 such as a disk drive or other mass storage device which may include instructions/code and data 730, in one embodiment. Further, an audio I/O 724 may be coupled to second bus 720. Note that other architectures are possible. For example, instead of the point-to-point architecture of FIG. 7, a system may implement a multi-drop bus or other such architecture.

Referring now to FIG. 8, shown is a block diagram of a third system 800 in accordance with an embodiment of the present invention Like elements in FIG. 7 and FIG. 8 bear like reference numerals, and certain aspects of FIG. 7 have been omitted from FIG. 8 in order to avoid obscuring other aspects of FIG. 8.

FIG. 8 illustrates that the processors 870, 880 may include integrated memory and I/O control logic ("CL") 872 and 882, respectively. For at least one embodiment, the CL 872, 882 may include integrated memory controller units such as that described above in connection with FIGS. 5 and 7. In addition. CL 872, 882 may also include I/O control logic. FIG. 8 illustrates that not only are the memories 832, 834 coupled to the CL 872, 882, but also that I/O devices 814 are also coupled to the control logic 872, 882. Legacy I/O devices 815 are coupled to the chipset 890.

Referring now to FIG. 9, shown is a block diagram of a SoC 900 in accordance with an embodiment of the present invention. Similar elements in FIG. 5 bear like reference numerals. Also, dashed lined boxes are optional features on more advanced SoCs. In FIG. 9, an interconnect unit(s) 902 is coupled to: an application processor 910 which includes a set of one or more cores 502A-N and shared cache unit(s) 506; a system agent unit 510; a bus controller unit(s) 516; an integrated memory controller unit(s) 514; a set of one or more media processors 920 which may include integrated graphics logic 508, an image processor 924 for providing still and/or video camera functionality, an audio processor 926 for providing hardware audio acceleration, and a video processor 928 for providing video encode/decode acceleration; an static random access memory (SRAM) unit 930; a direct memory access (DMA) unit 932; and a display unit 940 for coupling to one or more external displays.

Figure 10:
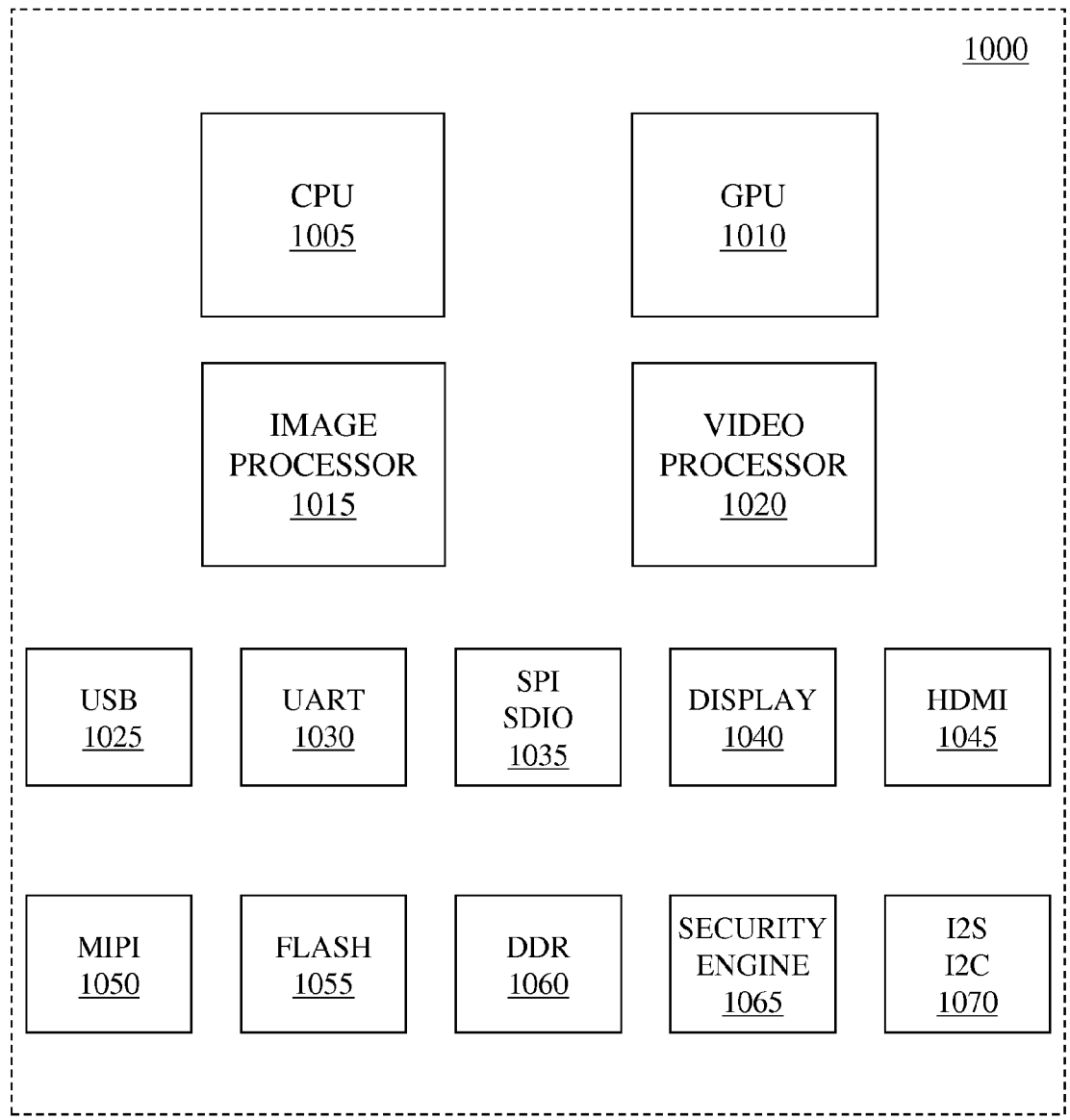
FIG. 10 is a block diagram of an embodiment of a processor to execute instructions that provide SIMD address conflict resolution with vector population count functionality.

FIG. 10 illustrates a processor containing a central processing unit (CPU) and a graphics processing unit (GPU), which may perform at least one instruction according to one embodiment. In one embodiment, an instruction to perform operations according to at least one embodiment could be performed by the CPU. In another embodiment, the instruction could be performed by the GPU. In still another embodiment, the instruction may be performed through a combination of operations performed by the GPU and the CPU. For example, in one embodiment, an instruction in accordance with one embodiment may be received and decoded for execution on the GPU. However, one or more operations within the decoded instruction may be performed by a CPU and the result returned to the GPU for final retirement of the instruction. Conversely, in some embodiments, the CPU may act as the primary processor and the GPU as the co-processor.

In some embodiments, instructions that benefit from highly parallel, throughput processors may be performed by the GPU, while instructions that benefit from the performance of processors that benefit from deeply pipelined architectures may be performed by the CPU. For example, graphics, scientific applications, financial applications and other parallel workloads may benefit from the performance of the GPU and be executed accordingly, whereas more sequential applications, such as operating system kernel or application code may be better suited for the CPU.

In FIG. 10, processor 1000 includes a CPU 1005, GPU 1010, image processor 1015, video processor 1020, USB controller 1025, UART controller 1030, SPI/SDIO controller 1035, display device 1040, High-Definition Multimedia Interface (HDMI) controller 1045, MIPI controller 1050, flash memory controller 1055, dual data rate (DDR) controller 1060, security engine 1065, and $I^2S/I^2C$ (Integrated Interchip Sound/Inter-Integrated Circuit) interface 1070. Other logic and circuits may be included in the processor of FIG. 10, including more CPUs or GPUs and other peripheral interface controllers.

One or more aspects of at least one embodiment may be implemented by representative data stored on a machine-readable medium which represents various logic within the processor, which when read by a machine causes the machine to fabricate logic to perform the techniques described herein. Such representations, known as "IP cores" may be stored on a tangible, machine readable medium ("tape") and supplied to various customers or manufacturing facilities to load into the fabrication machines that actually make the logic or processor. For example, IP cores, such as the Cortex™ family of processors developed by ARM Holdings, Ltd. and Loongson IP cores developed the Institute of Computing Technology (ICT) of the Chinese Academy of Sciences may be licensed or sold to various customers or licensees, such as Texas Instruments, Qualcomm, Apple, or Samsung and implemented in processors produced by these customers or licensees.

Figure 11:
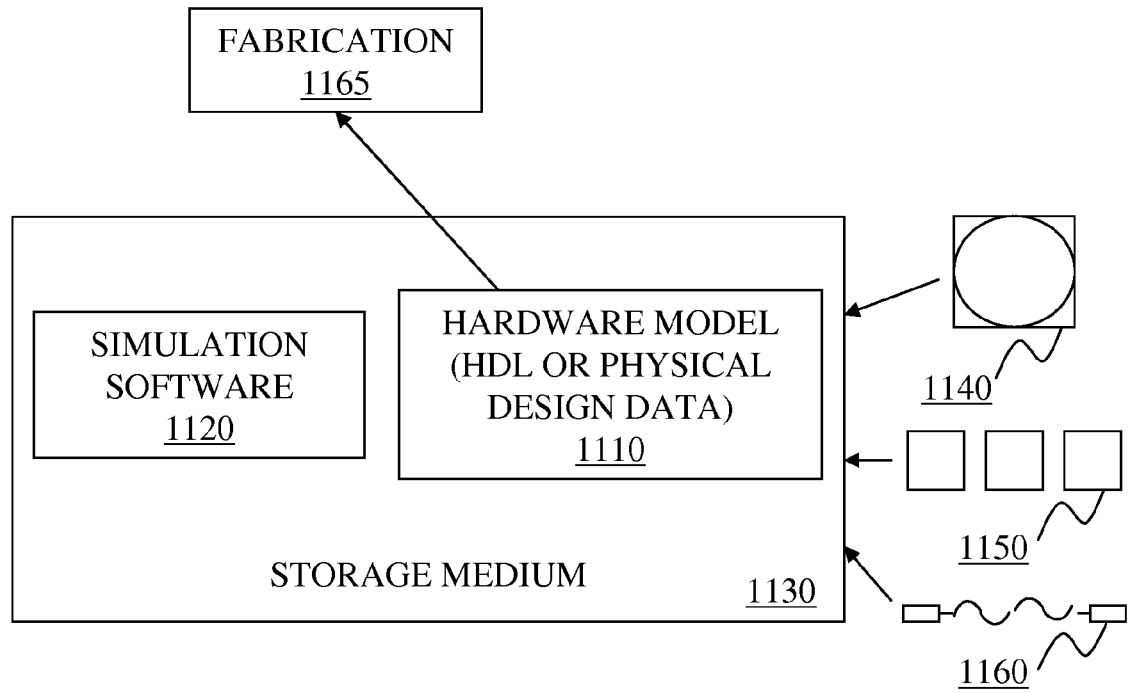
FIG. 11 is a block diagram of one embodiment of an IP core development system that provides SIMD address conflict resolution with vector population count functionality.

FIG. 11 shows a block diagram illustrating the development of IP cores according to one embodiment. Storage 1130 includes simulation software 1120 and/or hardware or software model 1110. In one embodiment, the data representing the IP core design can be provided to the storage 1130 via memory 1140 (e.g., hard disk), wired connection (e.g., internet) 1150 or wireless connection 1160. The IP core information generated by the simulation tool and model can then be transmitted to a fabrication facility where it can be fabricated by a third party to perform at least one instruction in accordance with at least one embodiment.

In some embodiments, one or more instructions may correspond to a first type or architecture (e.g., x86) and be translated or emulated on a processor of a different type or architecture (e.g., ARM). An instruction, according to one embodiment, may therefore be performed on any processor or processor type, including ARM, x86, MIPS, a GPU, or other processor type or architecture.

Figure 12:
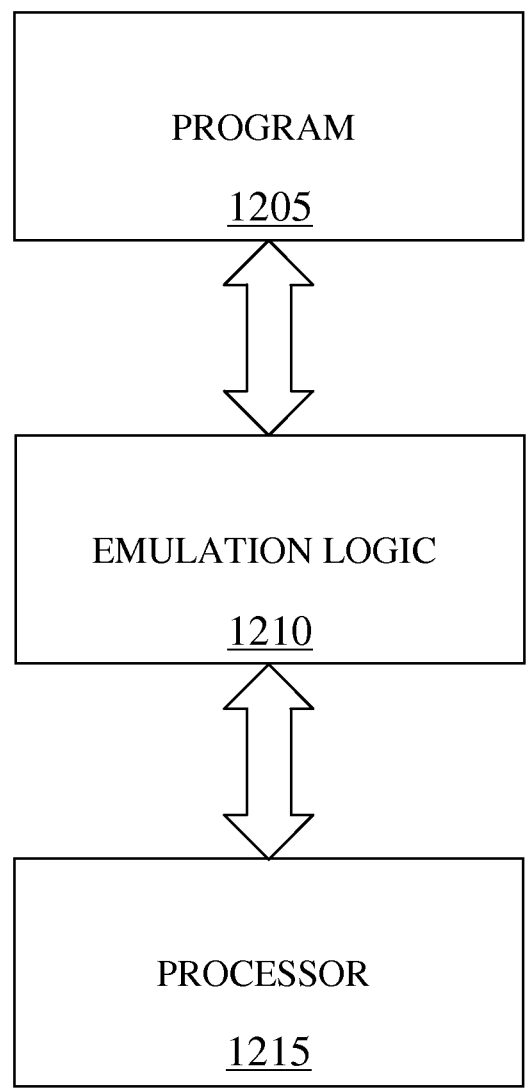
FIG. 12 illustrates one embodiment of an architecture emulation system that provides SIMD address conflict resolution with vector population count functionality.

FIG. 12 illustrates how an instruction of a first type is emulated by a processor of a different type, according to one embodiment. In FIG. 12, program 1205 contains some instructions that may perform the same or substantially the same function as an instruction according to one embodiment. However the instructions of program 1205 may be of a type and/or format that is different or incompatible with processor 1215, meaning the instructions of the type in program 1205 may not be able to be executed natively by the processor 1215. However, with the help of emulation logic, 1210, the instructions of program 1205 are translated into instructions that are natively capable of being executed by the processor 1215. In one embodiment, the emulation logic is embodied in hardware. In another embodiment, the emulation logic is embodied in a tangible, machine-readable medium containing software to translate instructions of the type in the program 1205 into the type natively executable by the processor 1215. In other embodiments, emulation logic is a combination of fixed-function or programmable hardware and a program stored on a tangible, machine-readable medium. In one embodiment, the processor contains the emulation logic, whereas in other embodiments, the emulation logic exists outside of the processor and is provided by a third party. In one embodiment, the processor is capable of loading the emulation logic embodied in a tangible, machine-readable medium containing software by executing microcode or firmware contained in or associated with the processor.

Figure 13:
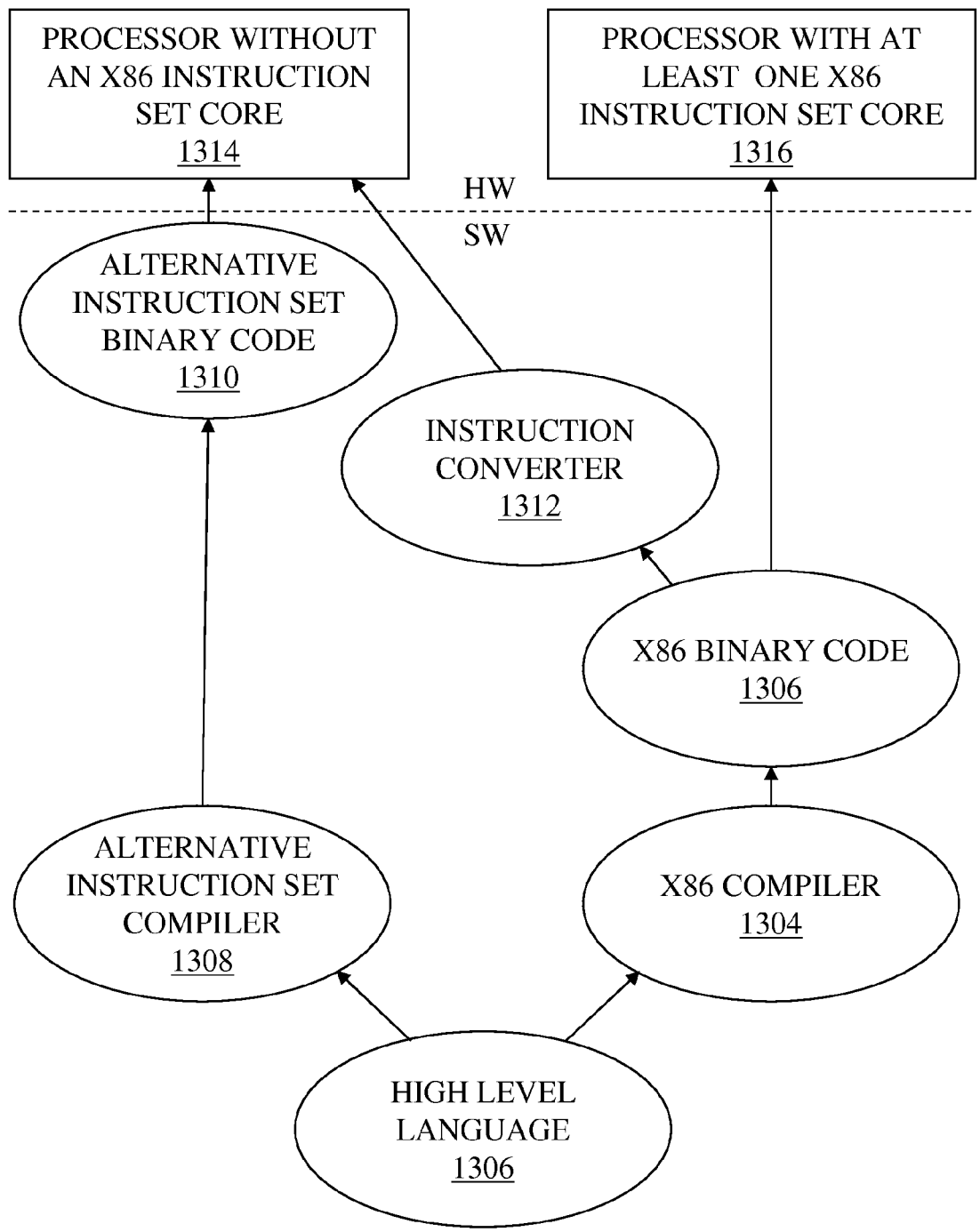
FIG. 13 illustrates one embodiment of a system to translate instructions that provide SIMD address conflict resolution with vector population count functionality.

FIG. 13 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 13 shows a program in a high level language 1302 may be compiled using an x86 compiler 1304 to generate x86 binary code 1306 that may be natively executed by a processor with at least one x86 instruction set core 1316. The processor with at least one x86 instruction set core 1316 represents any processor that can perform substantially the same functions as a Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1304 represents a compiler that is operable to generate x86 binary code 1306 (e.g., object code) that can, with or without additional linkage processing, be executed on the processor with at least one x86 instruction set core 1316. Similarly, FIG. 13 shows the program in the high level language 1302 may be compiled using an alternative instruction set compiler 1308 to generate alternative instruction set binary code 1310 that may be natively executed by a processor without at least one x86 instruction set core 1314 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1312 is used to convert the x86 binary code 1306 into code that may be natively executed by the processor without an x86 instruction set core 1314. This converted code is not likely to be the same as the alternative instruction set binary code 1310 because an instruction converter capable of this is difficult to make; however, the converted code will accomplish the general operation and be made up of instructions from the alternative instruction set. Thus, the instruction converter 1312 represents software, firmware, hardware, or a combination thereof that, through emulation, simulation or any other process, allows a processor or other electronic device that does not have an x86 instruction set processor or core to execute the x86 binary code 1306.

Figure 14A:
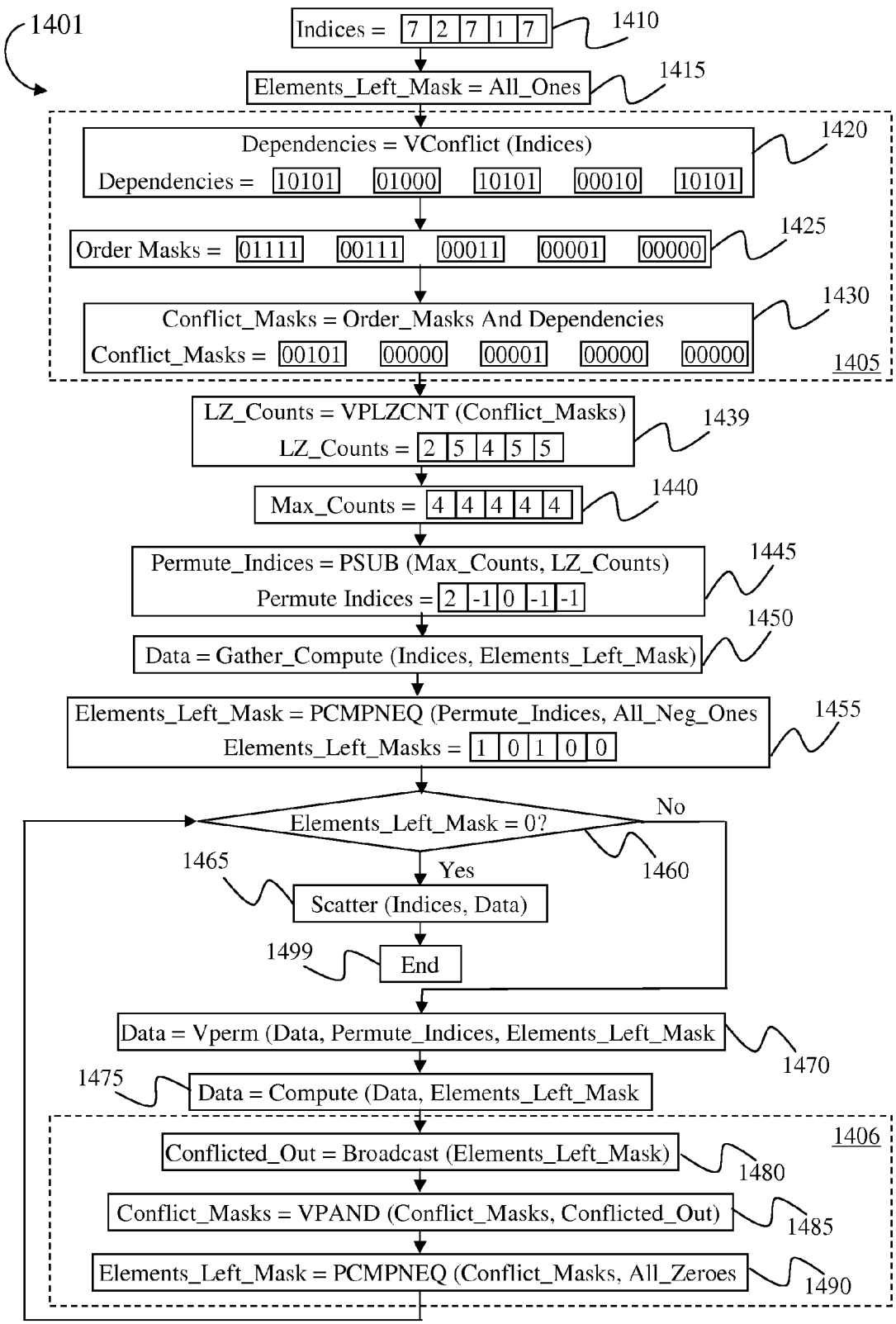
FIG. 14A illustrates a flow diagram for one embodiment of an example of using an instruction to provide SIMD vector leading zero count functionality useful for generating permute controls for efficient vector address conflict resolution.

FIG. 14A illustrates a flow diagram for one embodiment of an example process for using an instruction to provide SIMD vector leading zero count functionality useful for generating permute controls for efficient vector address conflict resolution. Process 1401 and other processes herein disclosed are performed by processing blocks that may comprise dedicated hardware or software or firmware operation codes executable by general purpose machines or by special purpose machines or by a combination of both.

In processing block 1410 of process 1401 the set of indices is initialized, e.g. to the values 7, 2, 7, 1 and 7. It will be appreciated that the number of offset indices and the values of the offset indices is intended to be illustrative and not restrictive of embodiments of the invention. In particular, the number of offset indices in a register may be determined by the particular application and/or the size of data elements corresponding to the indices. The example values of offset indices are simply intended to illustrate resolution of dependency conflicts. In processing block 1415 the elements left mask is set to all (e.g. five) ones. In processing block 1420 the dependencies masks are set according to a prior techniques of process 1405 to reflect all matching offset indices. Then in processing block 1425 a set of order masks is initialized. In processing block 1430 the conflict masks are computed by performing a bitwise AND between the dependencies masks and the order masks. While the prior technique of process 1405 is illustrated, in contrast, it will be appreciated that an improvement on process 1405 for generating the conflict masks in processing block 1430, but directly as the result of one SIMD vector conflict detection instruction, will be described in more detail below starting with FIG. 14B.

Proceeding next to processing block 1439, the leading zero counts are computed using a vector packed leading zero count instruction, VPLZCNT, on the conflict masks by counting the number of most significant contiguous bits that are set to zero for each data field of the conflict masks and storing each count as a value in a corresponding data field of the leading zero counts. In processing block 1440 the maximum counts are initialized to all fours, which is a value one less than the number of bits used to represent a conflict mask in the example illustrated. In processing block 1445 a set of permute indices is computed by performing a SIMD packed subtraction, PSUB, subtracting the value of each leading zero count from a corresponding maximum count value, one less than the number of bits used to represent a conflict mask, to generate a corresponding difference of the maximum counts minus the leading zero counts. It will be appreciated that those locations corresponding to offset indices that are not dependent on a prior computation have permute indices of negative one, which may also be used advantageously.

In processing block 1450 data is gathered from memory and modified values are computed according to the offset indices and an elements left mask which is (optionally) all ones. Next in processing block 1455 the elements left mask is recomputed using a packed compare not equal instruction, PCMPNEQ, comparing the permute indices advantageously with all negative ones. In processing block 1460 a determination is made whether the elements left mask is zero (0). If so in processing block 1465 the data is scattered to memory using the offset indices, and the processing of this set of SIMD data ends in processing block 1499.

Otherwise in processing block 1470 the data is permuted by performing a SIMD vector packed permutation, VPERM, employing the permute indices and the elements left mask as a completion mask to advantageously update only the elements left to process. In processing block 1475 the required computations are performed on the data elements left to process using the elements left mask as a completion mask. Then in a prior technique process 1406 a set of conflicted out elements is initialized by broadcasting the elements left mask to all elements in processing block 1480. Then the set of conflict masks is recomputed using a vector packed AND instruction on the previous conflict masks and the new conflicted out elements. The new elements left mask is then computed using a packed compare not equal instruction, PCMPNEQ, comparing each conflict mask with all zeroes. Processing then reiterates beginning in processing block 1460 with the testing of a new elements left mask. While the prior technique of process 1406 is illustrated, in contrast, it will be appreciated that an improvement on process 1406 for generating the elements left mask of processing block 1490 by using instead, an iteration count, the result of a SIMD vector population count instruction, will also be described below starting with FIG. 14C.

It will be appreciated that SIMD vector leading zero count instructions, as in the embodiments described herein, may be used advantageously with variable sized elements and conflict masks to provide SIMD permute controls, thereby permitting more efficient SIMD address conflict resolution in registers without performing dependent computations through memory.

Figure 14B:
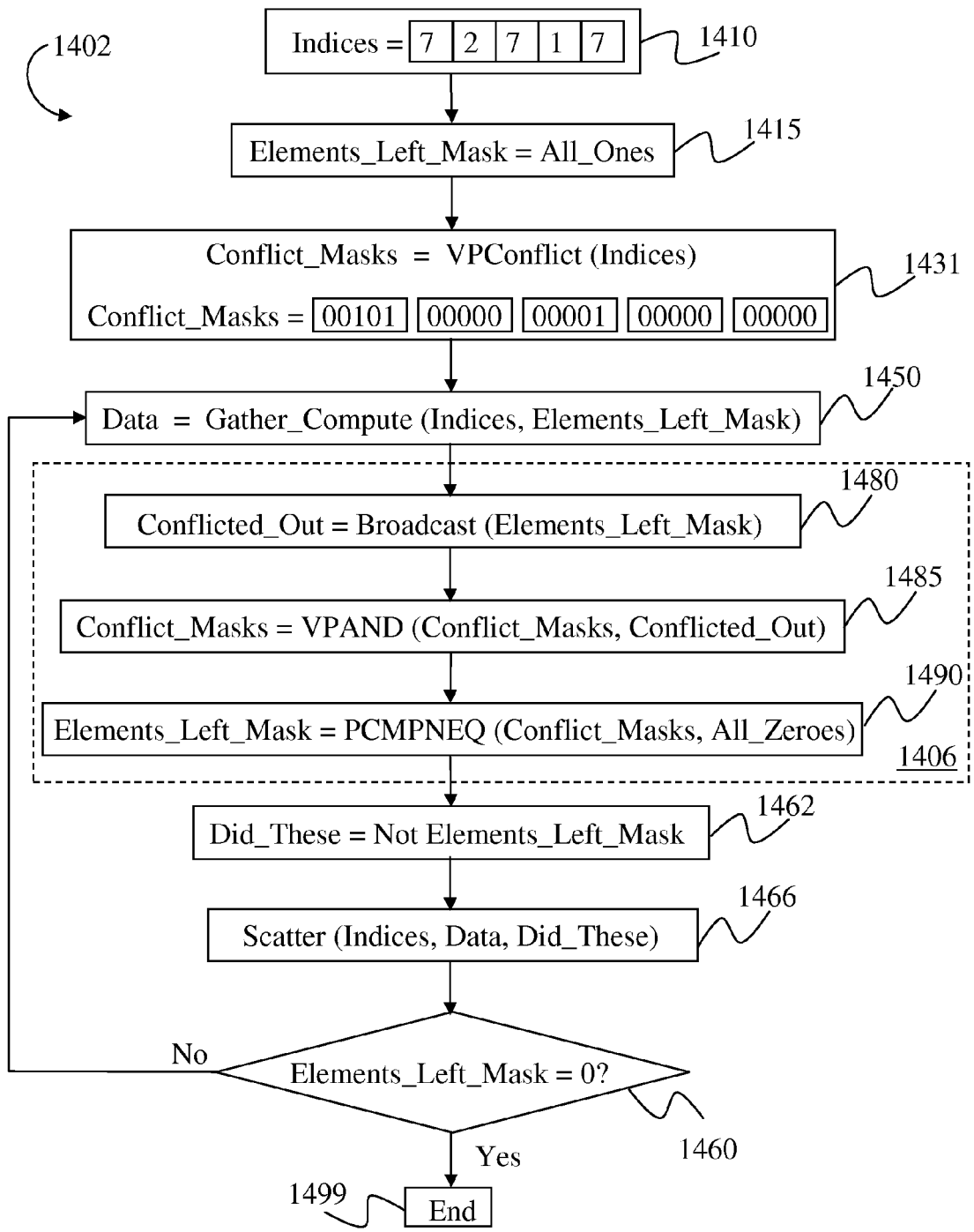
FIG. 14B illustrates a flow diagram for one embodiment of an example of using an instruction to provide SIMD vector address conflict detection functionality.

FIG. 14B illustrates a flow diagram for one embodiment of an example of using an instruction to provide SIMD vector address conflict detection functionality. In processing block 1410 of process 1402 the set of offset indices is initialized, e.g. to the values 7, 2, 7, 1 and 7. It will again be appreciated that the number of offset indices and the values of the offset indices is intended to be illustrative and not restrictive of embodiments of the invention. In particular, the number of offset indices in a register may be determined by the particular application and/or the size of data elements corresponding to the indices. The example values of offset indices are simply intended to illustrate resolution of dependency conflicts. In processing block 1415 the elements left mask is set to all (e.g. five) ones.

In processing block 1431 the conflict masks are computed using a SIMD vector packed conflict instruction, VPCONFLICT, comparing an offset in each element of the set of offset indices with an offset in every less significant element to determine if they hold matching offset. It will be appreciated that processing block 1431 represents a notable improvement on the prior technique of process 1405.

In processing block 1450 data is gathered from memory and modified values are computed according to the offset indices and an elements left mask which is (optionally) all ones. Next in the prior technique process 1406 a set of conflicted out elements is initialized by broadcasting the elements left mask to all elements in processing block 1480. Then in processing block 1485 the set of conflict masks is recomputed using a vector packed AND instruction on the previous conflict masks and the new conflicted out elements. Then the new elements left mask is computed in processing block 1490 using a packed compare not equal instruction, PCMPNEQ, comparing each conflict mask with all zeroes. In processing block 1462 the elements left mask are negated to form a did these mask, and the data elements are scattered in processing block 1466 to memory according to the offset indices. In processing block 1460 a determination is made whether the elements left mask is zero (0). If so in processing of this set of SIMD data ends in processing block 1499. Otherwise processing reiterates beginning in processing block 1450 of process 1402.

It will be appreciated that SIMD vector address conflict detection instructions, as in the embodiments described herein, may be used for variable sized elements and memory offsets to provide SIMD vector address conflict detection functionality and to generate conflict masks for efficient SIMD address conflict resolution. It will also be appreciated that SIMD vector address conflict detection instructions may be used in combination with SIMD vector leading zero count instructions, as in the embodiments described herein, to provide SIMD permute controls, for more efficient SIMD address conflict resolution especially in certain gather-modify-scatter applications permitting address conflict resolution in registers without performing dependent computations through memory.

Figure 14C:
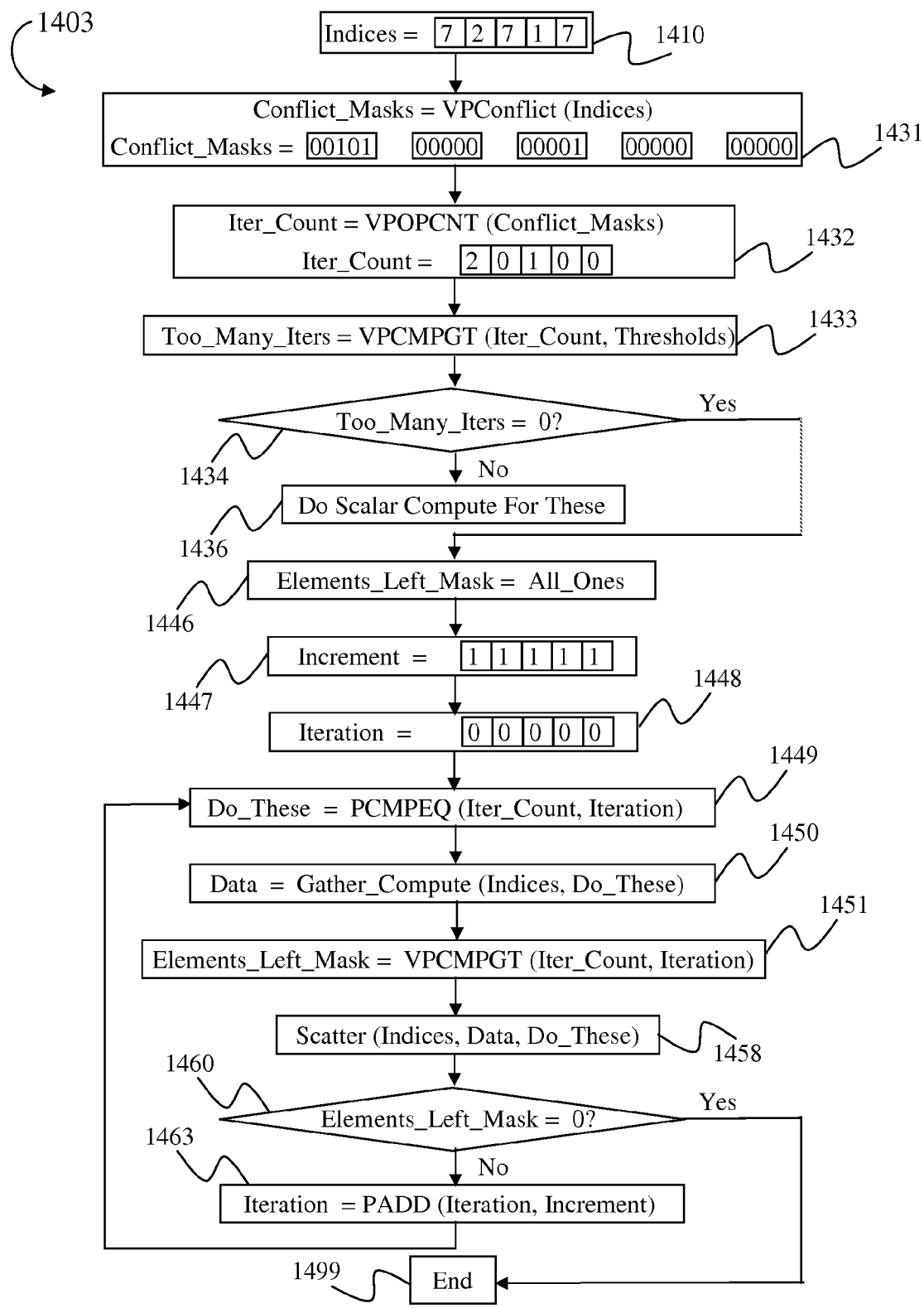
FIG. 14C illustrates a flow diagram for one embodiment of an example of using an instruction to provide SIMD vector address conflict resolution with vector population count functionality.

FIG. 14C illustrates a flow diagram for one embodiment of an example of using an instruction to provide SIMD vector address conflict resolution with vector population count functionality. In processing block 1410 of process 1403 the set of offset indices is once again initialized, e.g. to the values 7, 2, 7, 1 and 7. In processing block 1431 the conflict masks are computed using a SIMD vector packed conflict instruction, VPCONFLICT, comparing an offset in each element of the set of offset indices with an offset in every less significant element to determine if they hold matching offset.

In processing block 1432, the iteration counts are computed using a SIMD vector population count instruction, VPOPCNT, counting a number of bits set to one for each data field of the conflict masks and storing each count as a value in a corresponding data field of the iteration counts. Then a mask is computed in processing block 1433 using a vector packed compare greater than instruction, VPCMPGT, comparing each iteration count with a corresponding threshold value to test if any of the dependencies would require too many iterations. In processing block 1434, it is determined if all of the tests comparing iteration counts to the thresholds were negative, resulting in zeroes. If not then in processing block 1436 a scalar processing version of the computations is performed for these elements because there are too many serial dependencies.

Otherwise, a zero test result indicates that the dependencies may be resolve in a SIMD fashion without too many iterations, and so processing proceeds to processing block 1446 where the elements left mask is initialized to all ones. The elements of an increment vector are initialized, all to values of one in processing block 1447, and an iteration vector is initialized to zeroes in processing block 1448.

In processing block 1449 a mask, do_these, of which elements are ready to process is computed using a packed compare for equality instruction, PCMPEQ, comparing each iteration count with the current iteration vector. In processing block 1450 data is gathered from memory and modified values are computed according to the offset indices and the completion mask, do_these, of which elements to process. Then an elements left mask is computed in processing block 1451 using a vector packed compare greater than instruction, VPCMPGT, comparing each iteration count with the current iteration vector. It will be appreciated that processing block 1451 represents an improvement on the prior technique of process 1406. In processing block 1458 the processed data elements are scattered back to memory according to the offset indices and the completion mask, do_these, and the processing proceeds to processing block 1460 where a determination is made if the elements left mask is zero, indicating that no elements are left to process. If so processing of this set of SIMD data ends in processing block 1499. Otherwise processing proceeds to processing block 1463 where the iteration vector is incremented by a packed addition, PADD, of the increment vector to the current iteration vector. Then processing reiterates beginning in processing block 1449 of process 1403. It will be appreciated that SIMD vector population count instructions, as in the embodiments described herein, may be used with variable sized elements and conflict masks to efficiently compute iteration counts and to provide SIMD completion masks for iterations of a SIMD address conflict resolution.

Figure 14D:
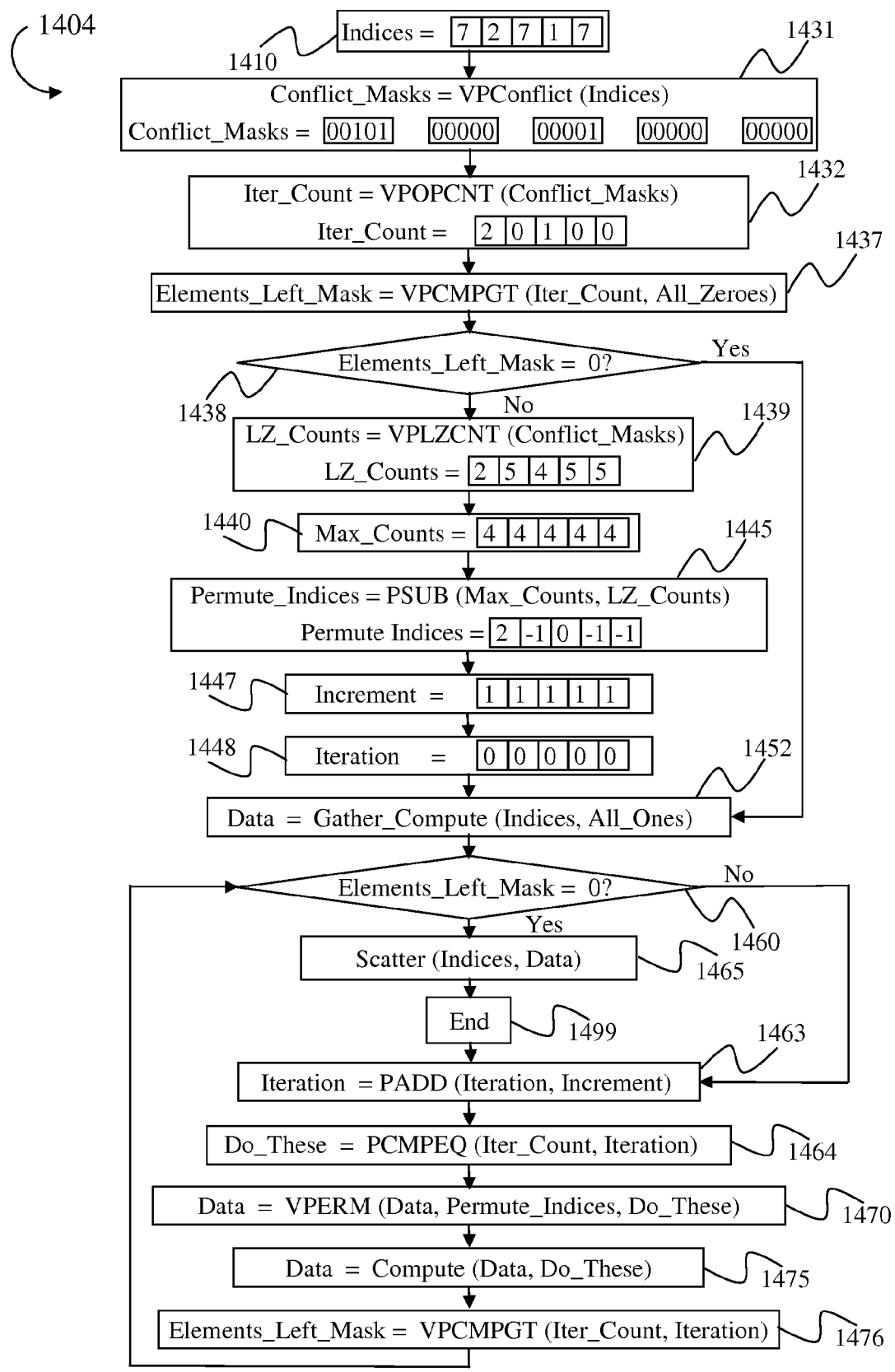
FIG. 14D illustrates a flow diagram for an alternative embodiment of an example of using combined instructions to provide efficient SIMD vector address conflict resolution.

FIG. 14D illustrates a flow diagram for an alternative embodiment of an example of using the combined instructions, for SIMD vector packed conflict detection, SIMD vector packed population counts, and SIMD vector packed leading zero counts to provide efficient SIMD vector address conflict resolution. In processing block 1410 of process 1404 the set of offset indices is once again initialized, e.g. to the values 7, 2, 7, 1 and 7. In processing block 1431 the conflict masks are computed using the SIMD vector packed conflict instruction, VPCONFLICT, comparing an offset in each element of the set of offset indices with an offset in every less significant element to determine if they hold matching offset. In processing block 1432, the iteration counts are computed using the SIMD vector population count instruction, VPOPCNT, counting a number of bits set to one for each data field of the conflict masks and storing each count as a value in a corresponding data field of the iteration counts. Then an elements left mask is computed in processing block 1437 using a vector packed compare greater than instruction, VPCMPGT, comparing each iteration count with a vector of all zeroes. In processing block 1438 a determination is made whether or not the elements left mask is zero, indicating that there are no dependencies to resolve, in which case processing proceeds directly to processing blocks 1452, 1460, 1465 and 1499, where the data elements may be processed without any dependency resolution.

Otherwise, if the elements left mask is not zero in processing block 1438, then processing proceeds to processing block 1439 where the leading zero counts are computed using a vector packed leading zero count instruction, VPLZCNT, on the conflict masks by counting the number of most significant contiguous bits that are set to zero for each data field of the conflict masks and storing each count as a value in a corresponding data field of the leading zero counts. In processing block 1440 the maximum counts are initialized to all fours, which in this example, is a value of one less than the number of bits used to represent a conflict mask. In processing block 1445 a set of permute indices is computed by performing a SIMD packed subtraction, PSUB, subtracting the value of each leading zero count from a corresponding maximum count value, one less than the number of bits used to represent a conflict mask, to generate a corresponding difference of the maximum counts minus the leading zero counts. One will be reminded that those locations corresponding to offset indices that are not dependent on a prior computation have permute indices of negative one, which may be used advantageously.

The elements of an increment vector are initialized, all to values of one in processing block 1447, and an iteration vector is initialized to zeroes in processing block 1448. In processing block 1452 data is gathered from memory and modified values are computed according to the offset indices and the optional completion mask of all ones. It will be appreciated that any incorrectly modified data values will be subsequently resolved In processing block 1460 a determination is made if the elements left mask is zero, indicating that no elements are left to process. If so in processing block 1465 the processed data elements are scattered back to memory according to the offset indices and the processing proceeds to processing block 1499 where processing of this set of SIMD data ends. It will be appreciated that the scatter operation will store the latest updated value to any one memory location thereby correctly resolving any conflict dependencies.

Otherwise if the elements left mask is not zero in processing block 1460, then processing proceeds to processing block 1463 where the iteration vector is incremented by a packed addition, PADD, of the increment vector to the current iteration vector. In processing block 1464 a mask, do_these, of which elements are ready to process is computed using a packed compare for equality instruction, PCMPEQ, comparing each iteration count with the newly computed iteration vector. In processing block 1470 the data is permuted by performing a SIMD vector packed permutation, VPERM, employing the permute indices and the do_these mask as a completion mask to advantageously update only the elements to process in this iteration. In processing block 1475 the required computations are performed on the data elements to process in this iteration using the do_these mask as a completion mask. An elements left mask is computed in processing block 1476 using a vector packed compare greater than instruction, VPCMPGT, comparing each iteration count with the current iteration vector. Then processing reiterates beginning in processing block 1460 of process 1404. It will be appreciated that the combination of instructions and logic disclosed herein, for SIMD vector packed conflict detection, SIMD vector packed population counts, and SIMD vector packed leading zero counts, provide for more efficient SIMD address conflict resolution especially in certain gather-modify-scatter applications.

Figure 15A:
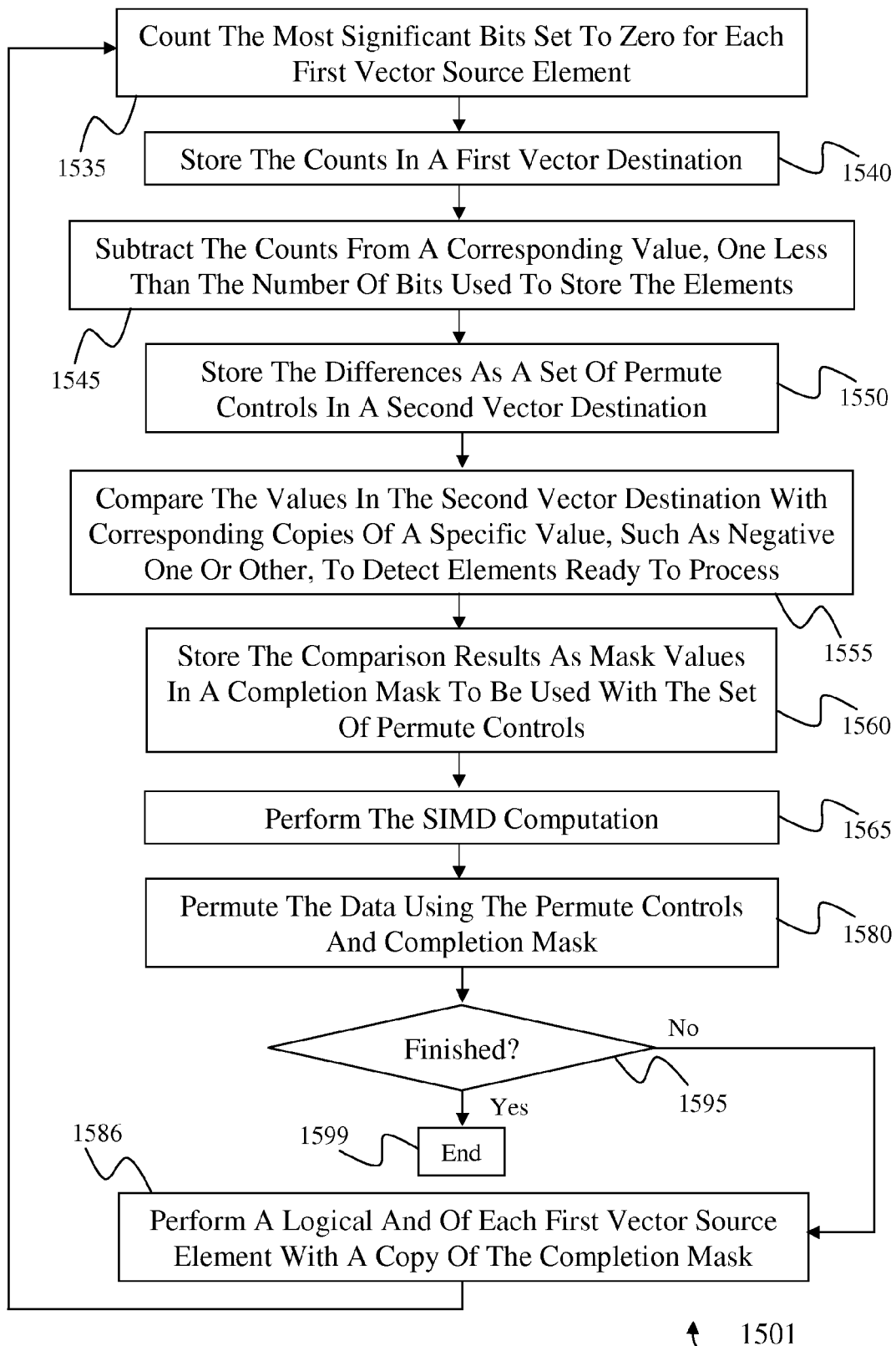
FIG. 15A illustrates a flow diagram for one embodiment of a process to provide SIMD permute controls with vector leading zero count functionality.

FIG. 15A illustrates a flow diagram for one embodiment of a process to provide SIMD permute controls for efficient vector address conflict resolution with leading zero count functionality. Process 1501 and other processes herein disclosed are performed by processing blocks that may comprise dedicated hardware or software or firmware operation codes executable by general purpose machines or by special purpose machines or by a combination of both.

In processing block 1535 of process 1501 the number of most significant contiguous bits that are set to zero are counted for each element of a first vector register. In processing block 1540 each count is stored as a value in a corresponding data field of a first vector destination register. In processing block 1545 the value of each of the data fields in the first vector destination register are subtracted from a corresponding value, one less than the number of bits used to store the elements in the first vector register to generate a corresponding difference. In processing block 1550 each of the corresponding differences is stored as a permute control value in a corresponding data field of a second vector destination register. In processing block 1555 the values of each of the data fields in the second vector destination register are compared with a corresponding copy of a specific value (e.g. such as negative one, or some other value) in each of the data fields in a vector register to detect elements ready to process, and in processing block 1560 the comparison results are stored as a corresponding mask value in a vector completion mask indicating next elements ready to process, the vector mask to be used along with the set of permute control values. In processing block 1565, the SIMD computation is performed and in processing block 1580 the SIMD data is permuted using the permute control values and the completion mask to prepare the input data for the next elements to process. In processing block 1595 a determination is made whether or not processing of all the elements is finished, and if so processing of these elements ends in processing block 1599. Otherwise, in processing block 1586 a logical AND of each element of the first vector source is performed with a copy of the completion mask and processing reiterates beginning in processing block 1535. It will be appreciated that while process 1501, as illustrated, does not presume that the processed elements need to be stored to memory, any such storing, or scattering to memory, together with additional subsequent iterations of process 1501 may be performed in accordance with alternative embodiments of the invention.

Figure 15B:
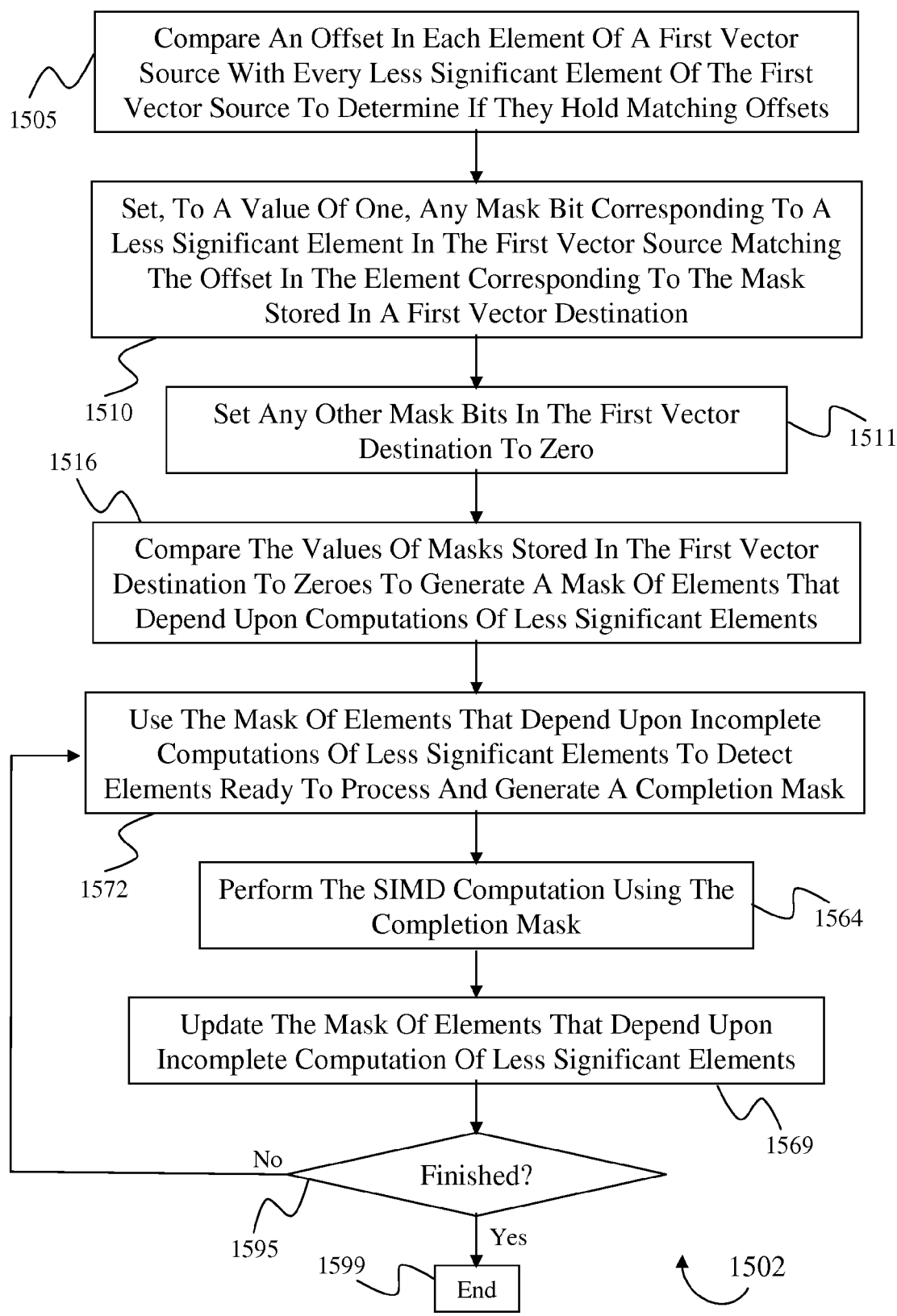
FIG. 15B illustrates a flow diagram for one embodiment of a process to provide SIMD vector address conflict detection functionality.

FIG. 15B illustrates a flow diagram for one embodiment of a process 1502 to provide SIMD vector address conflict detection functionality.

In processing block 1505 an offset in each element of a first register or memory vector source is compared with an offset in every less significant element of the vector source to determine if they hold matching offsets. In processing block 1510 any mask bits corresponding to less significant elements in the first vector source holding offsets matching the offset in the element corresponding to a mask in a first vector destination are set to one. Any other bits in the destination register are set to a second value (e.g. zero) in processing block 1511.

In processing block 1516 the values of each of the masks stored in the first destination register are compared with a corresponding copy of a specific value (e.g. of zero) in another vector, in order to generate a mask of the elements that depend upon computations of less significant elements. In processing block 1572 the mask of elements that depend upon incomplete computations on less significant elements is used to detect elements ready to process and generate a completion mask. In processing block 1564 the SIMD computation is performed on the data using the completion mask. Then in processing block 1569 the mask of elements that depend upon incomplete computations on less significant elements is updated. A determination is made in processing block 1595 whether or not processing of all the elements is finished, and if so processing of these elements ends in processing block 1599. Otherwise, processing reiterates beginning in processing block 1572. It will also be appreciated that while process 1502, as illustrated, does not presume that the processed elements need to be stored to memory, any such storing, or scattering to memory, together with additional subsequent iterations of process 1502 may be performed in accordance with alternative embodiments of the invention.

Figure 15C:
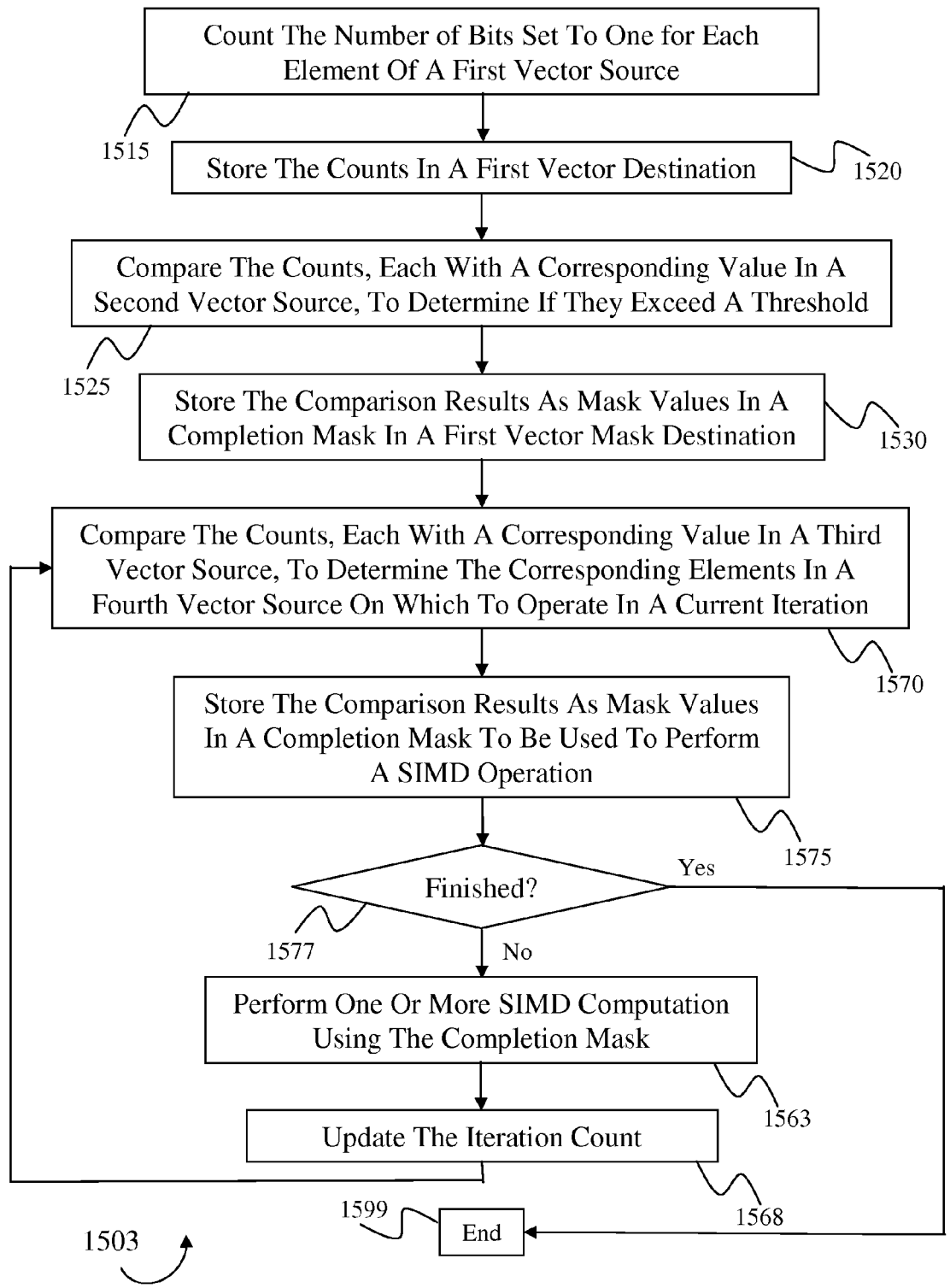
FIG. 15C illustrates a flow diagram for one embodiment of a process to provide SIMD vector address conflict resolution with vector population count functionality.

FIG. 15C illustrates a flow diagram for one embodiment of a process 1503 to provide SIMD vector address conflict resolution with vector population count functionality. In processing block 1515 the number of bits set to one is counted for each element in a first vector source, each element storing the same variable number of bits according to particular population count instruction. In processing block 1520 the counts are stored as a value in a corresponding element in a first vector destination. In processing block 1525 the counts in the first destination register are compared, each with a corresponding value in a second vector source, in order to determine if they exceed a threshold value and to generate corresponding mask values that, in processing block 1530, are stored according to the comparison results in a first vector mask destination. In processing block 1570 the counts in the first destination register are compared, each with a corresponding value in a third vector source, in order to determine the corresponding elements in a fourth vector source on which to operate in a current iteration. The comparison results are stored in processing block 1575 as mask values in a completion mask to be used to perform a SIMD operation. A determination is made in processing block 1577 whether or not processing of all the elements is finished, and if so processing of these elements ends in processing block 1599. Otherwise processing proceeds to processing block 1563 where one or more SIMD operation is performed using the completion mask. Then in processing block 1568 the iteration count is updated and processing reiterates beginning in processing block 1570. It will again be appreciated that while process 1503, as illustrated, does not presume that the processed elements need to be stored to memory, any such storing, or scattering to memory, together with additional subsequent iterations of process 1503 may be performed in accordance with alternative embodiments of the invention.

Figure 15D:
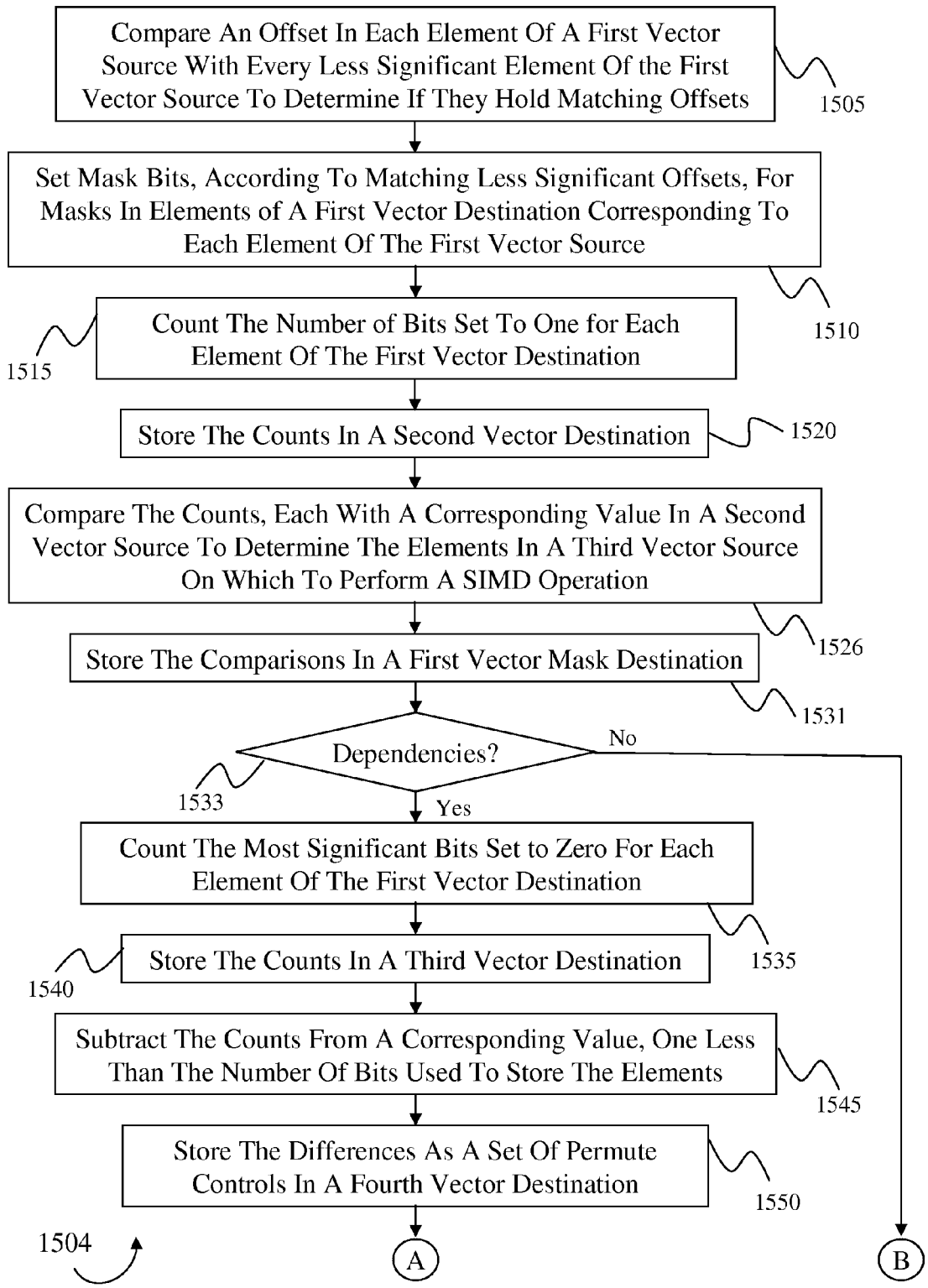
FIG. 15D illustrates a flow diagram for an alternative embodiment of a combined process to provide efficient SIMD vector address conflict resolution.
Figure 15D:
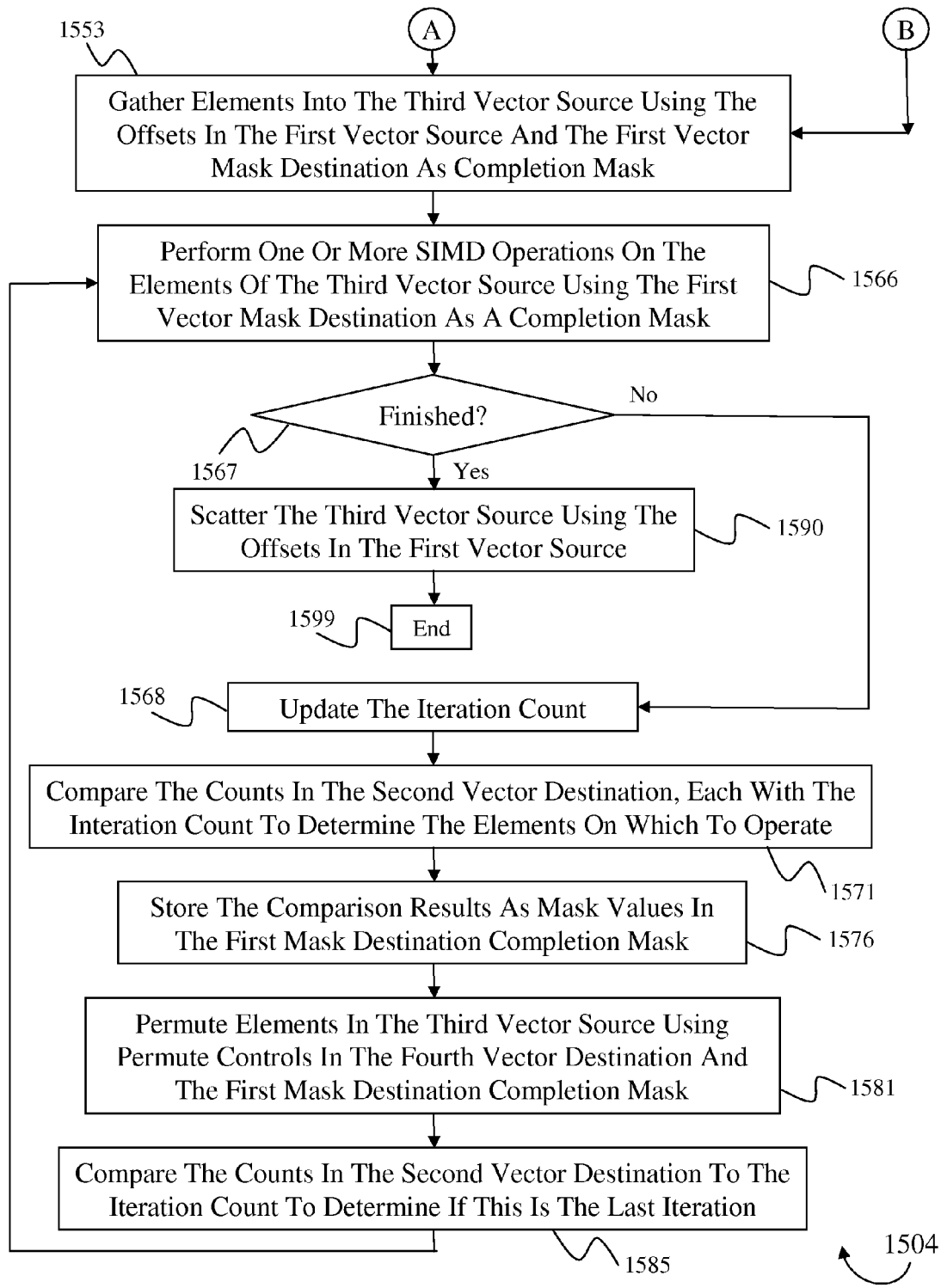

FIG. 15D illustrates a flow diagram for an alternative embodiment of a combined process 1504 to provide efficient SIMD vector address conflict resolution. In processing block 1505 an offset in each element of a first register or memory vector source is compared with an offset in every less significant element of the first vector source to determine if they hold matching offsets. In processing block 1510 mask bits are set to one according to matching offsets in less significant elements, for masks in a first vector destination corresponding to each element of the first vector source. In processing block 1515 the number of bits set to one are counted for each element of the first vector destination, and in processing block 1520 the counts are stored in a second vector destination. In processing block 1526 the counts in the second destination register are compared, each with a corresponding value in a second vector source, in order to determine the corresponding elements in a third vector source on which to perform a SIMD operation. The comparison results are stored in processing block 1531 as mask values in a first vector mask destination. In processing block 1533 a determination is made whether or not there are dependencies in the SIMD operation. If not processing may proceed directly to processing block 1553. Otherwise processing proceeds first to processing block 1535 where the number of most significant contiguous bits set to zero are counted for each element of the first vector destination. In processing block 1540 each count is stored as a value in a corresponding data field of a third vector destination. In processing block 1545 the counts of each of the data fields in the third vector destination register are subtracted from a corresponding value, one less than the number of bits used to store the elements in the first vector destination to generate a corresponding difference. In processing block 1550 each of the corresponding differences is stored as a permute control value in a corresponding data field of a fourth vector destination.

Then in processing block 1553 elements are gathered from memory or cache into the third vector source using the offsets in the first vector source and the first vector mask destination as a completion mask. In processing block 1566 one or more SIMD operations are performed on the elements of the third vector source using the first vector mask destination as a completion mask. A determination is made in processing block 1567 whether or not processing of all the data elements is finished. If so in processing block 1590 the data elements of the third vector source are scattered back to memory or cache using the offsets in the first vector source, and processing of these elements ends in processing block 1599.

Otherwise, in processing block 1568 the iteration count is updated. Then in processing block 1571 the counts in the second vector destination are compared, each with the iteration count to determine the elements on which to operate next. In processing block 1576 the comparison results are stored as mask values in the first mask destination completion mask. In processing block 1581 elements in the third vector source are permuted using permute controls in the fourth vector destination and the first mask destination completion mask. Then in processing block 1585 the counts in the second vector destination are compared to the iteration count to determine if this iteration can be identified as the last iteration. Processing then reiterates beginning in processing block 1566. Thus the combination of instructions and logic disclosed herein provide for more efficient SIMD address conflict resolution especially in certain gather-modify-scatter applications.

Figure 16:
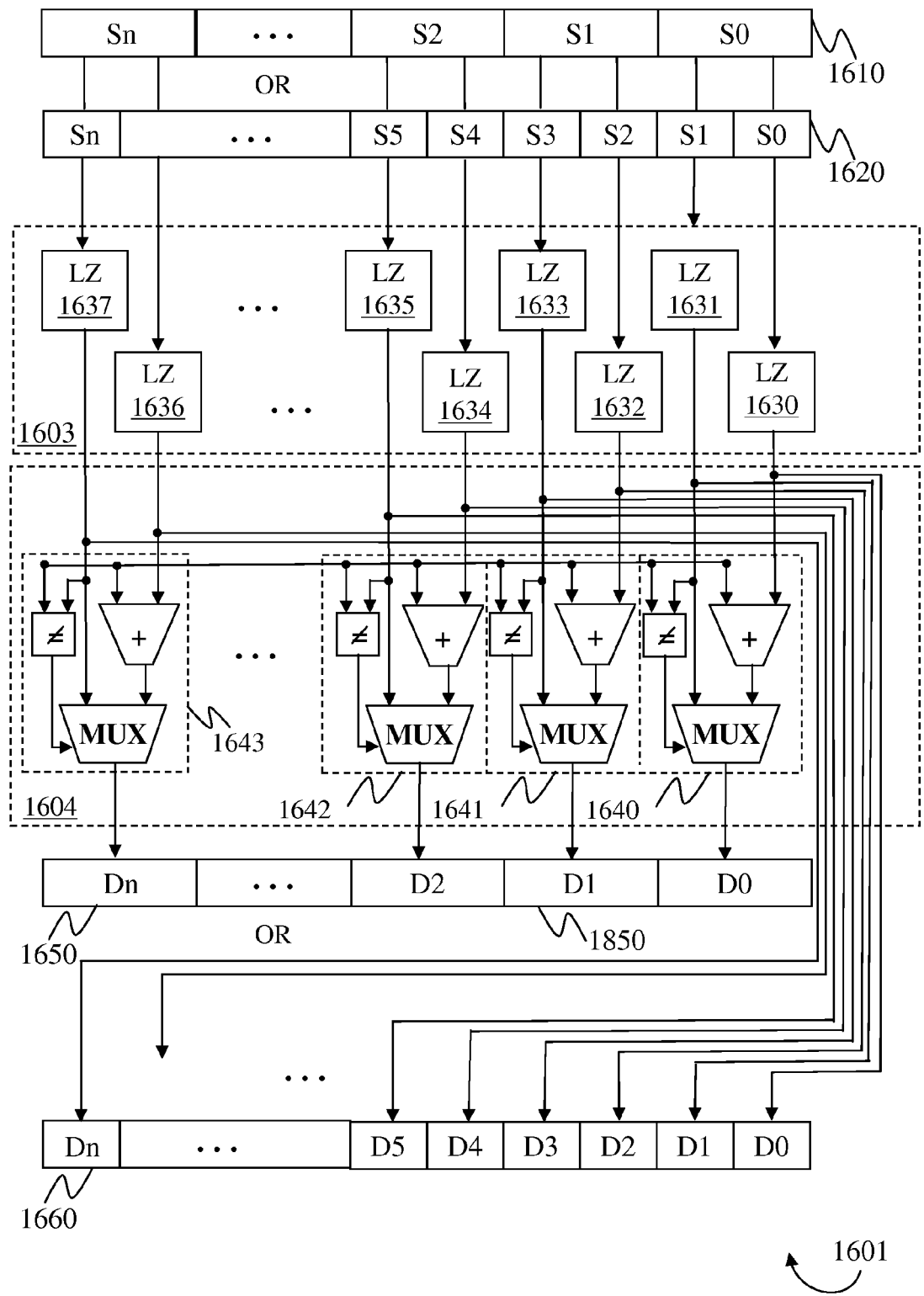
FIG. 16 illustrates an embodiment of an apparatus for executing an instruction to provide SIMD vector leading zero count functionality useful for generating permute controls for efficient vector address conflict resolution.

FIG. 16 illustrates an embodiment of an apparatus 1601 for executing an instruction to provide SIMD vector leading zero count functionality useful for generating permute controls for efficient vector address conflict resolution. Embodiments of apparatus 1601 may be part of a pipeline 400 (e.g. execution stage 416) or part of a core 490 (e.g. execution unit(s) 462) for execution of an instruction to provide SIMD vector leading zero count functionality. Embodiments of apparatus 1601 may be coupled with a decode stage (e.g. decode 406) or a decoder (e.g. decode unit 440) to decode an instruction for a SIMD vector leading zero count, which may permit efficient vector address conflict resolution. One or more execution units (e.g. execution apparatus 1601) responsive to the decoded instruction, read the plurality of bits of each of the data fields in memory vector operand or vector register 1610 or 1620, and for each data field of the memory vector operand or vector register 1610 or 1620, count the number of most significant contiguous bits set to zero, and store the count as a value in a corresponding data field of a SIMD destination register 1650 or 1660.

For example, embodiments of apparatus 1601 may be coupled with vector registers (e.g. physical register files unit(s) 458) comprising a variable plurality of n variable sized data fields to store values of a variable plurality of n variable sized data elements. Embodiments of the instruction to provide SIMD vector leading zero count functionality specify a vector leading zero count operation and a data field size for performing the SIMD leading zero count for each data field of the memory vector operand or vector register, e.g. 1610 or 1620, and storing the counts as values in corresponding data fields of the specified size in the SIMD destination register, e.g. 1650 or 1660.

For example, one embodiment of apparatus 1601 for executing an instruction to provide SIMD vector leading zero count functionality reads the plurality of bits of each of the data fields of a first size (e.g. 16-bits or 32-bits) in memory vector operand or vector register 1620, and counts the number of most significant contiguous bits set to zero in leading zero counters 1630-1637 of a leading zero count circuit 1603, then stores the counts as values in corresponding data fields of the same specified size in the SIMD destination register 1660. Another embodiment of apparatus 1601 for executing an instruction to provide a SIMD vector leading zero count reads the plurality of bits of each of the data fields of a second size (e.g. 32-bits or 64-bits) in a memory vector operand or vector register 1610, and selects the counts of the most significant contiguous bits set to zero from odd leading zero counters 1631 to 1637, or adds a value m to the counts from even leading zero counters 1630 to 1636, respectively, in selective adder circuits 1640 to 1643 of a leading zero count combination circuit 1604, then stores the combined counts as values in corresponding data fields of the specified size in the SIMD destination register 1650. It will be appreciated that alternative embodiments of apparatus 1601 for executing an instruction to provide SIMD vector leading zero counts may be capable of performing both SIMD vector leading zero counts of a first data field size and SIMD vector leading zero counts of a second data field size as shown in FIG. 16, or may be modified to perform SIMD vector leading zero counts for a variety of specified data field sizes. SIMD vector leading zero count instructions, as in the embodiments described herein, may be used with variable sized elements and conflict masks to provide SIMD permute controls, thereby permitting more efficient SIMD address conflict resolution in registers without performing dependent computations through memory. Thus the SIMD vector leading zero count instructions and logic disclosed herein provide for more efficient SIMD address conflict resolution especially in certain gather-modify-scatter applications, for example as discussed with regard to FIGS. 14A and 14D.

Figure 17:
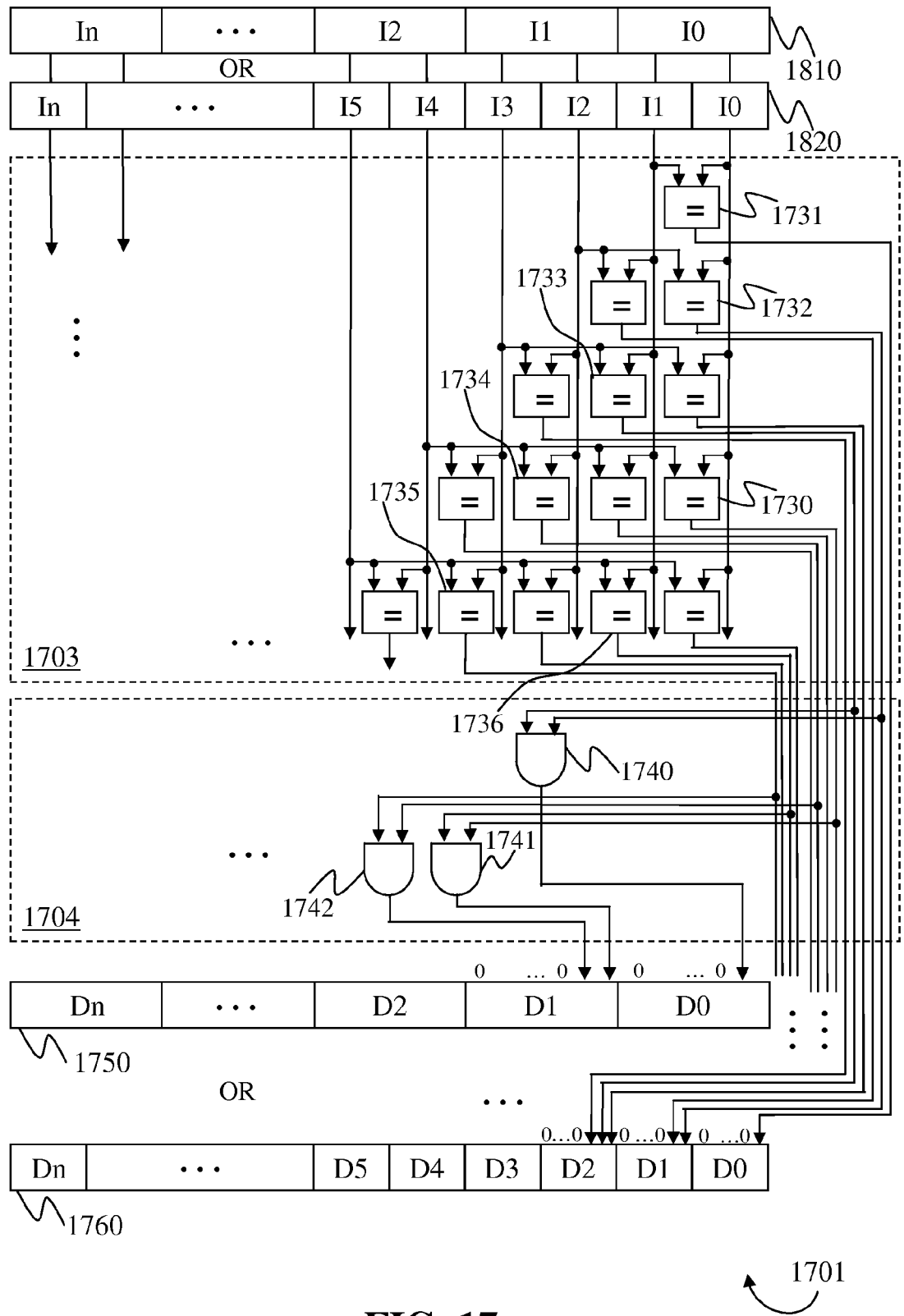
FIG. 17 illustrates an embodiment of an apparatus for executing an instruction to provide SIMD vector address conflict detection functionality for efficient vector address conflict resolution.

FIG. 17 illustrates an embodiment of an apparatus 1701 for executing an instruction to provide SIMD vector address conflict detection functionality for efficient vector address conflict resolution. Embodiments of apparatus 1701 may also be part of a pipeline 400 (e.g. execution stage 416) or part of a core 490 (e.g. execution unit(s) 462) for execution of an instruction to provide SIMD vector address conflict detection functionality. Embodiments of apparatus 1701 may be coupled with a decode stage (e.g. decode 406) or a decoder (e.g. decode unit 440) to decode an instruction for a SIMD vector address conflict detection, which may permit efficient vector address conflict resolution. One or more execution units (e.g. execution apparatus 1701) responsive to the decoded instruction, read the values of each of the data fields in memory vector operand or vector register 1710 or 1720, and for each data field of the memory vector operand or vector register 1710 or 1720, compares its corresponding offset with every less significant data field of the memory vector operand or vector register to determine if they hold matching offsets. Then for each data field in a SIMD destination register 1750 or 1760 corresponding to an offset in the memory vector operand or vector register 1710 or 1720, execution apparatus 1701 sets (e.g. to one) any mask bits corresponding to less significant data fields holding a matching, and set any other bits in the SIMD destination register 1750 or 1760 to a different value (e.g. like zero).

For example, embodiments of apparatus 1701 may be coupled with vector registers (e.g. physical register files unit(s) 458) comprising a variable plurality of n variable sized data fields to store values of a variable plurality of n variable sized data elements. Embodiments of the instruction to provide SIMD vector address conflict detection functionality specify a vector address conflict detection operation and a data field size for performing the SIMD address conflict detection for each data field of the memory vector operand or vector register, e.g. 1710 or 1720, and storing the conflict masks in corresponding data fields of the specified size in the SIMD destination register, e.g. 1750 or 1760.

For example, one embodiment of apparatus 1701 for executing an instruction to provide SIMD vector address conflict detection functionality reads the values of each of the data fields of a first size (e.g. 16-bits or 32-bits) in memory vector operand or vector register 1720, and compares its corresponding offset with the offset in every less significant data field for equality using equality comparators, e.g. equality comparators 1730-1736, of an address conflict detection circuit 1703, then stores the conflict masks in corresponding data fields of the same specified size in the SIMD destination register 1760. Another embodiment of apparatus 1701 for executing an instruction to provide a SIMD vector address conflict detection reads the values of each of the data fields of a second size (e.g. 32-bits or 64-bits) in a memory vector operand or vector register 1610, and combines (e.g. ANDs together) comparisons of corresponding adjacent data subfields, e.g. from equality comparators 1732 and 1733, 1730 and 1736, 1734 and 1735, etc., respectively, in AND logic 1740 to 1742 of a conflict combination circuit 1704, then stores the combined conflict masks in corresponding data fields of the specified size in the SIMD destination register 1750. It will be appreciated that alternative embodiments of apparatus 1701 for executing an instruction to provide SIMD vector address conflict detection may be capable of performing both SIMD vector address conflict detection of a first data field size and SIMD vector address conflict detection of a second data field size as shown in FIG. 17, or may be modified to perform SIMD vector address conflict detection for a variety of specified data field sizes. It will be appreciated that SIMD vector address conflict detection instructions, as in the embodiments described herein, may be used for variable sized elements and memory offsets to provide SIMD vector address conflict detection functionality and to generate conflict masks for efficient SIMD address conflict resolution. It will also be appreciated that SIMD vector address conflict detection instructions may be used in combination with SIMD vector leading zero count instructions, as in the embodiments described herein, to provide SIMD permute controls, for more efficient SIMD address conflict resolution especially in certain gather-modify-scatter applications, for example as discussed with regard to FIGS. 14A, 14B and 14D.

Figure 18:
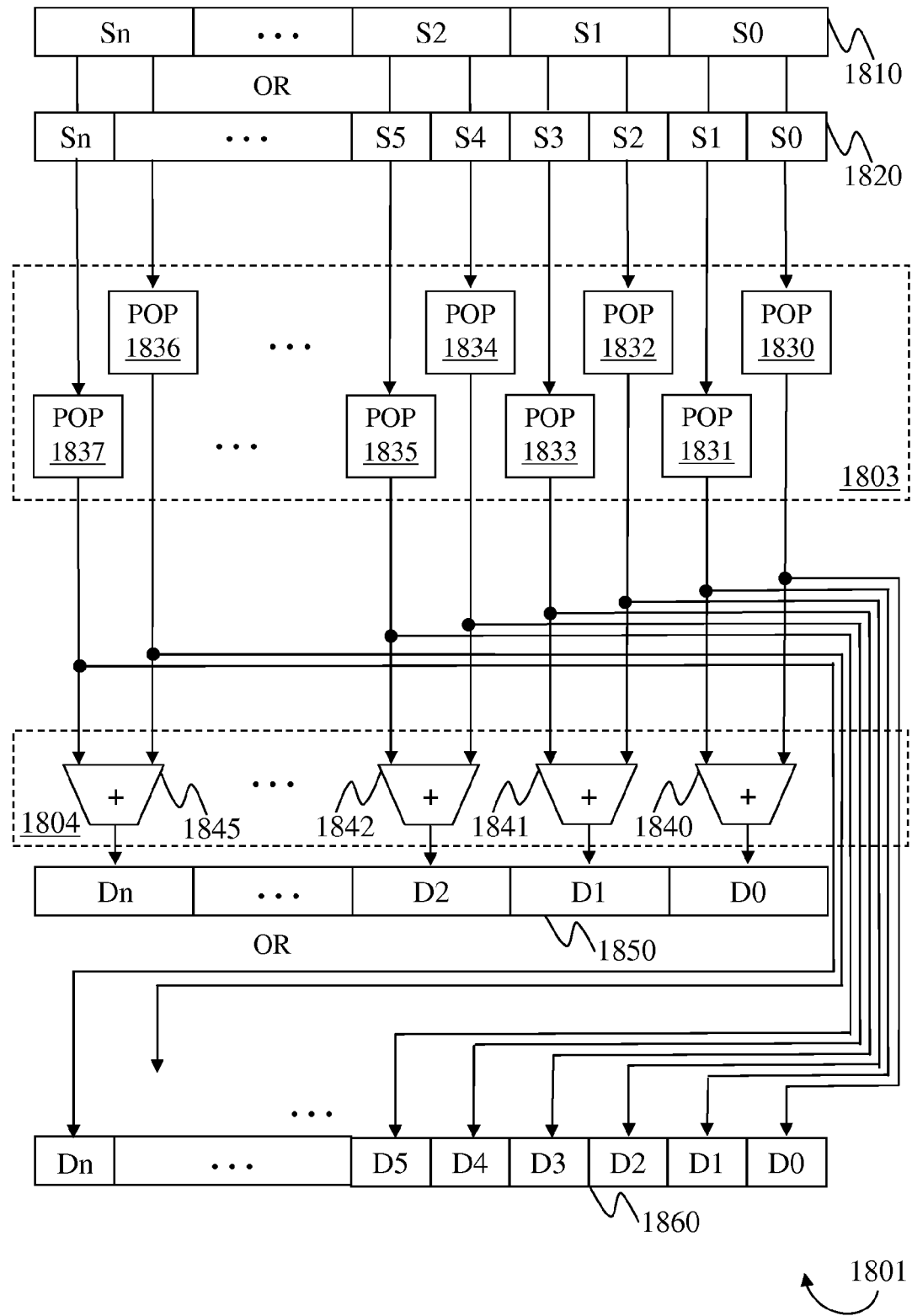
FIG. 18 illustrates an embodiment of an apparatus for executing an instruction to provide SIMD vector population count functionality for efficient vector address conflict resolution.

FIG. 18 illustrates an embodiment of an apparatus 1801 for executing an instruction to provide SIMD vector population count functionality for efficient vector address conflict resolution. Embodiments of apparatus 1801 may be part of a pipeline 400 (e.g. execution stage 416) or part of a core 490 (e.g. execution unit(s) 462) for execution of an instruction to provide SIMD population count functionality. Embodiments of apparatus 1801 may be coupled with a decode stage (e.g. decode 406) or a decoder (e.g. decode unit 440) to decode an instruction for a SIMD population count, which may permit efficient vector address conflict resolution. One or more execution units (e.g. execution apparatus 1801) responsive to the decoded instruction, read the plurality of bits of each of the data fields in memory vector operand or vector register 1810 or 1820, and for each data field of the memory vector operand or vector register 1810 or 1820, count the number of bits set to one, and store the count as a value in a corresponding data field of a SIMD destination register 1850 or 1860.

For example, embodiments of apparatus 1801 may be coupled with vector registers (e.g. physical register files unit(s) 458) comprising a variable plurality of n variable sized data fields to store values of a variable plurality of n variable sized data elements. Embodiments of the instruction to provide SIMD population count functionality specify a vector population count operation and a data field size for performing the SIMD population count for each data field of the memory vector operand or vector register, e.g. 1810 or 1820, and storing the counts as values in corresponding data fields of the specified size in the SIMD destination register, e.g. 1850 or 1860.

For example, one embodiment of apparatus 1801 for executing an instruction to provide SIMD vector population count functionality reads the plurality of bits of each of the data fields of a first size (e.g. 16-bits or 32-bits) in memory vector operand or vector register 1820, and counts the number of bits set to one in population counters 1830-1837 of a population count circuit 1803, then stores the counts as values in corresponding data fields of the same specified size in the SIMD destination register 1860. Another embodiment of apparatus 1801 for executing an instruction to provide a SIMD vector population count reads the plurality of bits of each of the data fields of a second size (e.g. 32-bits or 64-bits) in a memory vector operand or vector register 1810, and adds the counts of the bits set to one from population counters 1830-1831, to 1836-1837, respectively, in adders 1840 to 1845 of a population count combination circuit 1804, then stores the combined counts as values in corresponding data fields of the specified size in the SIMD destination register 1850. It will be appreciated that alternative embodiments of apparatus 1801 for executing an instruction to provide SIMD vector population counts may be capable of performing both SIMD vector population counts of a first data field size and SIMD vector population counts of a second data field size as shown in FIG. 18, or may be modified to perform SIMD vector population counts for a variety of specified data field sizes. SIMD vector population count instructions, as in the embodiments described herein, may be used with variable sized elements and conflict masks to efficiently compute iteration counts and to provide SIMD completion masks for iterations of a SIMD address conflict resolution. Thus the combination of instructions and logic disclosed herein provide for more efficient SIMD address conflict resolution especially in certain gather-modify-scatter applications, for example as discussed with regard to FIGS. 14A-14D.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Thus, techniques for performing one or more instructions according to at least one embodiment are disclosed. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure. In an area of technology such as this, where growth is fast and further advancements are not easily foreseen, the disclosed embodiments may be readily modifiable in arrangement and detail as facilitated by enabling technological advancements without departing from the principles of the present disclosure or the scope of the accompanying claims.

What is claimed is:

1. A processor comprising:
    a first register comprising a first plurality of data fields, wherein each of the first plurality of data fields is to store a plurality of bits;
    a first destination register comprising a second plurality of data fields corresponding to the first plurality of data fields, wherein each of the second plurality of data fields is to store a count of a number of bits set to one for a corresponding data field of the first plurality of data fields;
    a second register comprising a third plurality of data fields corresponding to the second plurality of data fields, wherein each of the third plurality of data fields is to store a copy of a specific value;
    a second destination register comprising a plurality of mask fields, a portion of the plurality of mask fields corresponding to the second plurality of data fields;
    a decode stage to decode one or more instructions;
    one or more execution units, responsive to the decoded one or more instructions, to:
        read the plurality of bits of each of the first plurality of data fields; and
        for each data field of the first plurality of data fields in the first register, count the number of bits set to one and store the count as a value in a corresponding data field of the second plurality of data fields;
        compare the value of each of the second plurality of data fields with a corresponding copy of a specific value of each of the third plurality of data fields to generate a corresponding mask value; and
        store each of the corresponding mask values in a corresponding mask field in the portion of the plurality of mask fields.

2. The processor of claim 1, wherein:
    the decode stage to decode a first instruction of the one or more instructions, the first instruction specifying a vector population count operation and a data field size and to decode a second instruction of the one or more instructions, the second instruction specifying a vector comparison operation; and
    the one or more execution units comprise:
        a first execution unit, responsive to the decoded first instruction, to:
            read the plurality of bits of each of the first plurality of data fields; and
            for each data field of the first plurality of data fields, count the number of bits set to one and store the count as the value in the corresponding data field of the second plurality of data fields; and
        a second execution unit, responsive to the decoded second instruction, to:
            compare the value of each of the second plurality of data fields with the corresponding value of each of the third plurality of data fields to generate the corresponding mask value; and
            store each of the corresponding mask values in the corresponding mask field in the portion of the plurality of mask fields.

3. The processor of claim 2, wherein the specific value is a value of an iteration count.

4. The processor of claim 3, wherein the vector comparison operation is a vector equality comparison operation.

5. The processor of claim 2, wherein the specific value is a value of an iteration threshold count.

6. The processor of claim 5, wherein the vector comparison operation is a vector greater-than comparison operation.

7. The processor of claim 2, wherein the first instruction is a vector population count instruction used at least in part, to generate a set of iteration counts in the first destination register and a completion mask in the second destination register.

8. A method comprising:
    storing in each of a first plurality of n data fields of a first vector register, a plurality of bits, wherein n is a whole number greater than one;
    executing, in a processor, one or more instructions;
    for each data field of the first plurality of n data fields, counting a number of bits set to one and storing the count as a value in a corresponding data field of a second plurality of data fields in a first vector destination register;
    storing in each of a third plurality of n data fields of a second vector register, a copy of a specific value;
    comparing the value of each of the second plurality of data fields with a corresponding copy of a specific value of each of the third plurality of n data fields to generate a corresponding mask value; and
    storing the corresponding mask values in a corresponding mask field of a plurality of n mask fields in a portion of a mask destination register.

9. The method of claim 8, wherein the executing the one or more instructions comprises:
    executing, in the processor, a first single-instruction multiple-data (SIMD) instruction for a vector population count operation and a second SIMD instruction for a vector comparison operation.

10. The method of claim 9, wherein the specific value is a value of an iteration count.

11. The method of claim 10, wherein the second SIMD instruction for the vector comparison operation is a SIMD instruction for a vector equality comparison operation.

12. The method of claim 10, wherein the second SIMD instruction for the vector comparison operation is a SIMD instruction for a vector greater-than comparison operation.

13. The method of claim 9, wherein the specific value is a value of an iteration threshold count.

14. The method of claim 9, wherein the first SIMD instruction for the vector population count operation is used at least in part, to generate a set of iteration counts in the first vector destination register, and a completion mask in the mask destination register.

15. A non-transitory machine-readable storage medium storing one or more executable instructions that, when executed by a processor, cause the processor to:
    count a number of bits set to one for each data field of a first plurality of data fields each storing a plurality of bits in a first register,
    store each count as a value in a corresponding data field of a second plurality of data fields in a first destination register,
    compare the value of each of the second plurality of data fields in the first destination register with a corresponding copy of a specific value of each of a third plurality of data fields in a second register, each of the third plurality of data fields in the second register storing a copy of a specific value, in order to generate a corresponding mask value, wherein the specific value is a value of an iteration threshold count, and store each of the corresponding mask values in a corresponding mask field of a mask destination register.

16. The non-transitory machine-readable medium of claim 15, wherein a first instruction of the one or more executable instructions is a single-instruction multiple-data (SIMD) vector population count instruction used at least in part, to generate a set of iteration counts in the first destination register, and a completion mask in the mask destination register.

17. The non-transitory machine-readable medium of claim 15, wherein a second instruction of the one or more executable instructions is a SIMD vector equality comparison operation.

18. The non-transitory machine-readable medium of claim 15, wherein a second instruction of the one or more executable instructions is a SIMD vector greater-than comparison operation.

19. The non-transitory machine-readable medium of claim 15, wherein the plurality of bits is equal to 32 bits.

20. The non-transitory machine-readable medium of claim 15, wherein the plurality of bits is equal to 64 bits.

21. A processing system comprising:
a memory; and
a plurality of processors, wherein at least one of the plurality of processors comprises:
   a first register comprising a first plurality of data fields, wherein each of the first plurality of data fields in the first register is to store a plurality of bits;
   a first destination register comprising a second plurality of data fields corresponding to the first plurality of data fields, wherein each of the second plurality of data fields is to store a count of a number of bits set to one for a corresponding data field of the first plurality of data fields;
   a second register comprising a third plurality of data fields corresponding to the second plurality of data fields, wherein each of the third plurality of data fields is to store a copy of a specific value;
   a second destination register comprising a plurality of mask fields, a portion of the plurality of mask fields corresponding to the second plurality of data fields;
   a decode stage to decode one or more instructions;
   one or more execution unit, responsive to the decoded one or more instructions, to:
      read the plurality of bits of each of the first plurality of data fields;
      for each data field of the first plurality of data fields, count the number of bits set to one, and store the count as a value in a corresponding data field of the second plurality of data fields;
      compare the value of each of the second plurality of data fields with a corresponding copy of a specific value of each of the third plurality of data fields to generate a corresponding mask value, and
      store each of the corresponding mask values in a corresponding mask field in the portion of the plurality of mask fields.

22. The processing system of claim 21, wherein:
the decode stage to decode a first instruction of the one or more instructions, the first instruction specifying a vector population count operation and a data field size and to decode a second instruction of the one or more instructions, the second instruction specifying a vector comparison operation; and
the one or more execution units comprise:
   a first execution unit, responsive to the decoded first instruction, to:
      read the plurality of bits of each of the first plurality of data fields; and
      for each data field of the first plurality of data fields, count the number of bits set to one and store the count as the value in the corresponding data field of the second plurality of data fields; and
   a second execution unit, responsive to the decoded second instruction, to:
      compare the value of each of the second plurality of data fields with the corresponding value of each of the third plurality of data fields to generate a corresponding mask value, and
      store each of the corresponding mask values in the corresponding mask field in the portion of the plurality of mask fields.

23. The processing system of claim 22, wherein the specific value is a value of an iteration count.

24. The processing system of claim 23, wherein the vector comparison operation is a vector equality comparison operation.

25. The processing system of claim 23, wherein the vector comparison operation is a vector greater-than comparison operation.

26. The processing system of claim 22, wherein the specific value is a value of an iteration threshold count.

27. The processing system of claim 26, wherein the vector comparison operation is a vector greater-than comparison operation.

28. The processing system of claim 23, wherein the plurality of bits is equal to 32 bits.

29. The processing system of claim 23, wherein the plurality of bits is equal to 64 bits.

30. The processor of claim 2, wherein the second execution unit and the first execution unit are the same execution unit.

31. The processing system of claim 22, wherein the second execution unit and the first execution unit are the same execution unit.

* * * * *